(12) United States Patent
Snaith et al.

(10) Patent No.: US 11,799,039 B2
(45) Date of Patent: Oct. 24, 2023

(54) PHOTOVOLTAIC DEVICE COMPRISING A METAL HALIDE PEROVSKITE AND A PASSIVATING AGENT

(71) Applicant: OXFORD UNIVERSITY INNOVATION LIMITED, Botley (GB)

(72) Inventors: Henry J. Snaith, Oxford (GB); Antonio Abate, Oxford (GB); Nakita K. Noel, Oxford (GB)

(73) Assignee: OXFORD UNIVERSITY INNOVATION LIMITED, Botley (GB)

(*) Notice: Subject to any disclaimer, the term of this patent is extended or adjusted under 35 U.S.C. 154(b) by 74 days.

(21) Appl. No.: 17/080,530

(22) Filed: Oct. 26, 2020

(65) Prior Publication Data
US 2021/0057591 A1 Feb. 25, 2021

Related U.S. Application Data

(60) Continuation of application No. 16/990,682, filed on Aug. 11, 2020, which is a division of application No. (Continued)

(30) Foreign Application Priority Data

Dec. 17, 2013 (GB) .................................. 1322310
Aug. 5, 2014 (GB) .................................. 1413855

(51) Int. Cl.
*H01L 31/0216* (2014.01)
*H10K 30/88* (2023.01)
(Continued)

(52) U.S. Cl.
CPC ...... *H01L 31/02167* (2013.01); *H01L 31/032* (2013.01); *H01L 31/077* (2013.01);
(Continued)

(58) Field of Classification Search
CPC ............ H01L 31/02167; H01L 31/032; H01L 31/077; H10K 30/88; H10K 85/00
See application file for complete search history.

(56) References Cited

U.S. PATENT DOCUMENTS 5,871,579 A  2/1999  Liang
7,491,642 B2  2/2009  Lewis
(Continued)

FOREIGN PATENT DOCUMENTS

CN  103346018 A  10/2013
CN  103390503 A  11/2013
(Continued)

OTHER PUBLICATIONS

Planells et al., "Utilization of a heterosupramolecular self-assembled trisporphyrin complex in dye-sensitised solar cells", Energy Environ. Sci., 2011, 4, 528-534. (Year: 2011).*
(Continued)

*Primary Examiner* — Tae-Sik Kang
(74) *Attorney, Agent, or Firm* — QUARLES & BRADY LLP

(57) ABSTRACT

The present invention relates to devices comprising metal halide perovskites and organic passivating agents. In particular, the invention relates to photovoltaic and optoelectronic devices comprising passivated metal halide perovskites. The device according to the invention comprises: (a) a metal halide perovskite; and (b) a passivating agent which is an organic compound; wherein molecules of the passivating agent are chemically bonded to anions or cations in the metal halide perovskite. The invention also provides a process for producing a photovoltaic device, which photovoltaic device comprises: (a) a metal halide perovskite; and (b) a passivating agent which is an organic compound; wherein molecules of the passivating agent are chemically bonded to anions or cations in the metal halide perovskite,
(Continued)

wherein the process comprises treating a metal halide perovskite with a passivating agent, which passivating agent is an organic compound and is suitable for chemically bonding to anions or cations in the metal halide perovskite.

28 Claims, 21 Drawing Sheets

Related U.S. Application Data

15/104,103, filed as application No. PCT/GB2014/053735 on Dec. 17, 2014, now Pat. No. 10,777,693.

(51) Int. Cl.

| | | |
|---|---|---|
| H10K 85/00 | (2023.01) | |
| H01L 31/032 | (2006.01) | |
| H01L 31/077 | (2012.01) | |
| H01L 31/18 | (2006.01) | |
| H10K 30/10 | (2023.01) | |
| H10K 30/15 | (2023.01) | |
| H10K 102/10 | (2023.01) | |

(52) U.S. Cl.
CPC ......... *H01L 31/1868* (2013.01); *H10K 30/88* (2023.02); *H10K 85/00* (2023.02); *H10K 30/10* (2023.02); *H10K 30/151* (2023.02); *H10K 2102/102* (2023.02); *Y02E 10/549* (2013.01); *Y02P 70/50* (2015.11)

(56) References Cited

U.S. PATENT DOCUMENTS

| | | | |
|---|---|---|---|
| 2002/0139975 A1 | 10/2002 | Lewis et al. | |
| 2004/0211458 A1* | 10/2004 | Gui | H01G 9/2031 136/255 |
| 2011/0240106 A1 | 10/2011 | Tang | |
| 2014/0209173 A1 | 7/2014 | Momose | |
| 2014/0332078 A1* | 11/2014 | Guo | H10K 30/20 438/94 |

FOREIGN PATENT DOCUMENTS

| | | |
|---|---|---|
| EP | 1873814 A2 | 1/2008 |
| EP | 2333859 B1 | 6/2011 |
| EP | 2355199 A1 | 8/2011 |
| JP | 2008227330 A | 9/2008 |
| WO | 2013171517 A1 | 11/2013 |
| WO | 2013171518 A1 | 11/2013 |
| WO | 2013171520 A1 | 11/2013 |
| WO | 2014045021 A1 | 3/2014 |

OTHER PUBLICATIONS

Andrew Kopecky, "N3-type ruthenium rigid rod dyes and N3-type ruthenium bifunctional dyes for studying solar cell properties", Theses, ETD doctoral, May 2013, URL: https://rucore.libraries.rutgers.edu/rutgers-lib/40414/PDF/1/play/ (Year: 2013).*
Zhang et al., "Enhancement of Perovskite-Based Solar Cells Employing Core-Shell Metal Nanoparticles", Nano Lett. 2013, 13, 4505-4510. (Year: 2013).*
Wang, et al., Large Fill-Factor Bilayer Iodine Perovskite Solar Cells Fabricated by a Low-Temperature Solution-Process, Energy & Environmental Science, 2014, 7:2359-2365.
Xu, J., et al. "Perovskite-fullerene hybrid materials suppress hysteresis in planar diodes." Nature communications 6.1 (2015): 1-8.
Yin, et al., Unusual Defect Physics in CH3NH3PbI3 Perovskite Solar Cell Absorber, Applied Physics Letters, 2014, 104:063903-1 thru 063903-4.
Zhang, et al., Communication: Competition Between n n Interaction and Halogen Bond in Solution: A Combined 13C NMR and Density Functional Theory Study, The Journal of Chemical Physics, 2012, 136:141101-1 thru 141101-4.
Zhang, et al., Enhancement of Perovskite-Based Solar Cells Employing Core-Shell Metal Nanoparticles; Nano Lett. 2013, 4505-4510, 2013 (Year: 2013).
Japan Patent Office, Written Opposition Against Patent JP 6772308 B, Jun. 18, 2021, 49 pages [No English Language Translation Available At This Time].
Sato et al., Fabrication of Organic-Inorganic Nano-Hybrid Materials Containing Oligothiophene Derivatives, Polymer Preprints, Japan, 2010, 59(2):3909.
Era et al., Organic-Inorganic Heterostructure Electroluminescent Device Using a Layered Perovskite Semiconductor (C6H5C2H4NH3)2PbI4, Applied Physics Letters, 1994, 65(6):676-678.
European Patent Office, Communication, Application No. 19219035.3, dated Aug. 17, 2022, 6 pages.
Japan Patent Office, Written Opposition for Patent 6734412. Mailed on Feb. 5, 2021. With translation. 48 pages.
Wu, K-L, et al. "High efficiency and robust performance of organo lead perovskite solar cells with large grain absorbers prepared in ambient air conditions." Chemistry Letters 44.3 (2015): 321-323.
Kagaku daijiten, p. 2018. First edition, first printing, issued on Oct. 20, 1989. With translation. 4 pages.
Iwanami Rikagaku jiten, p. 347. Fifth edition, first printing, issued on Feb. 20, 1998. With translation. 4 pages.
Kojien, p. 2115 .Third edition, first printing, issued on Dec. 6, 1983. With translation. 4 pages.
Abate, et al., Halide Anions Driven Self-Assembly of Haloperfluoroaenes: Formation of One-Dimensional Non-Covalent Copolymers, Journal of Fluorine Chemistry, 2009, 130:1171-1177.
Abate, et al., Protic Ionic Liquids as p-Dopant for Organic Hole Transporting Materials and Their Application in High Efficiency Hybrid Solar Cells, Journal of the American Chemical Society, 2013, 135(36):13538-13548.
Abate, et al., Supramolecular Halogen Bond Passivation of Organic-Inorganic Halide Perovskite Solar Cells, Nano Letters, 2014, 14:3247-3254.
Aberle, Surface Passivation of Crystalline Silicon Solar Cells: A Review, Progress in Photovoltaics: Research and Applications, 2000, 8:473-487.
Ball, et al., Low-Temperature Processed Meso-Superstructured to Thin-Film Perovskite Solar Cells, Energy and Environmental Science, 2013, 6:1739-1743.
Barnes, et al., Interpretation of Optoelectronic Transient and Charge Extraction Measurements in Dye-Sensitized Solar Cells, Advanced Materials, 2013, 25:1881-1922.
Bi, et al., Using a Two-Step Deposition Technique to Prepare Perovskite (CH3NH3PbI3) for Thin Film Solar Cells based on ZrO2 and TiO Mesostructures, RSC Advances, 2013, 3:18762-18766.
Budarin, et al., NMR and IR Study of Fluorobenzene and Hexafluorobenzene Adsorbed on Alumina, Langmuir, 2007, 23:5412-5418.
Cabanillas-Gonzalez, et al., Pump-Probe Spectroscopy in Organic Semiconductors: Monitoring Fundamental Processes of Relevance in Optoelectronics, Advanced Materials, 2011, 23:5468-5485.
Canesi, et al., The Effect of Selective Interactions at the Interface of Polymer-Oxide Hybrid Solar Cells, Energy & Environmental Science, 2011, 5:9068-9076.
Chang, et al., Panchromatic Photon-Harvesting by Hole-Conducting Materials in Inorganic-Organic Heterojunction Sensitized-Solar Cell through the Formation of Nanostructured Electron Channels, Nano Letters, 2012, 12:1863-1867.
D'Innocenzo, et al., Excitons Versus Free Charges in Organo-Lead Tri-Halide Perovskites, Nature Communications, 2014, 5:3586, 6 pp.
De Wolf, et al., Organometallic Halide Perovskites: Sharp Optical Adsorption Edge and Its Relation to Photovoltaic Performance, Journal of Physical Chemistry Letters, 2014, 5:1035-1039.

(56) References Cited

OTHER PUBLICATIONS

Deschler, et al., High Photoluminescence Efficiency and Optically Pumped Lasing in Solution-Processed Mixed Halide Perovskite Semiconductors, Journal of Physical Chemistry Letters, 2014, 5:1421-1426.

Docampo, et al., Efficient Organometal Trihalide Perovskite Planar-Heterojunction Solar Cells on Flexible Polymer Substrates, Nature Communications, 2013, 4:2761, 6 pp.

Dualeh, et al., Impedance Spectroscopic Analysis of Lead Iodide Perovskite-Sensitized Solid-State Solar Cells, ACS Nano, 2014, 8(1):362-373.

Eperon, et al., Formamidinium Lead Trihalide: A Broadly Tunable Perovskite for Efficient Planar Heterojunction Solar Cells, Energy & Environmental Science, 2014, 7:982-988.

Eperon, et al., Morphological Control for High Performance, Solution Processed Planar Heterojunction Perovskite Solar Cells, Advanced Functional Materials, 2014, 24:151-157.

Huber, et al., On the Directionality of Halogen Bonding, Phys. Chem. Chem. Phys., 2013, 15:10350-10357.

Im, et al., 6.5% Efficient Perovskite Quantum-Dot-Sensitized Solar Cell, Nanoscale, 2011, 3:4088-4093.

Ip, et al., Hybrid Passivated Colloidal Quantum Dot Solids, Nature Nanotechnology, 2012, 7:577-582.

Itzhaik, et al., Sb2S3-Sensitized Nanoporous TiO2 Solar Cells, The Journal of Physical Chemistry C, 2009, 113:4254-4256.

Japan Patent Office, Notice of Reasons for Rejection for application 2019-009000, dated Jan. 21, 2020, with translation.

Jeng, et al., CH3NH3PbI3 Perovskite/Fullerene Planar-Heterojunction Hybrid Solar Cells, Advanced Materials, 2013, 25:3727-3732.

Khalkar, et al., Effect of Growth Parameters and Annealing Atmosphere on the Properties of Cu2ZnSnS4 Thin Films Deposited by Cosputtering, International Journal of Photoenergy, 2013, vol. 2013, Article ID 690165, 7 pp.

Kim, et al. Lead Iodide Perovskite Sensitized All-Solid-State Submicron Thin Film Mesoscopic Solar Cell with Efficiency Exceeding 9%, Scientific Reports, 2012, 2:591, 7 pp.

Kim, et al., Mechanism of Carrier Accumulation in Perovskite Thin-Absorber Solar Cells, Nature Communications, 2013, 4:2242, 7 pp.

Kojima, et al., Organometal Halide Perovskites as Visible-Light Sensitizers for Photovoltaic Cells, Journal of the American Chemical Society, 2009, 131:6050-6051.

Kramer, et al., The Architecture of Colloidal Quantum Dot Solar Cells: Materials to Devices, Chemical Reviews, 2014, 114(1):863-882.

Kumar, et al., Dipole Induced Anomalous S-shape I-V Curves in Polymer Solar Cells, Journal of Applied Physics, 2009, 105:094512-1 thru 094512-6.

Lee, et al., Efficient Hybrid Solar Cells Based on Meso-Superstructured Organometal Halide Perovskites, Science, 2012, 338(6107):643-647.

Liu, D., et al., Perovskite Solar Cells With a Planar Heterojunction Structure Prepared Using Room-Temperature Solution Processing Techniques, Nature Photonics, 2014, 8:133-138.

Liu, M., et al., Efficient Planar Heterojunction Perovskite Solar Cells by Vapour Deposition, Nature, 2013, 501:395-398.

Liu, Z., et al., Enhancing the Performance of Quantum Dots Sensitized Solar Cell by SiO 2 Surface Coating, Applied Physics Letters, 2010, 96:233107-1 thru 233107-3.

Meazza, et. al., Halogen-Bonding-Triggered Supramolecular Gel Formation, Nature Chemistry, 2013, 5:42-47.

Mitzi, et al., The Path Towards a High-Performance Solution-Processed Kesterite Solar Cell, Solar Energy Materials & Solar Cells, 2011, 95:1421-1436.

Oo, et al., Grain Size and Texture of CU2ZnSnS4 Thin Films Synthesized by Cosputtering Binary Sulfides and Annealing: Effects of Processing Conditions and Sodium, Journal of Electronic Materials, 2011, 40(11):2214-2221.

PCT International Search Report and Written Opinion, PCT/GB2014/053735, dated May 4, 2015.

Roe, et al., In Situ X-ray Absorption Study of Lead Ion Surface Complexes at the Goethite-Water Interface, Langmuir, 1991, 7:367-373.

Rouquerol, et al., Recommendations for the Characterization of Porous Solids, Pure & Appl. Chem., 1994, 66(8):1739-1758.

Shi, et al. Advancements in all-solid-state hybrid solar cells based on organometal halide perovskites. Royal Society of Chemistry, 2012. (Year: 2012).

Shkrob, et al., Charge Trapping in Photovoltaically Active Perovskites and Related Halogenoplumbate Compounds, Journal of Physical Chemistry Letters, 2014, 5:1066-1071.

Skromme, et al., Effects of Passivating Ionic Films on the Photoluminescence Properties of GaAs, Applied Physics Letters, 1987, 51:2022-2024.

Slough, Charge-Transfer Bonding in Molecules Combined in Polymeric Structures. Part 1.—Spectroscopic Investigation of Halogen and Halide Ion Interactions, Transactions of the Faraday Society, 1959, 55:1030-1035.

Snaith, et al., Anomalous Hysteresis in Perovskite Solar Cells, Journal of Physical Chemistry Letters, 2014, 5:1511-1515.

Snaith, How Should You Measure Your Excitonic Solar Cells?, Energy & Environmental Science, 2012, 5:6513-6520.

Stranks, S. D., et al. "Electron-hole diffusion lengths exceeding 1 micrometer in an organometal trihalide perovskite absorber." Science 342.6156 (2013): 341-344.

Tasker, The Stability of Ionic Crystal Surfaces, Journal of Physics C: Solid State Physics, 1979, 12:4977-4984.

Viger-Gravel, et al., Correlation Between 13C Chemical Shifts and the Halogen Bonding Environment in a Series of Solid Para-diiodotetrafluorobenzene Complexes, CrystEngComm, 2013, 15:3168-3177.

Wagenpfahl, et al., S-shaped Current-Voltage Characteristics of Organic Solar Devices, Physical Review B, 2010, 82:115306-1 thru 115306-8.

De Mierry, P., et al. "Yellow Luminescence and Hydrocarbon Contamination in MOVPE-Grown GaN." physica status solidi (a) 158.2 (1996): 587-597.

Chen, Zhongfang, et al. "Is C 60 buckminsterfullerene aromatic?." Physical Chemistry Chemical Physics 14.43 (2012): 14886-14891. (Abstract only) 1 page.

Sander, Lane C., and Stephen A. Wise. "Polycyclic aromatic hydrocarbon structure index." Gaithersburg, MD: US Department of Commerce, Technology Administration, National Institute of Standards and Technology, 1997. 10 pages.

Stangl, Marcel, et al. "Segregation of organic impurities in thin electroplated Cu metallizations." Microchimica Acta 156 (2006): 159-162.

* cited by examiner

PHOTOVOLTAIC DEVICE COMPRISING A METAL HALIDE PEROVSKITE AND A PASSIVATING AGENT

CROSS REFERENCE TO RELATED APPLICATIONS

This application is a continuation application of U.S. patent application Ser. No. 16/990,682 filed Aug. 11, 2020, which is a divisional application of U.S. patent application Ser. No. 15/104,103 filed Jun. 13, 2016, now U.S. Pat. No. 10,777,693 issued Sep. 15, 2020, which is a 371 Application of PCT International Application No. PCT/GB2014/053735 filed Dec. 17, 2014, which claims priority to Great Britain Patent Application No. 1322310.2 filed Dec. 17, 2013 and Great Britain Patent Application No. 1413855.6 filed Aug. 5, 2014. The contents of these applications are hereby incorporated by reference as if set forth in their entirety herein.

FIELD OF THE INVENTION

The present invention relates to devices comprising metal halide perovskites and organic passivating agents. In particular, the invention relates to photovoltaic and optoelectronic devices comprising passivated metal halide perovskites.

BACKGROUND OF THE INVENTION

Photovoltaic (PV) cells, capable of converting sunlight directly into electricity, could ultimately be the solution to global energy demand. When the first crystalline silicon (c-Si) PV device was demonstrated in 1954, the envisaged manufacturing costs made this technology impractical for large scale power generation. Thereafter, exploiting new materials and fabrication procedures has attracted a growing effort to realize lower-cost photovoltaic technologies. In particular, the recent emergence of organometal-halide perovskite based solar cells promises to deliver one of the lowest cost technologies that is capable of converting sun light to electricity at the highest efficiencies.

In perovskites, as well as for most ionic crystals, the coordination number for ions at the crystal surfaces is always lower than in the bulk material. The consequent non-stoichiometric material comprises a local excess of positive or negative ions, depending on the Miller index of the exposed surface. Such polar surfaces are known to be unstable, and their apparent natural occurrence has been associated with adsorption of foreign atoms, including oxygen and hydrogen from the moisture in air, which can passivate the crystal surface by balancing the local excess charge. For the particular case of a crystal of a perovskite such as $CH_3NH_3PbX_3$ (where X is one or more halide anions), under-coordinated metal cations at the crystal surface would be unstable in air and can form lead oxide and hydroxide species when exposed to oxygen and water from the air. Similarly, under-coordinated organic cations at the crystal surface may bind with water molecules via hydrogen bridges, which causes hydration of the crystal surface. Conversely, halide anions in crystalline materials have been reported to be relatively stable to air exposure (Abate, A. et al., Journal of Fluorine Chemistry 130, 1171-1177 (2009)). Therefore, while it would be expected to find fewer "free" metal cations and organic cations when the devices are processed in air, it is likely that an excess of under-coordinated halide anions would be present at the crystal surface.

In U.S. Pat. No. 7,491,642 organic passivating layers have been investigated for silicon. The process described therein comprises carrying out chemical reactions of the silicon surface with organic passivating agents to produce passivating groups that are directly bonded to the surface by covalent (for instance Si—C) bonds.

As another example, as a means to control the growth of metal chalcogenide nanoparticles and ensure that they are well dispersed in a solvent of choice, coordinating ligands are employed (Ip A. et al., Hybrid passivated colloidal quantum dot solids, Nature Nanotechnology, 577, 7, (2012)). During the synthesis these ligands will typically be long alkane chain acid terminated molecules. These ligands make the nanocrystals highly soluble, advantageous for solution processing. However, since the ligands contain long insulating chains, they tend to prevent direct contact between the nanocrystals when processed into a thin film. This is overcome by performing a ligand exchange, whereby a solid as deposited nanocrystal film is rinsed in a solution of a different double ended short-chain ligand. Through mass-action, predominant ligand exchange occurs with the long chain ligands being replaced by the smaller double ended ligands. The short-chain double ended ligands enable closer proximity between the nanocrystals and can also bind to two different nanocrystals at the same time, "crosslinking" the nanocrystals, making the film insoluble. In contrast to metal chalcogenide nanocrystals, the metal halide perovskites described herein are typically fabricated directly as continuous layers rather than collections of nanoparticles, and often comprise large crystalline domains with domain sizes typically on the order of hundreds of nanometres to micrometers, much larger than the film thickness. Hence, there is no requirement to employ ligands in order to improve the interconnection between perovskite crystals, as is required for metal chalcogenide nanocrystals.

In comparison to c-Si and other thin-film semiconductors, defect sites and under-coordinated cations and anions in metal halide perovskite materials have not thus far been considered deleterious to device performance. However, the inventors have unexpectedly found that elimination or passivation of defect sites and surface states in the perovskite material allows improved device efficiencies. It is thus an object of the present invention to provide devices comprising passivated metal halide perovskites.

SUMMARY OF THE INVENTION

The inventors have found that significant recombination losses occur under working conditions in perovskite devices due to charge trapping at the perovskite/hole-transporter heterojunction. It has been identified that under-coordinated cations and anions in the perovskite are at least partially responsible. In view of this, the inventors have established a supramolecular strategy for passivating the perovskite, including passivation of the perovskite surface. A range of passivating agents have been investigated. The passivating agents are organic compounds which may (supramolecularly) chemically bond with anions or cations in, and/or at the surface of, the perovskite. By employing organic passivating agents which chemically bond to anions or cations in the perovskite to produce passivated perovskite films, power conversion efficiencies (PCEs) of over 16% have been achieved for perovskite photovoltaic devices, representing a step improvement for the technology. Organic passivating agents, for instance halogen bond donor compounds and organic compounds comprising at least one thiol or sulfide group, have been shown to be particularly effective passivating agents for metal halide perovskites. Organic passivating agents comprising at least one N atom have also been found to be effective passivating agents for metal halide perovskites.

In particular, the inventors have recognised that by using a passivating agent which is an organic compound comprising cations that are larger than the A cation in the $ABX_3$ perovskite crystal, and that are also too large to fit within the 3D perovskite structure, these cations will effectively behave as impurities and may be expelled to the surfaces and grain boundaries of the perovskite. Consequently, it has been found that by employing impurity doping with a small concentration of large cations, it is possible to passivate both grain boundary defects and surface defects. The organic passivating agent the effectively replaces the A cation and interacts with the other ions in the perovskite though a coulomb interaction. For example, when the metal halide perovskite comprises a methyl ammonium (MA) cation, this could be achieved using a passivating agent which is an organic compound comprising any of butyl, pentyl, hexyl, phenyl-ethyl amines or phosphines.

In addition, the inventors have recognised that by using a passivating agent which is an organic compound comprising cations with hydrophobic moieties, these passivating agents may also act to "encapsulate" the perovskite crystals and inhibit moisture ingress. This can achieved introducing the encapsulating passivating agent within the precursor solution. By way of example, this could be achieved using a passivating agent which is an organic compound such as an alkyl ammonium iodide, a fluoroalky ammonium iodide etc. Alternatively, the perovskite can be treated with a passivating agent that enhances the moisture stability after full crystallization. By way of example, this post treatment of the perovskite film could be implemented by immersion in a solution of a passivating agent which is an organic compound such as octyl ammonium, or octylammonium iodide.

Furthermore, the inventors have recognised that whilst some of the defects will be present at the surfaces of the perovskite, there will also be defect sites in bulk of the crystal structure of the perovskite. These defect sites in bulk of the crystal structure of the perovskite can also be passivated using a passivating agent which is an organic compound that chemically bonds with anions or cations at the defect sites. However, the inventors have also recognised that, at the planar defects formed by the grain boundaries within the perovskite, there will be a strong coulomb interaction between the ions in the adjacent grains, which could induce further defect sites within the perovskite material. The inventors have therefore established a further strategy for passivating grain boundary defect sites in bulk of the crystal structure of the pervoskite.

In this further strategy, the passivating agents are organic compounds which are disposed at grain boundaries within the metal halide perovskite and that do not chemically bond to anions or cations in the metal halide perovskite. Preferably, such organic passivating agents comprise non-polar organic molecules, such as polycyclic aromatic hydrocarbons. In particular, the inventors have found that by adding non-polar organic molecules to a solution of the metal halide perovskite before formation of the metal halide perovskite solid, where the organic molecules do not specifically chemically bond to the perovskite, enhanced photoluminescence of the can be achieved. It is postulated that the organic molecules are expelled from the perovskite crystal grains during crystallisation and accumulate at the grain boundaries. The organic molecules within/at the grain boundaries then act to block/inhibit coulomb interaction between anions and cations in adjacent grains of the metal halide perovskite, thereby reducing the defect density.

Once passivated with passivating agents as described herein, the stability of perovskite films to ambient conditions is surprisingly greatly enhanced. For instance, films of some perovskites (such as $CH_3NH_3SnI_3$ for example) are extremely sensitive to humidity in the air, and oxygen, and rapidly degrade turning colourless within seconds of exposure to ambient conditions. However, the inventors have found that they may be made stable for hours, days and even weeks in ambient conditions following molecular passivation as described herein. Thus, perovskites such as $CH_3NH_3SnI_3$ which were known previously to be very unstable, may now be stabilised over long periods, allowing their use in devices.

The inventors have introduced a passivation method for metal halide perovskite devices, by employing passivating agents, for instance halogen bond donors (e.g. iodopentafluorobenzene) and organic molecules comprising sulfur atoms (e.g. thiophene), in a supramolecular assembly. Passivating agents comprising nitrogen atoms (e.g. pyridine) may also be used as passivating agents in a supramolecular assembly. The PCE of the treated solar cells can show increases of several percentage points (e.g. from 13% to over 16%), and the mechanism responsible for the enhancements has been elucidated: without treatment, under-coordinated halide anions and defect sites act as hole-traps leading to a significant accumulation of charge at the perovskite/hole transporter heterojunction and within perovskite. This leads to faster recombination and is likely to result in a disadvantageous charge density profile within the hole transporter and perovskite film, which should inhibit fast and efficient charge extraction under working conditions. The passivating agents can bind to and screen the electrostatic charge from the under-coordinated halide ions and defect sites, resolving the issue. Beyond advancing the current technology, this work demonstrates that chemical treatments of the perovskite crystal can lead to enhanced operation in the solar cells. Further improvements in both performance and reproducibility are expected by pacifying any under-coordinated cations (A, B and X ions) and defect sites, without relying on atmospheric oxygen and water. In addition, passivating agents can stabilize and protect perovskites which are typically unstable in air, such as tin and germanium based perovskites.

The inventors have thus developed efficient devices comprising perovskites passivated with an organic passivating agent. According to a first aspect, the invention provides a device comprising a semiconductor, which semiconductor comprises:

(a) a metal halide perovskite; and
(b) a passivating agent which is an organic compound; wherein molecules of the passivating agent are chemically bonded to anions or cations in the metal halide perovskite. The device may be an optoelectronic device, for instance a photovoltaic device.

The invention may also be applied to crystalline ionic solids in general. Thus, the invention also provides a device comprising a semiconductor, which semiconductor comprises:

(a) a crystalline ionic solid; and
(b) a passivating agent which is an organic compound; wherein molecules of the passivating agent are chemically bonded to anions or cations in the crystalline ionic solid. The device may be an optoelectronic device, for instance a photovoltaic device.

The invention also provides a device comprising a semiconductor, which semiconductor comprises:
(a) a metal halide perovskite; and
(b) a passivating agent which is
(i) a halogen bond donor compound, or
(ii) an organic compound comprising at least one thiol or sulfide group.

The device may be an optoelectronic device, for instance a photovoltaic device.

The invention also provides a process for producing a device comprising a semiconductor, which semiconductor comprises:
(a) a metal halide perovskite; and
(b) a passivating agent which is an organic compound;
wherein molecules of the passivating agent are chemically bonded to anions or cations in the metal halide perovskite,
wherein the process comprises treating a metal halide perovskite with a passivating agent, which passivating agent is an organic compound and is suitable for chemically bonding to anions or cations in the metal halide perovskite.

The invention also provides a process for producing a device comprising a semiconductor, which semiconductor comprises:
(a) a crystalline ionic solid; and
(b) a passivating agent which is an organic compound;
wherein molecules of the passivating agent are chemically bonded to anions or cations in the crystalline ionic solid,
wherein the process comprises treating a crystalline ionic solid with a passivating agent, which passivating agent is an organic compound and is suitable for chemically bonding to anions or cations in the crystalline ionic solid.

The device produced may be an optoelectronic device, for instance a photovoltaic device.

The invention also provides a device obtainable by a process for producing a device according to the invention. The device may be an optoelectronic device, for instance a photovoltaic device.

In addition, according to a second aspect the invention provides a device comprising a semiconductor, which semiconductor comprises:
(a) a metal halide perovskite; and
(b) a passivating agent which is an organic compound;
wherein molecules of the passivating agent are disposed at grain boundaries within the metal halide perovskite and are not chemically bonded to anions or cations in the metal halide perovskite. The device may be an optoelectronic device, for instance a photovoltaic device.

The invention therefore also provides a device comprising a semiconductor, which semiconductor comprises:
(a) a metal halide perovskite; and
(b) a passivating agent which is an organic compound comprising non-polar organic molecules. The device may be an optoelectronic device, for instance a photovoltaic device.

The invention also provides a process for producing a device comprising a semiconductor, which semiconductor comprises:
(a) a metal halide perovskite; and
(b) a passivating agent which is an organic compound;
wherein molecules of the passivating agent are disposed at grain boundaries within the metal halide perovskite and are not chemically bonded to anions or cations in the metal halide perovskite;
wherein the process comprises treating a metal halide perovskite with a passivating agent, which passivating agent is an organic compound that does not chemically bond to anions or cations in the metal halide perovskite.

The device produced may be an optoelectronic device, for instance a photovoltaic device. The invention also provides a device obtainable by a process for producing a device according to the invention. The device may be an optoelectronic device, for instance a photovoltaic device.

DETAILED DESCRIPTION OF THE INVENTION

Definitions

Figure 1:
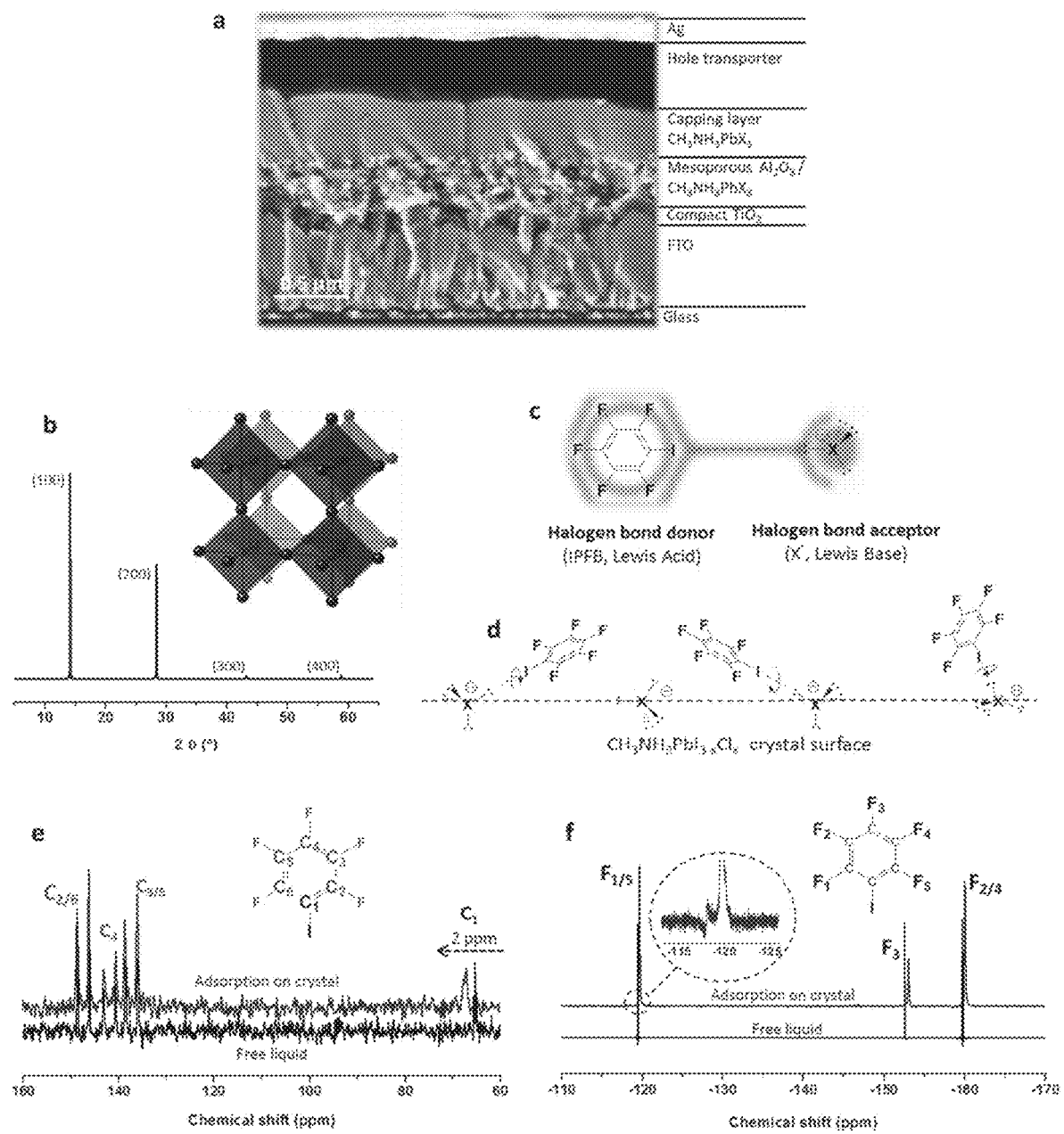
FIGS. 1$a$-1$f$ shows: (a) Cross-sectional scanning electron microscopy of a complete MSSC (meso super-structured solar cell); (b) Powder X-ray diffraction pattern (h 0 0, h=1-4) and crystal structure of $CH_3NH_3PbI_{3-x}Cl_x$ film on a glass substrate and its crystal unit cell (Pb, small spheres; X, large spheres, $CH_3NH_3^+$ not shown); (c) Schematic view of the halogen bond interaction between the iodopentafluorobenzene (IPFB, halogen bond donor) and a generic halogen anion ($X^-=I^-$, $Br^-$, $Cl^-$, halogen bond acceptor) with $sp^3$ hybridized valence electrons; (d) Proposed scenario for the IPFB assembly on the crystal surface; (e)-(f) Solid-state $^{13}C$ and $^{19}F$ NMR spectra for IPFB as a pure liquid and when adsorbed onto the crystal surface. Inset FIG. 1($e$) zoom in at 120 ppm.

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (1/2, 1/2, 1/2) and the X anions are at (1/2, 1/2, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "crystalline ionic solid", as used herein, refers to a solid which comprises a crystal structure comprising anions and cations, for instance metal halide perovskites and organometal halide perovskites. The anions or cations may be any anions or cations. As the skilled person will appreciate, crystal structures may have a degree of covalent bonding, however the term "crystalline ionic solid" still encompasses crystalline compounds having a degree of covalent bonding. Thus, compounds such as titanium dioxide and copper (I) iodide fall within the term "crystalline ionic solid".

The term "chemical bond", as used herein, refers to an attractive interaction between two atoms or ions (including atom-atom, atom-ion and ion-ion interactions). This may be a specific orbital interaction. "Chemical bond" includes supramolecular chemical bonds. The term "supramolecular chemical bond" as used herein means a chemical bond, wherein one atom or ion in the chemical bond is in one molecule and the other atom or ion is in a separate molecule or crystal structure, or is an isolated atom or ion. Supramolecular bonds are typically non-covalent bonds.

The term "chemically bonded", as used herein, refers to two species selected from molecules, atoms or ions between which there is a chemical bond, and includes reference to two species selected from molecules, atoms or ions bonded by a supramolecular chemical bond.

The term "halogen bond", as used herein, refers to a non-covalent supramolecular chemical bond formed between a halogen atom and a Lewis base. In a halogen bond, the halogen atom acts as an electrophilic species which interacts with the nucleophilic Lewis base. Halogen atoms in organic molecules can be electron deficient due to electron withdrawing effects of other moieties in the molecule, or due to the formation of induced dipoles. Lewis bases such as anions (including halide anions, in particular iodide) can interact strongly with halogenated organic compounds via this specific supramolecular interaction. This interaction defines any supramolecular non-covalent bond which involves a halogen atom as an electrophile. One of the strongest reported halogen bond donors is iodopentafluorobenzene (IPFB, FIG. 1c). In this compound, the highly electronegative fluorine atoms inductively withdraw electron density out of the aromatic ring, which in turn withdraws electron density from the iodine bonded to the aromatic ring, leaving a partial positive charge on this halogen. Furthermore, the charge density on the iodine in IPFB is anisotropically distributed, with positive electrostatic potential localized opposite the carbon on the extension of the C—I bond axis. This electropositive region can interact attractively with any electron rich sites (for instance Lewis bases), and the interaction is especially strong with other halogen anions ($X^-$, Lewis base, FIG. 1c). Since this positive region on the iodine is surrounded by a belt of negative electrostatic potential, any shift from a co-axial arrangement of —C—I---$X^-$ (see FIG. 1c) results in electrostatic repulsions. Thus, the angle —C—I---$X^-$ is always close to 180°, whereas the I---$X^-$ distance depends on the particular crystalline structure.

The term "halogen bond donor compound", as used herein, refers to a compound comprising an electrophilic halogen atom which may interact with a Lewis base to form a halogen bond.

The term "chalcogen", as used herein, refers to an element selected from Group 16 of the Periodic Table of the Elements. Thus, the chalcogens include O, S, Se, and Te. Occasionally, the chalcogens are not taken to include O. Thus, the chalcogens may be understood to include S, Se and Te.

The term "chalcogen-metal bond", as used herein, refers to a chemical bond formed between a chalcogen atom or anion and a metal atom or cation. This includes a chemical bond between an oxygen atom and a metal cation or atom, or a sulfur atom and a metal cation or atom. Chalcogen-metal bonds are often dative covalent bonds where the metal atom or cation acts as a Lewis acid and the chalcogen atom or anion acts as a Lewis base. Sulfur can form strong sulfur-metal bonds.

The term "under-coordinated", as used herein, refers to an anion or a cation in a crystal structure, the coordination of which is lower than for other ions of the same type in the rest (or bulk) of the crystal. For instance, if cations in the bulk of a crystal are coordinated by 6 nearest neighbour anions, a cation in the same crystal structure which is coordinated by 5 or fewer nearest neighbour anions is therefore under-coordinated. Under-coordinated ions may occur at the surface of a crystal due to no further unit cells of the crystal existing beyond the surface to coordinate the ions at the surface, or under-coordinated ions may occur in the bulk of the crystal at sites where there a crystal defect (i.e. defect sites), for instance a vacancy (i.e. an absence of an ion, sometimes known as a Schottky defect, particularly when a pair of ions are absent), as ions adjacent to the vacancy will thus be lacking one nearest neighbour counterion.

The term "defect site", as used herein, refers to a defect in a crystal lattice where the local crystal structure does not correspond to the crystal structure of the bulk material. Defect sites include point defects, line defects and planar defects. Point defects include vacancy defects (the absence of an ion), interstitial defects (the interstitial inclusion of an additional ion), Frenkel defects (a closely located pair of defects consisting of an interstitial defect and a vacancy defect) and the presence of an impurity ion. Planar defects include grain boundaries, and stacking faults.

The term "grain boundary", as used herein, refers to is a planar defect that separates regions of different crystalline orientation (i.e. grains) within a crystalline solid. A grain boundary is therefore the interface between two adjacent grains, or crystallites, in a crystalline material. Grain boundary defects can decrease the electrical and thermal conductivity of the material and are also preferred sites for the onset of corrosion.

The term "organic compound" takes its normal meaning in the art. Typically, an organic compound will comprise a carbon atom. As the skilled person would understand it, an organic compound may comprise a carbon atom covalently bonded to another carbon atom, or to a hydrogen atom, or to a halogen atom, or to a chalcogen atom (for instance an oxygen atom, a sulfur atom, a selenium atom, or a tellurium atom). Thus, the term "organic compound" includes compounds such as perhalogenated organic compounds such as tetraiodomethane and iodopentafluorbenzene, and compounds such as oxalic acid, urea and thiourea. The skilled person will understand that the term "organic compound" does not typically include compounds that are predominantly ionic such as carbides, for instance.

The term "thiol group", as used herein, refers to the group —SH. The term "sulfide group", as used herein, refers to the group —S—, i.e. a sulfur atom bonded to two other groups, typically wherein the sulfur atom is bonded to two carbon atoms.

The term "electron withdrawing group", as used herein, refers to a group which withdraws electrons away from the moiety to which it is attached. Electron withdrawing groups often contain electronegative groups such as halogen atoms, carbonyl groups, and nitro groups.

The term "alkyl", as used herein, refers to a linear or branched chain saturated hydrocarbon radical. An alkyl group may be a $C_{1-18}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "alkenyl", as used herein, refers to a linear or branched chain hydrocarbon radical comprising one or more double bonds. An alkenyl group may be a $C_{2-18}$ alkenyl group, a $C_{2-14}$ alkenyl group, a $C_{2-10}$ alkenyl group, a $C_{2-6}$ alkenyl group or a $C_{2-4}$ alkenyl group. Examples of a $C_{2-10}$ alkenyl group are ethenyl (vinyl), propenyl, butenyl, pentenyl, hexenyl, heptenyl, octenyl, nonenyl or decenyl. Examples of $C_{2-6}$ alkenyl groups are ethenyl, propenyl, butenyl, pentenyl or hexenyl. Examples of $C_{2-4}$ alkenyl groups are ethenyl, i-propenyl, n-propenyl, s-butenyl or n-butenyl. Alkenyl groups typically comprise one or two double bonds.

The term "alkynyl", as used herein, refers to a linear or branched chain hydrocarbon radical comprising one or more triple bonds. An alkynyl group may be a $C_{2-18}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl or decynyl. Examples of $C_{1-6}$ alkynyl groups are ethynyl, propynyl, butynyl, pentynyl or hexynyl. Alkynyl groups typically comprise one or two triple bonds.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl and indanyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The terms "alkylene", "cycloalkylene", "alkenylene", "alkynylene", and "arylene", as used herein, refer to bivalent groups obtained by removing a hydrogen atom from an alkyl, cycloalkyl, alkenyl, alkynyl, or aryl group, respectively. An alkylene group may be a $C_{1-18}$ alkylene group, a $C_{1-14}$ alkylene group, a $C_{1-10}$ alkylene group, a $C_{1-6}$ alkylene group or a $C_{1-4}$ alkylene group. Examples of $C_{1-6}$ alkylene groups are methylene, ethylene, propylene, butylene, pentylene and hexylene. A cycloalkylene group may be a $C_{3-10}$ cycloalkylene group, a $C_{3-8}$ cycloalkylene group or a $C_{3-6}$ cycloalkylene group. Examples of $C_{3-6}$ cycloalkylene groups include cyclopentylene and cyclohexylene. An alkenylene group may be a $C_{2-18}$ alkenylene group, a $C_{2-14}$ alkenylene group, a $C_{2-10}$ alkenylene group, a $C_{2-6}$ alkenylene group or a $C_{2-4}$ alkenylene group. Examples of a $C_{2-4}$ alkenylene group include ethenylene (vinylene), propenylene and butenylene. An alkynylene group may be a $C_{2-18}$ alkynylene group, a $C_{2-14}$ alkynylene group, a $C_{2-10}$ alkynylene group, a $C_{2-6}$ alkynylene group or a $C_{2-4}$ alkynylene group. Examples of a $C_{2-4}$ alkynylene group include ethynylene and propynylene. Examples of arylene groups include phenylene and a diradical derived from thiophene. For alkylene, cycloalkylene, alkenylene, alkynylene, and arylene, these groups may be bonded to other groups at any two positions on the group. Thus, propylene includes— $CH_2CH_2CH_2$— and —$CH_2CH(CH_3)$—, and phenylene includes ortho-, meta- and para-phenylene.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "perhaloalkyl", as used herein, refers to an alkyl group in which all, or almost all, H atoms have been replaced with halogen atoms. Typically, 3 out of 5 hydrogen atoms have been replaced with halogen atoms. Thus, perhaloalkyl groups include —$(CF_2)_3F$, —$(CCl_2)_2(CF_2)_2H$, and —$(CHCl)(CF_2)H$, for instance.

The term "oligomer", as used herein, refers to a molecule which comprises a small number of repeating units (i.e. a small number of monomers). Typically oligomers comprise from 2 to 9 monomers, or from 3 to 6 monomers.

The term "band gap", as used herein, refers to the energy difference between the top of the valence band and the bottom of the conduction band in a material. The skilled person may readily measure the band gap of a material without undue experimentation.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the scaffold where there is no material. Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994. Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. The term "non-porous" as used herein, refers to a material without any porosity, i.e. without open porosity and also without closed porosity.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor.

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "treating", as used herein, refers to any process in which one compound is allowed to react or interact with another. One of the compounds with which the other is treated may be added as the compound itself, or may be added as a precursor that converts by some process to the compound itself.

The term "disposing on", as used herein, refers to the making available or placing of one component on another component. The first component may be made available or placed directly on the second component, or there may be a third component which intervenes between the first and second component. For instance, if a first layer is disposed on a second layer, this includes the case where there is an intervening third layer between the first and second layers. Typically, however, "disposing on" refers to the direct placement of one component on another.

The term "electrode material", as used herein, refers to any material suitable for use in an electrode. An electrode material will have a high electrical conductivity.

Device

In a first aspect the invention provides a device comprising a semiconductor, which semiconductor comprises:
(a) a metal halide perovskite; and
(b) a passivating agent which is an organic compound;
wherein molecules of the passivating agent are chemically bonded to anions or cations in the metal halide perovskite. The metal halide perovskite may be an organometal halide perovskite.

Usually, the semiconductor in the devices and processes of the first embodiment of the invention comprises (a) said metal halide perovskite, in addition to (b) the passivating agent, and the invention will generally be described hereinbelow in those terms. However, as mentioned above, the invention is applicable not just to metal halide perovskite semiconductors but to crystalline ionic solid semiconductors in general, including crystalline ionic solid semiconductors other than metal halide perovskites, such as for instance metal oxide semiconductors. Metal oxide semiconductors are themselves well known and titania is one example of such a metal oxide semiconductor. Accordingly, as the skilled person will appreciate, any of the embodiments of the invention described hereinbelow in terms of a metal halide perovskite may also be performed using any ionic crystalline solid, such as for instance a metal oxide, e.g. titania. Usually, the crystalline ionic solid is a metal halide perovskite, which may for instance be any of the metal halide perovskites described or defined further herein. Alternatively, however, the crystalline ionic solid may comprise a different crystalline ionic solid, for instance a metal oxide. One metal oxide that is often employed is titanium dioxide.

Thus, in another aspect, the first aspect of the invention provides a device comprising a semiconductor, which semiconductor comprises: (a) a crystalline ionic solid; and (b) a passivating agent which is an organic compound; wherein molecules of the passivating agent are chemically bonded to anions or cations in the crystalline ionic solid.

When the device comprises a crystalline ionic solid, the crystalline ionic solid may comprise any ionic solid defined anywhere herein. For instance, the crystalline ionic solid may comprise an inorganic n-type material or an inorganic p-type material as described herein, in particular a crystalline inorganic n-type material. Thus, the crystalline ionic solid may comprise a metal oxide. The device may comprise a semiconductor, which semiconductor comprises: (a) an metal oxide; and (b) a passivating agent which is an organic compound; wherein molecules of the passivating agent are chemically bonded to anions or cations in the metal oxide. The metal oxide is often an oxide of titanium, tin, zinc, niobium, tantalum, tungsten, indium, gallium, neodinium, palladium, or cadmium, or an oxide of a mixture of two or more of said metals. For instance, the ionic solid may be a metal oxide selected from $TiO_2$, $SnO_2$, ZnO, $Nb_2O_5$, $Ta_2O_5$, $W_3$, $W_2O$, $In_2O_3$, $Ga_2O_3$, $Nd_2O_3$, PbO, and CdO. In particular, the metal oxide may be $TiO_2$. The crystalline ionic solid may comprise an inorganic p-type material such as any of those described herein. The crystalline ionic solid may comprise a semiconducting metal halide or a semiconducting compound comprising copper. For instance, the crystalline ionic solid may comprise CuI, CuBr, CuSCN, $Cu_2O$, CuO or CIS.

In the first aspect the passivating agent is an organic compound. The passivating agent may be an organic compound having a molecular weight of less than or equal to 2000 $gmol^{-1}$, or less than or equal to 1000 $gmol^{-1}$. The passivating agent may be an organic compound comprising one or more heteroatoms. The passivating agent is typically an organic compound comprising from one 10 to heteroatoms, or comprising from one to six heteroatoms. The heteroatoms are usually selected from the p-block of the Periodic Table (except for C). For instance, the one or more heteroatoms may be independently selected from N, P, As, O, S, Se, Te, F, Cl, Br, and I. Usually, the one or more heteroatoms are each independently selected from N, P, O, S, Se, Te, F, Cl, Br, and I Typically, the one or more, or one to six, heteroatoms may be heteroatoms each independently selected from N, O, S, Se, Te, F, Cl, Br, and I, for instance O, S, F, Cl, Br and I or N, S, F, Cl, Br, and I. The passivating agent is typically an organic compound, which organic compound comprises one or more atoms selected from O, S, F, Cl, Br and I. The passivating agent may be an organic compound, which organic compound comprises one or more atoms selected from S, F, Cl, Br and I. The organic compound may comprise one or more different types of heteroatom.

In the first aspect the passivating agent may be an organic compound, which organic compound comprises one or more atoms selected from N, P, S, F, Cl, Br and I. The passivating agent may be an organic compound, which organic compound comprises one or more atoms selected from N, P and S. In one embodiment, the passivating agent is an organic compound, which organic compound comprises one or more atoms selected from N and P.

In the first aspect, at least some of the molecules of the passivating agents are chemically bonded to anions or cations in the metal halide perovskite. Typically, the molecules of the passivating agent are chemically bonded to anions or cations in the metal halide perovskite by supramolecular chemical bonds. All, or essentially all, of the molecules of the passivating agent may be bonded to anions or cations in the metal halide perovskite. Greater than or equal to 50%, or greater than or equal to 70% of the molecules of the passivating agent are typically bonded to anions or cations in the metal halide perovskite. For instance, greater than or equal to 90% of the molecules of the passivating agent are typically bonded to anions or cations in the metal halide perovskite. Molecules of the passivating agent are often bonded to anions or cations in the metal halide perovskite via heteroatoms in the molecules of the passivating agent. The word "bonded" may be used interchangeably with "bound".

The chemical bonds are typically supramolecular chemical bonds. Thus, the semiconductor may comprise: (a) a metal halide perovskite; and (b) a passivating agent which is an organic compound; wherein molecules of the passivating agent are supramolecularly chemically bonded to anions or cations in the metal halide perovskite.

The chemical bonds between molecules of the passivating agent and anions or cations in the metal halide perovskite are usually selected from halogen bonds and chalcogen-metal bonds. Chalcogen-metal bonds may be selected from oxygen-metal bonds, sulfur-metal bonds, or selenium-metal bonds. Typically, the chalcogen-metal bonds are sulfur-metal bonds. The chalcogen-metal bonds may be dative covalent bonds.

The chemical bonds between molecules of the passivating agent and anions or cations in the metal halide perovskite may alternatively be selected from nitrogen-metal bonds and phosphorus-metal bonds. In a nitrogen-metal bond, a nitrogen atom in the passivating agent may coordinate to the metal ion or atom through a lone pair. The nitrogen-metal bonds may be dative covalent bonds. In a phosphorus-metal bond, a phosphorus atom in the passivating agent may coordinate to the metal ion or atom through a lone pair. The phosphorus-metal bonds may be dative covalent bonds. Both nitrogen-metal bonds and phosphorus metal bonds are typically supramolecular bonds.

Cations or anions in the metal halide perovskite to which molecules of the passivating agent are bonded are typically under-coordinated. Under-coordinated anions and cations may be located at an exposed surface of the perovskite, or may be in the bulk of the perovskite at or near a defect site. Under-coordinated anions or cations may be under-coordinated due to the absence of one, two, three or four nearest neighbour counterions.

At least some of the anions or cations in the metal halide perovskite to which molecules of the passivating agent are bonded may be at the surface of the metal halide perovskite or at defect sites in bulk of the crystal structure of the metal halide perovskite. Often, anions or cations in the metal halide perovskite to which molecules of the passivating agent are bonded are at the surface of the metal halide perovskite and at the grain boundaries in bulk of the metal halide perovskite.

In a second aspect, the invention provides a device comprising a semiconductor, which semiconductor comprises:
(a) a metal halide perovskite; and
(b) a passivating agent which is an organic compound; wherein molecules of the passivating agent are disposed at grain boundaries within the metal halide perovskite and are not chemically bonded to anions or cations in the metal halide perovskite. The metal halide perovskite may be an organometal halide perovskite. The device may be an optoelectronic device, for instance a photovoltaic device.

The second aspect of the invention therefore also provides a device comprising a semiconductor, which semiconductor comprises: (a) a crystalline ionic solid; and (b) a passivating agent which is an organic compound; wherein molecules of the passivating agent are disposed at grain boundaries within the crystalline ionic solid and are not chemically bonded to anions or cations in the crystalline ionic solid.

In the second aspect the passivating agent may be an organic compound, which organic compound comprises non-polar organic molecules. The passivating agent may be an organic compound, which organic compound comprises polycyclic aromatic hydrocarbon molecules.

Passivating Agents and Passivation

As described above, in the first aspect the passivating agent which is an organic compound is typically an organic compound comprising one or more heteroatoms. The passivating agent may be an organic compound comprising a heteroatom which has a lone pair. A lone pair may interact with an ion in the metal halide perovskite to form a chemical bond, for instance a supramolecular bond such as a dative bond.

Typically, the formula of the metal halide perovskite contains a compound A or a cation of a compound $AH^+$, the passivating agent will not be the compound A. Thus, if the formula of the metal halide perovskite includes a specific alkyl ammonium ion, the passivating agent of the first aspect is not the corresponding alkyl amine.

In the first aspect the passivating agent may be a compound selected from: (a) a halogen bond donor compound, and (b) an organic compound comprising at least one heteroatom with a lone pair. The organic compound comprising at least one heteroatom with a lone pair may be selected from an organic compound comprising at least one heteroatom selected from N, P, As, O, S, Se and Te. The organic compound comprising at least one heteroatom with a lone pair is typically selected from an organic compound comprising at least one hetero atom selected from N, P, O, S and Se or selected from N, O and S. The passivating agent may be a compound selected from: (a) a halogen bond donor compound, and (b) an organic compound comprising at least one heteroatom selected from N, P, As, O, S, Se and Te. The passivating agent may be a compound selected from: (a) a halogen bond donor compound, and (b) an organic compound comprising at least one heteroatom selected from N, P, O, S, and Se, or N, O, and S.

Examples of compounds comprising at least one N include compounds comprising a group selected from amine, imine, nitrile, hydrazine, pyridine, 2H-pyrrole, pyrrole, 2-pyrroline, 3-pyrroline, pyrrolidine, oxazole, thiazole, imidazole, 2-imidazoline, imidazolidine, pyrazole, 2-pyrazoline, and other nitrogen containing heterocycles. For instance, a compound comprising at least one N may be a compound comprising a group selected from amine, imine, nitrile, hydrazine, pyridine, and pyrrolidine. Thus, the passivating agent may be a substituted or unsubstituted amine, a substituted or unsubstituted imine, a substituted or unsubstituted pyridine or a substituted or unsubstituted pyrrolidine.

In a device according to the first aspect of the invention, the passivating agent may be a compound selected from: (a) a halogen bond donor compound, and (b) an organic compound comprising at least one thiol or sulfide group. The passivating agent may be an organic compound comprising at least one heteroatom selected from N and P.

The passivating agent of the first aspect may be a halogen bond donor compound. The passivating agent may be an organic compound comprising at least one thiol or sulfide group. The device may comprise further passivating agents. Thus, the device may further comprise a second passivating agent. For instance, the device may comprises a first passivating agent which is a halogen bond donor compound and a second passivating agent which is an organic compound comprising at least one thiol or sulfide group.

The passivating agent of the first aspect may be a halogen bond donor compound of formula X-EWG, wherein: X is a halogen selected from I, Br, Cl and F; and EWG is an electron withdrawing group. EWG may be any group which inductively or conjugatively withdraws electrons from X. EWG may be an organic group comprising one or more atoms having an electronegativity greater than that of carbon. EWG may comprise one or more, two or more, three or more, or from three to six atoms having a Pauling electronegativity of greater than or equal to 2.6. EWG may comprise one or more, two or more, three or more, or from three to six atoms having a Pauling electronegativity of greater than or equal to 2.9. The atoms having a Pauling electronegativity of greater than or equal to 2.6, or greater than or equal to 2.9, may be separated from X by 10 or less, or 6 or less, bonds. Tables of Pauling electronegativity values are available to the skilled person. Pauling electronegativity values include 2.98 for F, 3.44 for O, 3.16 for Cl, 3.04 for N, and 2.96 for Br. EWG may be an organic group comprising two or more, three or more, four or more or five or more atoms selected from F, Cl, Br, I, O, and S. EWG may be a perhalo-$C_{1-12}$-alkyl group. For instance, EWG may be a perfluoro-$C_{1-12}$-alkyl group, such as trifluormethyl, pentafluoroethyl, or heptafluoropropyl, perfluorobutyl, perfluoropentyl, perfluorohexyl, perfluoroheptyl, perfluorooctyl, perfluorononyl or perfluorodecyl.

X may be selected from I, Br, Cl and F, from I, Br and Cl, or from I and Br. For instance, X may be I.

The passivating agent of the first aspect is often a halogen bond donor compound of formula X-EWG, wherein X is a halogen selected from I, Br, Cl and F; and EWG is a group selected from —$(CY_2)_nY$, —$(CY_2)_nR$, —$(CR_2)_nY$, —$(CR_2)_nR$, —$(CY_2)_nCR_3$, —$(CR_2)_nCY_3$, —$(CY_2)_n(CR_2)_mY$, —$(CY_2)_n(CR_2)_mY$, —$(CY_2)_n(CR_2)_mR$, —$(CR_2)_n(CY_2)_mR$, —$(CY_2)_n(CR_2)_mCY_3$, —$(CR_2)_n(CY_2)_mCR_3$, —$(CR_aY_b)_nY$, —$(CR_aY_b)_nR$, —$C_6Y_5$, —$(C_6R)Y_4$, —$(C_6R_2)Y_3$, —$(C_6R_3)Y_2$, —$(C_6R_4)Y$, —CY=CYR, —CY=$CR_2$, —CR=CYR, —C≡CY, —C≡CR, —COR, —$COCYR_2$ and —$COCY_2R$; wherein each Y is the same or different and is a halogen selected from I, Br, Cl, and F; each R is the same or different and is a group selected from H, hydroxy, nitrile, nitro, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl;

n is an integer from 1 to 18;
m is an integer from 1 to 18;
each a is the same or different and is 0, 1 or 2;
each b is the same or different and is 0, 1 or 2; and
the sum of a and b in each $CR_aY_b$ group is 2.

Thus, the groups —$(CR_aY_b)_nY$ and —$(CR_aY_b)_nR$ include any straight chain alkyl group substituted with any number of halogen atoms. For instance, —$(CR_aY_b)_nY$ includes— (CClH)(CH$_2$)$_2$(CFI)Br and —(CHF)$_3$CF$_3$.

Often n is an integer from 1 to 6 and m is an integer from 1 to 6. EWG may be a group selected from —$(CY_2)_nY$, —$(CY_2)_nR$, —$(CR_2)_nY$, —$(CR_2)_nR$, —$(CY_2)_nCR_3$, —$(CR_2)_nCY_3$, —$(CY_2)_n(CR_2)_mY$, —$(CR_2)_n(CY_2)_mY$, —$(CY_2)_n(CR_2)_mR$, —$(CR_2)_n(CY_2)_mR$, —$(CY_2)_n(CR_2)_m$ $CY_3$, —$(CR_2)_n(CY_2)_mCR_3$, —$(CR_aY_b)_nY$, —$(CR_aY_b)_nR$, —$C_6Y_5$, —$(C_6R)Y_4$, —$(C_6R_2)Y_3$, —$(C_6R_3)Y_2$, —$(C_6R_4)Y$, —CY=CYR, —CY=$CR_2$, —CR=CYR, —C≡CY, —C≡CR, —COR, —$COCYR_2$ and —$COCY_2R$; wherein each Y is the same or different and is a halogen selected from I, Br, Cl, and F; each R is the same or different and is a group selected from H, hydroxy, nitrile, nitro, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; n is an integer from 1 to 6; m is an integer from 1 to 6; each a is the same or different and is 0, 1 or 2; each b is the same or different and is 0, 1 or 2; and the sum of a and b in each $CR_aY_b$ group is 2. Often, R is unsubstituted. Each R is the same or different and is usually a group selected from H, hydroxy, nitrile, nitro, unsubstituted $C_{1-10}$-alkyl, unsubstituted $C_{3-10}$-cycloalkyl, unsubstituted $C_{2-10}$-alkenyl, unsubstituted $C_{2-10}$-alkynyl, and unsubstituted aryl.

The passivating agent of the first aspect may be a halogen bond donor compound of formula X-EWG, wherein X is a halogen selected from I, Br, Cl and F; and EWG is a group selected from —$CY_3$, —$(CY_2)_2Y$, —$(CY_2)_3Y$, —$CY_2R$, —$(CY_2)_2R$, —$(CY_2)_3R$, —$CR_2Y$, —$C_6Y_5$, —$(C_6R)Y_4$, —$(C_6R_2)Y_3$, —$(C_6R_3)Y_2$, —$(C_6R_4)Y$, —CY=CYR, —CY=$CR_2$, —C≡CY, —COR, —$COCYR_2$ and —$COCY_2R$; wherein each Y is the same or different and is a halogen selected from I, Br, Cl, and F; and each R is the same or different and is a group selected from H, hydroxy, nitrile, nitro, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl.

EWG may be a group selected from —$CY_3$, —$(CY_2)_2Y$, —$(CY_2)_3Y$, —$(CY_2)_2R$, —$(CY_2)_3R$, —$C_6Y_5$, —$(C_6R)Y_4$, —$(C_6R_2)Y_3$, —COR, —$COCYR_2$ and —$COCY_2R$. X may be selected from I, Br and Cl. Y may be selected from I, Br, Cl, and F, from Br, Cl and F, or from Cl and F. For instance, Y may be F. X may be selected from I and Br and Y may be selected from Cl and F.

The passivating agent of the first aspect is often a halogen bond donor compound selected from X(CY$_2$)$_m$CY$_3$ and

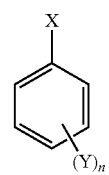

wherein X is a halogen selected from I, Br, Cl and F; each Y is the same or different and is a halogen selected from I, Br, Cl and F; m is 0 or an integer from 1 to 11 and n is an integer from 1 to 5.

The passivating agent of the first aspect may be a halogen bond donor compound selected from $I(CY_2)_mCY_3$ and

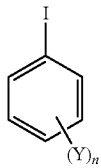

wherein each Y is the same or different and is a halogen selected from I, Br, Cl and F; m is 0 or an integer from 1 to 11 and n is an integer from 1 to 5.

The passivating agent of the first aspect may be a halogen bond donor compound selected from $I(CF_2)_mCF_3$ and

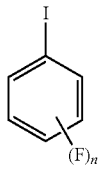

wherein m is 0 or an integer from 1 to 11; and n is an integer from 1 to 5.

Often, m is from 0 to 8. Typically, n is from 2 to 5. Typically, X is selected from I or Br and Y may be selected from Br, Cl and F.

The passivating agent of the first aspect may be selected from iodopentafluorbenzene, iodotetrafluorobenzene, iodochlorotetrafluorobenzene, iododichlorotrifluorobenzene, iodochlorotrifluorobenzene, iodotrifluorobenzene, iododichlorodifluorobenzene, and iododifluorobenzene, for instance.

The passivating agent of the first aspect may be selected from iodopentafluorobenzene and a perfluoro-$C_{1-12}$alkyl iodine. Often, the passivating agent is selected from iodopentafluorobenzene, perfluoro-n-butyl iodine, perfluoro-n-hexyl iodine, and perfluoro-n-decyl iodine. Iodopentafluorobenzene has the formula $IC_6F_5$.

The passivating agent of the first aspect may be an organic molecule which is suitable for forming a chalcogen-metal bond with metal ions in the perovskite. Thus, the passivating agent may be an organic molecule which comprises a chalcogen atom. The passivating agent may be a compound which comprises one or more, for instance two or more, chalcogen atoms. For instance, the passivating agent may be an organic compound which comprises a hydroxy group, a compound which comprises an ether group, an organosulfur compound, an organoselenium compound, or an organotellurium compound. Thus, the passivating agent may be an organosulfur compound or an organoselenium compound. Often the passivating agent is an organosulfur compound.

Examples of organosulfur compounds include compounds comprising one or more groups selected from thioether (sulfide), thioester, thioacetal, thiol, disulfide, sulfone, thiosulfinate, thioketone, and thioaldehyde. Examples of organosulfur compounds include compounds comprising a thiophene, dihydrothiophene, tetrahydrothiophene, or tetrathiafulvalene group. Organoselenium and organosulfur compounds include those derived by replacing one or more sulfur atoms in an organosulfur compound with selenium or tellurium respectively.

The passivating agent of the first aspect may be an organic compound comprising at least one thiol or sulfide group. The passivating agent may be an organic compound comprising one thiol or sulfide group. The passivating agent may be an organic compound comprising two or more thiol or sulfide groups. The passivating agent may be an oligomer or a polymer, which oligomer or polymer comprises at least one thiol or sulfide group. If the passivating agent is an oligomer or a polymer, the oligomer or polymer may comprise monomers which comprise a thiophene ring. If the passivating agent is an oligomer, it may have from 2 to 9 repeating units, from 2 to 8 repeating units, or from 3 to 6 repeating units. The repeating units may comprise thiophene or tetrahydrothiophene. The passivating agent may be selected from sexithiophene. If the passivating is a polymer, it has greater than or equal to 10 repeating units. However, often the passivating agent is not a polymer. Thus, in one embodiment, the passivating agent, which is an organic compound, is not a polymer. Polymers typically have high molecular weights. Accordingly, the passivating agent which is an organic compound, may be an organic compound having a molecular weight of less than or equal to 2000 gmol-1, or less than or equal to 1000 gmol-1. In some cases, the passivating agent may be a monomeric organic compound which does not comprise a repeating unit.

The passivating agent of the first aspect may be an organic compound comprising at least one thiol or sulfide group, selected from: (i) $R^1SH$, $R^1SR^1$, $HSR^2SH$, $R^1SR^2SR^1$, $R^1SR^2SH$,

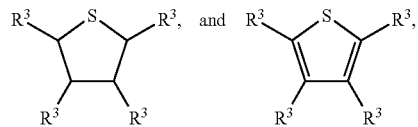

wherein: each R is the same or different and is a group selected from unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; $R^2$ is a group selected from unsubstituted or substituted $C_{1-18}$-alkylene, unsubstituted or substituted $C_{3-10}$-cycloalkylene, unsubstituted or substituted $C_{2-18}$-alkenylene, unsubstituted or substituted $C_{2-18}$-alkynylene, and unsubstituted or substituted arylene; and each $R^3$ is the same or different and is a group selected from H, hydroxy, nitrile, nitro, halo, thiol, amino, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; and (ii) an oligomer, which oligomer comprises at least one thiol or sulfide group.

Each R1 is the same or different and may be a group selected from unsubstituted or substituted $C_{1-6}$-alkyl, unsubstituted or substituted $C_{3-6}$-cycloalkyl, unsubstituted or substituted $C_2$-6-alkenyl, unsubstituted or substituted $C_{2-6}$-alkynyl, and unsubstituted or substituted aryl. $R^1$ may be unsubstituted. $R^2$ may be a group selected from unsubstituted or substituted $C_{1-6}$-alkylene, unsubstituted or substituted $C_{3-6}$-cycloalkylene, unsubstituted or substituted $C_{2-6}$-alkenylene, unsubstituted or substituted $C_{2-6}$-alkynylene, and unsubstituted or substituted arylene. $R_2$ may be unsubstituted. Each $R^3$ is the same or different and may be a group selected from H, hydroxy, nitrile, nitro, halo, amino, thiol, unsubstituted or substituted $C_{1-6}$-alkyl, unsubstituted or substituted $C_{3-6}$-cycloalkyl, unsubstituted or substituted $C_{2-6}$-alkenyl, unsubstituted or substituted $C_{2-6}$-alkynyl, and unsubstituted or substituted aryl. $R^3$ may be unsubstituted. One, two or three of $R^3$ may be H. The passivating agent of the first aspect may be an organic compound comprising at least one thiol or sulfide group, selected from:

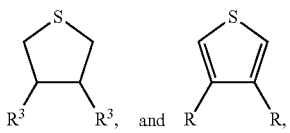

wherein: each $R^3$ is the same or different and is a group selected from H, hydroxy, nitrile, nitro, halo, thiol, amino, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; and each R is the same or different and is a group selected from H, hydroxy, nitrile, nitro, halo, thiol, amino, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl.

The passivating agent of the first aspect may be a thiol, such as methanethiol, ethanethiol, propanethiol, butanethiol and pentanethiol. The passivating agent may be a dithiol, such as ethanedithiol, propanedithiol and butanedithiol. Often, the passivating agent is a compound comprising a heteroaryl group, which heteroaryl group comprises a sulfur atom. The passivating agent may comprise a thiophene group, a dithiophene group, or a thiazole group.

The passivating agent of the first aspect may be selected from thiophene or tetrahydrothiophene substituted with one, two, three or four unsubstituted or substituted $C_{1-6}$-alkyl groups. The passivating agent may be selected from thiophene, tetrahydrothiophene, and 3-$C_{1-6}$-alkylthiophenes. The passivating agent may be thiophene, 3-hexylthiophene or tetrahydrothiophene. The passivating agent is often thiophene or tetrahydrothiophene.

Molecules of the passivating agent of the first aspect form supramolecular chemical bonds with anions and cations in the metal halide perovskite. The formation of these supramolecular bonds (for instance halogen bonds and chalogen-metal bonds) can order the molecules of the passivating agent. The molecules of the passivating agent may be ordered into regular layers.

Molecules of the passivating agent of the first aspect often form a self-assembled layer on a surface of the metal halide perovskite. Molecules of the passivating agent may form a monolayer on a surface of the perovskite. Molecules of the passivating agent may form a self-assembled monolayer. Molecules of the passivating agent may form a monolayer on a surface of the perovskite with a coverage of from 10% to 100%, from 50% to 100%, or from 80% to 100%. The coverage may be measured by standard techniques, for instance dual polarisation interferometry.

Molecules of the passivating agent of the first aspect may be bonded to under-coordinated cations or under-coordinated anions in the bulk of the crystal structure of the metal halide perovskite. As discussed above in the definition of "defect site", several types of defects may leave under-coordinated anions and cations in the bulk of the perovskite. These internal defect sites may also reduce device efficiency. Molecules of the passivating agent may be small enough to enter the bulk of the crystal structure of the metal halide perovskite. For instance, molecules of the passivating agent may have a largest external width of less than or equal to 1 nm.

Molecules of the passivating agent of the first aspect may also be bonded to cations or anions at grain boundaries in the bulk of the crystal structure of the metal halide perovskite. The passivating agent of the first aspect is often a halogen bond donor compound, and molecules of the halogen bond donor compound may be bonded to halide anions in the metal halide perovskite by halogen bonding. The passivating agent of the first aspect is often an organic compound comprising at least one thiol or sulfide group, and molecules of the organic compound may be bonded to metal cations in the metal halide perovskite by sulfur-metal bonds.

The passivating agent of the first aspect may be an organic compound comprising at least one heteroatom selected from N and P. The passivating agent may, for instance, be an organic compound selected from a substituted or unsubstituted amine, a substituted or unsubstituted imine, substituted or unsubstituted pyridine, substituted or unsubstituted pyrrolidine, substituted or unsubstituted pyrrole and a substituted or unsubstituted phosphine.

A substituted or unsubstituted amine is typically a substituted or unsubstituted primary amine, a substituted or unsubstituted secondary amine, or a substituted or unsubstituted tertiary amine.

A substituted or unsubstituted primary amine may be a substituted or unsubstituted primary alkyl amine or a substituted or unsubstituted primary aryl amine. The passivating agent may therefore be a compound of formula $RNH_2$, wherein R is a group selected from substituted or unsubstituted $C_{1-18}$ alkyl and substituted or unsubstituted aryl. For instance, the passivating compound may be methylamine, ethylamine, propylamine, tertbutylamine or aniline. R may for instance be selected from substituted or unsubstituted $C_{2-18}$ alkyl and substituted or unsubstituted aryl. The passivating compound may therefore be ethylamine, propylamine, tertbutylamine or aniline.

A substituted or unsubstituted secondary amine may be a substituted or unsubstituted secondary alkyl amine (a dialkyl amine), a substituted or unsubstituted secondary aryl amine (an diaryl amine) or a substituted or unsubstituted secondary alkyl aryl amine. The passivating agent may therefore be a compound of formula $R_2NH$, wherein each R is a group independently selected from substituted or unsubstituted $C_{1-18}$ alkyl or substituted or unsubstituted aryl, optionally wherein the two R groups are bonded together to form a ring. For instance, the passivating agent may be dimethylamine, diethylamine, dipropylamine, pyrrolidine, piperidine or diphenylamine. Substituted and unsubstituted secondary amines thus include cyclic amines such as substituted or unsubstituted pyrrolidine, substituted or unsubstituted piperidine, and substituted or unsubstituted morpholine.

A substituted or unsubstituted tertiary amine may be a substituted or unsubstituted tertiary alkyl amine (a trialkyl amine), a substituted or unsubstituted tertiary aryl amine (an triaryl amine) or a substituted or unsubstituted tertiary alkyl aryl amine (a dialkyl aryl amine or a alkyl diaryl amine). The passivating agent may therefore be a compound of formula $R_3N$, wherein each R is a group independently selected from substituted or unsubstituted $C_{1-18}$ alkyl or substituted or unsubstituted aryl, optionally wherein the two R groups are bonded together to form a ring. For instance, the passivating agent may be trimethylamine, triethylamine, triphenylamine, N-methylpyrrolidine or quinuclidine.

Thus, the passivating agent of the first aspect may be an organic compound of formula

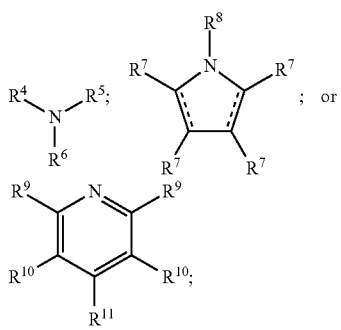

wherein

R4, $R^5$ and $R^6$ are each independently a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl, and not all $R^4$, $R^5$ and $R^6$ are H, optionally wherein two or more of $R^4$, $R^5$ and $R^6$ are bonded together to form a ring;

each $R^7$ is independently a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl, optionally wherein two or more $R^7$ groups are bonded together to form a ring;

$R^8$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl;

$R^9$, $R^{10}$ and $R^{11}$ are each independently a group selected from H, unsubstituted or substituted $C_{1-8}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl, optionally wherein two or more of $R^9$, $R^{10}$ and $R^{11}$ are bonded together to form a ring; and a dashed line together with a solid line may represent a single or a double bond.

Typically, R4, R5 and R6 are each independently a group selected from H, unsubstituted or substituted $C_{1-6}$-alkyl, unsubstituted or substituted $C_{3-6}$-cycloalkyl and unsubstituted or substituted aryl, and not all $R^4$, $R^5$ and $R^6$ are H, optionally wherein two or more of $R^4$, $R^5$ and $R^6$ are bonded together to form a ring.

Typically, each $R^7$ is independently a group selected from H and unsubstituted or substituted $C_{1-6}$-alkyl, optionally wherein two or more $R^7$ groups are bonded together to form a ring.

Typically, $R^8$ is a group selected from H and unsubstituted or substituted $C_{1-6}$-alkyl.

Typically, $R^9$, $R^{10}$ and $R^{11}$ are each independently a group selected from H and unsubstituted or substituted $C_{1-6}$-alkyl, optionally wherein two or more of $R^9$, $R^{10}$ and $R^{11}$ are bonded together to form a ring.

Preferably, $R^4$, $R^5$ and $R^6$ are each independently a group selected from H and unsubstituted or substituted $C_{1-3}$-alkyl, and not all $R^4$, $R^5$ and $R^6$ are H, optionally wherein two or more of $R^4$, $R^5$ and $R^6$ are bonded together to form a ring. Often, at least one of $R^4$, $R^5$ and $R_6$ is H.

Preferably, each $R^7$ is independently a group selected from H and unsubstituted or substituted $C_{1-3}$-alkyl, optionally wherein two or more $R^7$ groups are bonded together to form a ring.

Preferably, $R^8$ is a group selected from H and unsubstituted or substituted $C_{1-3}$-alkyl. $R^8$ is often H.

Preferably, $R^9$, $R^{10}$ and $R^{11}$ are each independently a group selected from H and unsubstituted or substituted $C_{1-3}$-alkyl, optionally wherein two or more of $R^9$, $R^{10}$ and $R^{11}$ are bonded together to form a ring.

More preferably, $R^4$, $R^5$ and $R^6$ are each independently a group selected from H and unsubstituted methyl or ethyl, and not all $R^4$, $R^5$ and $R_6$ are H, optionally wherein two or more of $R^9$, $R^{10}$ and $R^{11}$ are bonded together to form a ring. Often, at least one of $R^4$, $R^5$ and $R^6$ is H.

More preferably, each $R^7$ is independently a group selected from H and unsubstituted methyl or ethyl, optionally wherein two or more of $R^9$, $R^{10}$ and $R^{11}$ are bonded together to form a ring.

More preferably, $R^8$ is a group selected from H and unsubstituted or substituted methyl or ethyl.

More preferably, $R^9$ and $R^{10}$ are each independently a group selected from H and unsubstituted methyl or ethyl, optionally wherein two or more of $R^9$ and $R^{10}$ are bonded together to form a ring, and Ru is H or unsubstituted methyl.

For instance, the passivating agent of the first aspect is often a compound of formula

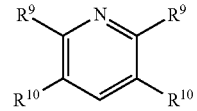

wherein $R^9$ and $R^{10}$ are each independently a group selected from H and substituted or unsubstituted methyl or ethyl, optionally wherein two or more of $R^9$ and $R^{10}$ are bonded together to form a ring. For instance, $R^9$ and $R^{10}$ may be each independently a group selected from H and unsubstituted methyl or ethyl. Typically, $R^9$ and $R^{10}$ are each independently a group selected from H and unsubstituted methyl. Often, each $R^{10}$ is H.

In one embodiment, the passivating compound is a hetrocyclic or heteroaryl compound comprising one or more nitrogen atoms. Examples of hetrocyclic compounds comprising one or more N atoms include aziridine, azetidine, pyrrolidine, piperidine, azepane, morpholine, thiomorpholine, 2H-pyrrole, 2-pyrroline, 3-pyrroline, 2-imidazoline, imidazolidine, 2-pyrazoline, pyrazolidine, 3H-indole, indoline and quinuclidine. Examples of heteroaryl compound comprising one or more N atoms include pyrrole, oxazole, thiazole, imidazole, pyrazole, isoxazole, isothiazole, pyridine, pyridazine, pyrimidine, pyrazine, 1,3,5-triazine, indole, isoindole, benzimidazole, purine, quinoline, isoquinoline, carbazole, acridine and phenazine. Of these pyrrolidine, piperidine, morpholine, 2H-pyrrole, 2-pyrroline, 3-pyrroline, pyrrole and pyridine are preferred.

If the passivating agent is a heterocyclic or heteroaryl compound comprising one or more N atoms, it may be substituted or unsubstituted. For instance, it may be substituted with one or more substituted or unsubstituted $C_{1-6}$ alkyl groups. Often, the hetrocyclic or heteroaryl passivating agent is substituted with at most 2 unsubstituted $C_{1-3}$ alkyl groups.

A substituted or unsubstituted imine may be a compound of formula $R_2C=NR$, wherein each R is independently selected from H and substituted or unsubstituted $C_{1-18}$ alkyl (for instance $C_{1-6}$ alkyl) or substituted or unsubstituted aryl, optionally wherein the two R groups are bonded together to form a ring.

Often, the passivating agent of the first aspect is a substituted or unsubstituted pyridine. Thus, the passivating agent may be selected from pyridine, 2-methylpyrindine, 3-methylpyridine, 2,6-dimethylpyridine, 2,5-dimethylpyridine, 2-ethylpyrindine, 3-ethylpyridine, 2,6-diethylpyridine, 2,5-diethylpyridine, quinoline and acridine.

Substituted or unsubstituted pyrrolidines includes compounds of formula

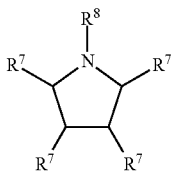

wherein each $R^7$ is independently a group selected from H and unsubstituted or substituted $C_{1-6}$-alkyl, optionally wherein two or more $R^7$ groups are bonded together to form a ring, and $R^8$ is a group selected from H and unsubstituted or substituted $C_{1-6}$-alkyl.

Preferably, each $R^7$ is independently a group selected from H and unsubstituted or substituted $C_{1-3}$-alkyl, optionally wherein two or more $R^7$ groups are bonded together to form a ring, and $R^8$ is a group selected from H and unsubstituted or substituted $C_{1-3}$-alkyl. $R^8$ is often H.

Substituted or unsubstituted pyrroles include compounds of formula

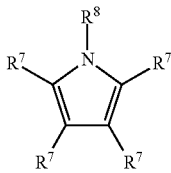

wherein each $R^7$ is independently a group selected from H and unsubstituted or substituted $C_{1-6}$-alkyl, optionally wherein two or more $R^7$ groups are bonded together to form a ring, and $R^8$ is a group selected from H and unsubstituted or substituted $C_{1-6}$-alkyl.

Preferably, each $R^7$ is independently a group selected from H and unsubstituted or substituted $C_{1-3}$-alkyl, optionally wherein two or more $R^7$ groups are bonded together to form a ring, and $R^8$ is a group selected from H and unsubstituted or substituted $C_{1-3}$-alkyl. $R^8$ is often H.

The passivating agent of the first aspect may be an organic compound comprising one or more P atoms. Thus, the passivating compound may be a substituted or unsubstituted phosphine. Examples of substituted or unsubstituted phosphines include compounds of formula $PR_3$, wherein each R is independently a group selected H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl, and not all R groups are H, optionally wherein two or more of the R groups are bonded together to form a ring. Typically, each R is independently a group selected from unsubstituted or substituted $C_{1-6}$-alkyl, unsubstituted or substituted $C_{3-6}$-cycloalkyl and unsubstituted or substituted aryl, optionally wherein two or more of the R groups are bonded together to form a ring. Thus, the passivating agent may be a triaryl phosphine, a diaryl alkyl phosphine, an aryl dialkyl phosphine or a trialkyl phosphine. Preferably, each R is independently a group selected from unsubstituted $C_{1-6}$-alkyl and unsubstituted or substituted aryl. For instance, the passivating agent may be triphenylphosphine, trimethylphosphine or tricyclohexylphosphine.

Preferably, the passivating agent of the first aspect is an organic compound comprising one or more P or N atom selected from substituted and unsubstituted pyridine, substituted and unsubstituted pyrrole, substituted and unsubstituted primary amines, substituted and unsubstituted secondary amines, substituted and unsubstituted tertiary amines, and substituted and unsubstituted phosphines.

More preferably, the passivating agent of the first aspect is an organic compound comprising one or more P or N atom which is a substituted and unsubstituted pyridine.

Most preferably, the passivating agent of the first aspect is pyridine (i.e. unsubstituted pyridine $C_5H_5N$).

In some instances, the passivating compound of the first aspect is not 4-alkylpyridine, where alkyl is an alkyl group comprising 4 or more carbon atoms. For instance, the passivating compound is often not 4-tertbutylpyridine. The presence of bulky groups on the passivating agent may introduce steric effects.

As described above, in the second aspect the passivating agent which is an organic compound is typically an organic compound comprising non-polar organic molecules. The molecules of the passivating agent do not chemically bond to anions or cations in the metal halide perovskite, but are disposed at/within the grain boundaries and act to block interaction between anions and cations in adjacent grains of the metal halide perovskite. The passivating agent may be a non-polar organic compound such as a polycyclic aromatic hydrocarbon. By way of example, the passivating agent may comprise any of napthelene, anthracene, phenanthrene, pyrene, and fluoranthene.

Metal Halide Perovskites

As mentioned above, in the first and second aspects of the invention the device may comprise a semiconductor, which semiconductor comprises: (a) a crystalline ionic solid; and (b) a passivating agent which is an organic compound. The device may for instance comprise a semiconductor, which semiconductor comprises: (a) a crystalline ionic solid; and (b) a passivating agent which is an organic compound; wherein molecules of the passivating agent are chemically bonded to anions or cations in the crystalline ionic compound. When the semiconductor comprises a crystalline ionic solid, the crystalline ionic solid typically comprises a metal oxide selected from $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, and CdO. In particular, the metal oxide may be $TiO_2$. The crystalline ionic solid may comprise a semiconducting metal halide or a semiconducting compound comprising copper. For instance, the crystalline ionic solid may comprise CuI, CuBr, CuSCN, $Cu_2O$, CuO or CIS. Usually, however, the ionic compound is a metal halide perovskite, as described hereinbelow.

Thus, the perovskite in the device of the invention is a metal halide perovskite. The formula of the metal halide perovskite comprises at least one metal and at least one halide. The perovskite comprises a first cation, a second cation and at least one halide anion, wherein at least one of the first and second cations comprises a metal cation. The perovskite may contain further cations and anions. The perovskite may be a layered perovskite.

Metal halide perovskites are described in WO 2013/171517, WO 2013/171518, and WO 2013/171520, the entire contents of which are incorporated herein by reference. Any of the metal halide perovskites described in any of WO 2013/171517, WO 2013/171518, and WO 2013/171520 may be used in the present invention.

The first cation may be any cation, but is often a metal cation or an organic cation. If the first cation is a metal cation, it may be a monovalent or a divalent metal cation. The first cation may be selected from $Li^+$, $Na^+$, $K^+$, $Rb^+$, and $Cs^+$. The first cation is typically an organic cation. If the first cation is an organic cation it may be any organic cation described below.

The second cation is typically a metal cation. The second cation may be any metal cation. The second cation may be a divalent metal cation. The second cation may be a divalent metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$.

Usually the at least one halide anion is selected from fluoride, chloride, bromide and iodide, for instance chloride, bromide and iodide.

The metal halide perovskite may be an organometal halide perovskite. Thus, the metal halide perovskite is typically a perovskite of the formula (I):

$$[A][B][X]_3 \quad (I)$$

wherein:

[A] is at least one organic cation;

[B] is at least one metal cation, wherein [B] comprises at least one of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$; and

[X] is at least one halide anion.

The perovskite thus typically comprises an organic cation, a metal cation and at least halide anion. The metal halide perovskite may be a perovskite of the formula $[A][B][X]_3$ wherein:

[A] is at least one organic cation; [B] is at least one metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^2$, $Pb^{2+}$, $Sn^{2+}$, $Yb^{2+}$ and $Eu^{2+}$; and [X] is at least one halide anion.

[B] often comprises at least one of $Sn^{2+}$, $Pb^{2+}$, $Cu^{2+}$, $Ge^{2+}$ and $Ni^{2+}$. The metal cation may be selected from $Sn^{2+}$, $Pb^{2+}$, $Cu^{2+}$, $Ge^{2+}$ and $Ni^{2+}$. The metal cation may be selected from $Sn^{2+}$ and $Pb^{2+}$.

The organic cation may be any organic cation, i.e. a cation which comprises at least one carbon atom and optionally at least one hydrogen atom. The organic cation often has the formula $(R^5R^6R^7R^8N)^+$, wherein: $R^5$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; $R^6$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; $R^7$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; and $R^8$ is a group selected from H, unsubstituted or substituted $C_{1-18}$-alkyl, unsubstituted or substituted $C_{3-10}$-cycloal-kyl, unsubstituted or substituted $C_{2-18}$-alkenyl, unsubstituted or substituted $C_{2-18}$-alkynyl, and unsubstituted or substituted aryl.

The organic cation may have the formula $(R^5R^6R^7R^8N)^+$, wherein: $R^5$ is a group selected from H, unsubstituted $C_{1-18}$-alkyl, and unsubstituted aryl; $R^6$ is a group selected from H, unsubstituted $C_{1-18}$-alkyl, and unsubstituted aryl; $R^7$ is a group selected from H, unsubstituted $C_{1-18}$-alkyl, and unsubstituted aryl; and $R^8$ is a group selected from H, unsubstituted $C_{1-18}$-alkyl, and unsubstituted aryl.

For instance, the organic cation may have the formula $(R^9NH_3)^+$, wherein: $R^9$ is hydrogen, or unsubstituted or substituted $C_{1-18}$-alkyl. For instance, $R^9$ may be methyl or ethyl. Typically, $R^9$ is methyl.

The organic cation may have the formula $(R^5R^6N=CH-NR^7R^8)^+$, wherein: $R^5$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; $R^6$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; $R^7$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl; and $R^8$ is a group selected from H, unsubstituted or substituted $C_{1-18}$-alkyl, unsubstituted or substituted $C_{3-10}$-cycloalkyl, unsubstituted or substituted $C_{2-18}$-alkenyl, unsubstituted or substituted $C_{2-18}$-alkynyl, and unsubstituted or substituted aryl.

The organic cation may have the formula $(R^5R^6N=CH-NR^7R^8)^+$, wherein: $R^5$ is a group selected from H, unsubstituted $C_{1-18}$-alkyl, and unsubstituted aryl; $R^6$ is a group selected from H, unsubstituted $C_{1-18}$-alkyl, and unsubstituted aryl; $R^7$ is a group selected from H, unsubstituted $C_{1-18}$-alkyl, and unsubstituted aryl; and $R^8$ is a group selected from H, unsubstituted $C_{1-18}$-alkyl, and unsubstituted aryl.

Typically, $R^5$ in the cation $(R^5R^6N=CH-NR^7R^8)^+$ is hydrogen, methyl or ethyl, $R^6$ is hydrogen, methyl or ethyl, $R^7$ is hydrogen, methyl or ethyl, and $R^8$ is hydrogen, methyl or ethyl. For instance $R^5$ may be hydrogen or methyl, $R^6$ may be hydrogen or methyl, $R^7$ may be hydrogen or methyl, and $R^8$ may be hydrogen or methyl. The organic cation may, for example, have the formula $(H_2N=CH-NH_2)^+$.

The perovskite may be a mixed-halide perovskite, wherein the at least one halide anion may be two or more different halide anions. They may be two or three halide anions, or more typically, two different halide anions. Usually the halide anions are selected from fluoride, chloride, bromide and iodide, for instance chloride, bromide and iodide.

The perovskite of formula (I) may comprise one, two, three or four different metal cations, typically one or two different metal cations. Also, the perovskite of the formula (I), may, for instance, comprise one, two, three or four different organic cations, typically one or two different organic cations. Likewise, the perovskite of formula (I), may, comprise one two, three or four different anions, typically two or three different anions.

The organic and metal cations in the perovskite compound of formula (I) may be as further defined hereinbefore. Thus the organic cations may be selected from cations of formula $(R^5R^6R^7R^8N)^+$, cations of formula $(R^9NH_3)^+$, and cations of formula $(R^5R^6N=CH-NR^7R^8)^+$ as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. The metal cation may be selected from $Sn^{2+}$, $Pb^{2+}$, $Cu^{2+}$, $Ge^{2+}$ and $Ni^{2+}$. The metal cation may be $Sn^{2+}$ or $Pb^{2+}$.

In one embodiment, the perovskite is a perovskite compound of the formula (IA):

$$AB[X]_3 \qquad (IA)$$

wherein: A is an organic cation; B is a metal cation; and [X] is two or more different halide anions. Preferably, [X] is two or three different halide anions. More preferably, [X] is two different halide anions. The organic cation and metal cation may be as defined above.

The metal halide perovskite is a perovskite compound of formula (II):

$$ABX_{3-x}X'_x \qquad (II)$$

wherein: A is an organic cation; B is a metal cation; X is a first halide anion; X' is a second halide anion which is different from the first halide anion; and x is from 0 to 3. Usually, x is from 0.05 to 0.95. For instance, x may be from 0.5 to 2.5, or from 0.75 to 2.25. Typically, x is from 1 to 2.

Again, in formula (II), the organic and metal cations may be as further defined hereinbefore. Thus the organic cations may be selected from cations of formula $(R^5R^6R^7R^8N)^+$, cations of formula $(R^9NH_3)^+$, and cations of formula $(R^5R^6N=CH-NR^7R^8)^+$ as defined above. The metal cations may be selected from divalent metal cations. For instance, the metal cations may be selected from $Ca^{2+}$, $Sr^{2+}$, $Cd^{2+}$, $Cu_2+$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. The metal cation may be selected from $Sn^{2+}$, $Pb^{2+}$, $Cu^{2+}$, $Ge^{2+}$ and $Ni^{2+}$. The metal cation may be $Sn^{2+}$ or $Pb^{2+}$.

The metal halide perovskite may be a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, where x is from 0 to 3. x may be from 0.05 to 2.96. For instance, x may be from 0.1 to 2.9, or from 0.5 to 2.5. In some cases, x is from 0.75 to 2.25, or from 1 to 2.

The metal halide perovskite may be a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

The metal halide perovskite may be a perovskite compound selected from $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, where x is from 0.05 to 2.95. For instance, x may be from 0.5 to 2.5, from 0.75 to 2.25, or from 1 to 2.

The perovskites may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

The perovskite may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$.

The perovskite may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$.

The perovskite may be selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$. The perovskite may be $CH_3NH_3PbCl_2I$.

As mentioned above, passivation as described herein may be used to stabilize some organometal perovskites. Thus, the metal halide perovskite may be any metal halide perovskite described herein, wherein the metal cation is $Ge^{2+}$ or $Cu^{+2}$. For instance, the metal halide perovskite may be selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}$, $Cl_xCH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$ and $CH_3NH_3CuF_{3-x}Cl_x$, $Cl_xCH_3NH_3GeI_3$, $CH_3NH_3GeBr_3$, $CH_3NH_3GeCl_3$, $CH_3NH_3GeF_3$, $CH_3NH_3GeBrI_2$, $CH_3NH_3GeBr_xI_{3-x}$, $CH_3NH_3GeBr_xCl_{3-x}$, $CH_3NH_3GeF_{3-x}Br_x$, $CH_3NH_3GeI_xBr_{3-x}$, $CH_3NH_3GeI_xCl_{3-x}$, $CH_3NH_3GeF_{3-x}I_x$, $CH_3NH_3GeCl_xBr_{3-x}$, $CH_3NH_3GeI_{3-x}Cl_x$ and $CH_3NH_3GeF_{3-x}Cl_x$ where x is from 0 to 3. x may be from 0.05 to 2.96. For instance, x may be from 0.1 to 2.9, or from 0.5 to 2.5. In some cases, x is from 0.75 to 2.25, or from 1 to 2.

The perovskite employed in the devices of the invention may comprise a mixed-halide perovskite and a single-halide perovskite, for instance in a blend, wherein said single-halide perovskite comprises a first cation, a second cation and a halide anion; wherein the first and second cations are as hereinbefore defined. For instance, the optoelectronic device may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

Alternatively, semiconductor employed in the device of the invention may comprise more than one metal halide perovskite, wherein each perovskite is a mixed-halide perovskite, and wherein said mixed-halide perovskite is as herein defined. For instance, the semiconductor may comprise two or three said perovskites. The semiconductor may, for instance, comprise two perovskites wherein both perovskites are mixed-anion perovskites. For instance, the optoelectronic device may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

When [B] is a single metal cation which is $Pb^{2+}$, one of said two or more different halide anions may be iodide or fluoride; and when [B] is a single metal cation which is $Sn^{2+}$ one of said two or more different halide anions may be fluoride. One of said two or more different halide anions may be iodide or fluoride. One of said two or more different halide anions may be iodide and another of said two or more different halide anions may be fluoride or chloride. One of said two or more different halide anions may be fluoride. One of said two or more different anions may be fluoride and another of said two or more different anions may be chloride, bromide or iodide. One of said two or more different anions may be iodide and another of said two or more different anions may be fluoride or chloride. [X] may be two different halide anions X and $X^+$. Said divalent metal cation may be $Sn^{2+}$. Said divalent metal cation may be $Pb^{2+}$.

The metal halide perovskite may be doped. For instance, the metal halide perovskite may be doped by the introduction of an impurity atom. For instance, the metal halide perovskite could be doped with a metal impurity of a different charge from the other metals in the perovskite. Thus, the perovskite could further comprise metal dopant selected from metals with an oxidation state of IV, III or I, for instance bismuth (III), antimony (III), tin (IV) or thallium (I).

The metal halide perovskite employed in the device of the invention preferably has a band gap which is narrow enough to allow the excitation of electrons by incident light. A band gap of 3.0 eV or less is particularly preferred, especially when the device is a photovoltaic device, because such a band gap is low enough for sunlight to excite electrons across it.

Accordingly, the metal halide perovskite employed in device of the invention typically has a band gap of equal to or less than 3.0 eV. In some embodiments, the band gap of the perovskite is less than or equal to 2.8 eV, for instance equal to or less than 2.5 eV. The band gap may for instance be less than or equal to 2.3 eV, or for instance less than or equal to 2.0 eV.

Usually, the band gap is at least 0.5 eV. Thus, the band gap of the perovskite may be from 0.5 eV to 2.8 eV. In some embodiments it is from 0.5 eV to 2.5 eV, or for example from 0.5 eV to 2.3 eV. The band gap of the perovskite may for instance be from 0.5 eV to 2.0 eV. In other embodiments, the band gap of the perovskite may be from 1.0 eV to 3.0 eV, or for instance from 1.0 eV to 2.8 eV. In some embodiments it is from 1.0 eV to 2.5 eV, or for example from 1.0 eV to 2.3 eV. The band gap of the metal perovskite may for instance be from 1.0 eV to 2.0 eV.

The metal halide perovskite may have a band gap of less than or equal to 3.0 eV. The metal halide perovskite may have a band gap of less than or equal to 2.0 eV.

Device

The invention also provides a device comprising a semiconductor, which semiconductor comprises: (a) a metal halide perovskite; and (b) a passivating agent which is (i) a halogen bond donor compound, or (ii) an organic compound comprising at least one thiol or sulfide group.

This device may be as further defined anywhere hereinbefore. The passivating agent may be as defined hereinbefore, and/or the metal halide perovskite may be as defined hereinbefore.

Layers of Passivated Perovskite

In many devices according to the invention, the passivated perovskite will be in the form of a layer. Thus, in one embodiment, the device comprises a layer of said semiconductor. The device may comprise a layer of the metal halide perovskite. The layer of the semiconductor comprises the passivating agent and the metal halide perovskite.

According to the first aspect, the device will comprise: (a) a layer of a metal halide perovskite; and (b) a passivating agent which is an organic compound; wherein molecules of the passivating agent are chemically bonded to anions or cations in the metal halide perovskite. Molecules of the passivating agent will typically be bonded to anions or cations in the mixed halide by supramolecular chemical bonds, as described above.

According to the second aspect, the device will comprise: (a) a layer of a metal halide perovskite; and (b) a passivating agent which is an organic compound; wherein molecules of the passivating agent are disposed at grain boundaries within the metal halide perovskite and are not chemically bonded to anions or cations in the metal halide perovskite. Molecules of the passivating agent block interaction between anions and cations in adjacent grains of the metal halide perovskite at the grain boundaries.

The devices may comprise a layer of the semiconductor, wherein the layer of the semiconductor is without open porosity. The layer of the semiconductor may comprise a layer of the metal halide perovskite, which layer of the metal halide perovskite is without open porosity. Alternatively, the layer of the semiconductor may be porous, or the layer of the semiconductor may be deposited on a porous scaffold. Non-porous layers of the semiconductor may be used in devices which require a planar heterojunction between the perovskite and any other materials in the device, for instance n- or p-type regions. Porous layers of the semiconductor, or layers of the semiconductor deposited on a porous scaffold, may be used in devices which require large surface areas or a bulk heterojunction, for instance perovskite sensitized devices (such as those described in WO 2013/171518 and WO 2013/171520).

If the layer of the semiconductor is without open porosity, it may be a "capping layer", which is a layer of the semiconductor which is disposed on a first layer which comprises a scaffold material and the metal halide perovskite. In this case, the capping layer is not infiltrated by the scaffold material, because the capping layer and the perovskite semiconductor within the capping layer are without open porosity. The metal perovskite in the first layer, on the other hand (which is generally the same perovskite compound as the perovskite compound in the capping layer), is typically disposed in pores of the scaffold material and may therefore be said to be "infiltrated" by the scaffold material.

The scaffold material referred to herein may be a dielectric scaffold material or an n-type scaffold material. A dielectric scaffold material may comprise a material having a band gap greater than or equal to 3.6 eV, or greater than or equal to 4 eV. A dielectric scaffold material may be selected from a dielectric oxide. A dielectric scaffold may be selected from alumina and silica, for instance alumina ($Al_2O_3$). An n-type scaffold may be selected from any n-type material described herein, for instance titania ($TiO_2$).

In some embodiments of the optoelectronic devices of the present invention, the layer of the semiconductor without open porosity is non-porous.

Generally, a layer of the semiconductor without open porosity may consist essentially of the perovskite and the passivating agent. A perovskite is a crystalline compound. Thus, the layer of the semiconductor without open porosity may consist essentially of crystallites/grains of the perovskite together with the passivating agent. The layer of the semiconductor without open porosity may consist of a layer of the metal halide perovskite without open porosity and the passivating agent. Thus, a layer of the semiconductor without open porosity may consist of crystallites of the perovskite and the passivating agent.

The device of the invention may be a thin film device.

Usually, the thickness of the layer of the metal halide perovskite or the semiconductor is from 10 nm to 100 µm. The thickness of the layer of the semiconductor may be from 10 nm to 10 µm. Preferably, the thickness of the layer of the semiconductor is from 50 nm to 1000 nm, for instance from 100 nm to 2000 nm, from 100 nm to 1000 nm, or from 100 nm to 700 nm. The thickness of the layer of the semiconductor is often greater than 100 nm. The thickness may, for example, be from 100 nm to 100 µm, or for instance from 100 nm to 700 nm. These thicknesses may apply to the layer of the semiconductor when the device comprises a layer of the semiconductor without open porosity. For instance, the device may comprise a layer of the semiconductor, which layer is without open porosity and has a thickness of from 50 nm to 1000 nm, or of greater than or equal to 100 nm.

Device Structure

The devices according to the invention may comprise:
(a) an n-type region comprising at least one n-type layer;
(b) a p-type region comprising at least one p-type layer; and, disposed between the n-type region and the p-type region:
(c) a layer of the semiconductor.

The devices may comprise: (a) an n-type region comprising at least one n-type layer; (b) a p-type region comprising at least one p-type layer; and, disposed between the n-type region and the p-type region: (c) a layer of the semiconductor comprising the metal halide perovskite and the passivating agent; wherein the layer of a semiconductor comprises a layer of the metal halide perovskite as defined anywhere hereinbefore. The metal halide perovskite may be defined as anywhere hereinbefore. The passivating agent may be as defined anywhere hereinbefore.

Optoelectronic devices comprising metal halide perovskites are described in WO 2013/171517, WO 2013/171518, and WO 2013/171520, the contents of which are incorporated by reference herein in their entirety. The device according to the present invention may have a structure as described in any of WO 2013/171517, WO 2013/171518, and WO 2013/171520.

The layer of the semiconductor may comprise a layer of the metal halide perovskite, which layer of metal halide perovskite is without open porosity. The layer of the semiconductor may be without open porosity. In this case, the layer of the semiconductor is not therefore infiltrated by the, or any of the, n-type material(s) in the n-type region, and likewise it is not infiltrated by the, or any of the, p-type material(s) in the p-type region. Rather, the layer of the semiconductor without open porosity typically forms a planar heterojunction with the n-type or the p-type region, or in some cases it forms planar a heterojunction with both the n-type region and the p-type region. When the layer of the semiconductor forms a planar heterojunction with the n-type region and/or p-type region, the passivating agent may be present at the heterojunction. As the passivating agent may form a monolayer on a surface of the perovskite, this monolayer may lie along the heterojunction. In addition, when the layer of the semiconductor forms a planar heterojunction with the n-type region and/or p-type region, the passivating agent may be present at grain boundaries within the perovskite.

The layer of a semiconductor comprising the metal halide perovskite and the passivating agent may comprise a porous layer of the metal halide perovskite. Thus, the layer of the semiconductor may be porous. The layer of a semiconductor comprising the metal halide perovskite and the passivating agent may comprise a layer of the metal halide perovskite disposed on a porous scaffold.

The n-type region in the devices may comprise one or more n-type layers. Often, the n-type region is an n-type layer, i.e. a single n-type layer. An n-type layer is a layer of an electron-transporting (i.e. an n-type) material. The n-type material may be a single n-type compound or elemental material, or a mixture of two or more n-type compounds or elemental materials, which may be undoped or doped with one or more dopant elements. The n-type layer employed in the device may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. More typically, the n-type material is selected from a metal oxide, a metal sulphide, a metal selenide, and a metal telluride. The n-type layer may comprise an inorganic material selected from oxide of titanium, tin, zinc, niobium, tantalum, tungsten, indium, gallium, neodinium, palladium, or cadmium, or an oxide of a mixture of two or more of said metals. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Other suitable n-type materials that may be employed include sulphides of cadmium, tin, copper, or zinc, including sulphides of a mixture of two or more of said metals. For instance, the sulphide may be $FeS_2$, $CdS$, $ZnS$ or $Cu_2ZnSnS_4$. The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be $CdTe$. The n-type layer may for instance comprise an inorganic material selected from oxide of titanium, tin, zinc, niobium, tantalum, tungsten, indium, gallium, neodinium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide). Typically, the n-type layer comprises $TiO_2$. When the n-type layer is an inorganic material, for instance $TiO_2$ or any of the other materials listed above, it may be a compact layer of said inorganic material. Preferably the n-type layer is a compact layer of $TiO_2$.

The p-type region in the devices may comprise one or more p-type layers. Often, the p-type region is a p-type layer, i.e. a single p-type layer. A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements. The p-type layer may comprise an inorganic or an organic p-type material. Suitable p-type materials may be selected from polymeric or molecular hole transporters.

The p-type layer employed may, for instance, comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl [4,4-bis(2-ethylhexyl)-4H-cyclopenta[2,1-b:3,4-b'] dithiophene-2,6-diyl]]), or PVK (poly(N-vinylcarbazole)). Usually, the p-type material is selected from spiro-OMeTAD, P3HT, PCPDTBT and PVK. Preferably, the p-type layer comprises spiro-OMeTAD. Suitable p-type materials also include molecular hole transporters, polymeric hole transporters and copolymer hole transporters. The p-type material may, for instance, be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Suitable p-type materials also include m-MTDATA (4,4',4"-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N,N'-diphenyl]-1,1'-biphenyl)-4,4'-diamine), α-NPB (N,N'-di(naphthalen-1-yl)-N,N'-diphenyl-benzidine), TNATA (4,4',4"-tris-(N-(naphthylen-2-yl)-N-phenylamine)triphenylamine), BPAPF (9,9-bis[4-(N,N-bis-biphenyl-4-yl-amino)phenyl]-9H-fluorene), spiro-NPB (N2, N7-Di-1-naphthalenyl-N2,N7-diphenyl-9,9'-spirobi[9H-fluorene]-2,7-diamine), 4P-TPD (4,4'-bis-(N,N-diphenylamino)-tetraphenyl), PEDOT:PSS and spiro-OMeTAD. The p-type layer may be doped with an ionic salt or a base. The p-type layer may for instance be doped with an ionic salt selected from HMI-TFSI (1-hexyl-3-methylimidazolium bis (trifluoromethylsulfonyl)imide) and Li-TFSI (lithium bis (trifluoromethanesulfonyl)imide), or with a base which is tBP (tert-butylpyridine). Additionally or alternatively, the p-type layer may be doped to increase the hole-density. The p-type layer may for instance be doped with $NOBF_4$ (Nitrosonium tetrafluoroborate), to increase the hole-density. The p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter. The p-type layer may for instance comprise an inorganic hole transporter comprising an oxide of nickel, vanadium, copper or molybdenum; CuI, CuBr, CuSCN, $Cu_2O$, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, $Cu_2$, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises $TiO_2$. Typically, in that embodiment, the n-type layer which comprises $TiO_2$ is a compact layer of $TiO_2$.

Types of Devices

A device of the present invention may be any device comprising a metal halide perovskite and a passivating agent which is an organic compound. For instance, the device may be an optoelectronic device, e.g. a photovoltaic device; a transistor; or a diode.

Generally, a device of the present invention is a semiconductor device, or a semiconducting device. The terms "semiconductor device" and "semiconducting device", as used herein, are interchangeable, and refer to a device, a functional component of which comprises a semiconductor.

A device of the present invention may for instance be an optoelectronic device. The optoelectronic device may be selected from a photovoltaic device; a photo resistor; a light-sensitive detector; solid-state triode; a battery electrode; a light emitting device; a light emitting diode; a transistor; a solar cell; a laser; or a diode injection laser. Typically, the optoelectronic device is a photovoltaic device.

When a device of the invention is a photovoltaic device, the photovoltaic device may be selected from a photodiode, a solar cell, a photodetector, and a photosensor. The photovoltaic device is typically a solar cell. When the device is a photovoltaic device, the photovoltaic device may have the structure described above, i.e. it may comprise (a) an n-type region comprising at least one n-type layer; (b) a p-type region comprising at least one p-type layer; and, disposed between the n-type region and the p-type region: (c) a layer of a semiconductor comprising the metal halide perovskite and the passivating agent. In a photovoltaic device according to the invention, the semiconductor as described herein is typically the main light-absorbing semiconductor.

The optoelectronic device may alternatively be an optoelectronic device other than a photovoltaic device. The optoelectronic device may for instance be selected from a light emitting device, a light emitting diode, a laser, and a transistor. The optoelectronic device may be selected from a light emitting device, a light emitting diode, an optically pumped laser, an electrical injection laser, and a transistor.

In one embodiment, the device is a light emitting device. It may for instance be a light emitting diode, or a charge injection laser diode.

In another embodiment, the device is a transistor.

Usually, however, the device is a photovoltaic device.

Process for Producing a Device

In accordance with the first aspect, the invention provides a process for producing a device comprising a semiconductor, which semiconductor comprises:

(a) a metal halide perovskite; and
(b) a passivating agent which is an organic compound;
wherein molecules of the passivating agent are chemically bonded to anions or cations in the metal halide perovskite, wherein the process comprises treating a metal halide perovskite with a passivating agent, which passivating agent is an organic compound and is suitable for chemically bonding to anions or cations in the metal halide perovskite.

In accordance with the second aspect, the invention provides a process for producing a device comprising a semiconductor, which semiconductor comprises:
- (a) a metal halide perovskite; and
- (b) a passivating agent which is an organic compound;

wherein molecules of the passivating agent are disposed at grain boundaries within the metal halide perovskite and are not chemically bonded to anions or cations in the metal halide perovskite;

wherein the process comprises treating a metal halide perovskite with a passivating agent, which passivating agent is an organic compound that does not chemically bond to anions or cations in the metal halide perovskite. As mentioned above for the device according to the invention, while the invention is typically applied to metal halide perovskites, the skilled person will understand that it may be applied to crystalline ionic solids in general, for instance metal halides and metal oxides.

Thus, in accordance with the first aspect, the invention also provides a process for producing a device comprising a semiconductor, which semiconductor comprises:
- (a) a crystalline ionic solid; and
- (b) a passivating agent which is an organic compound;

wherein molecules of the passivating agent are chemically bonded to anions or cations in the crystalline ionic solid, wherein the process comprises treating a crystalline ionic solid with a passivating agent, which passivating agent is an organic compound and is suitable for chemically bonding to anions or cations in the crystalline ionic solid.

Similarly, in accordance with the second aspect, the invention also provides a process for producing a device comprising a semiconductor, which semiconductor comprises:
- (a) a crystalline ionic solid; and
- (b) a passivating agent which is an organic compound;

wherein molecules of the passivating agent are disposed at grain boundaries within the metal halide perovskite and are not chemically bonded to anions or cations in the crystalline ionic solid;

wherein the process comprises treating a crystalline ionic solid with a passivating agent, which passivating agent is an organic compound that does not chemically bond to anions or cations in the crystalline ionic solid.

The crystalline ionic solid may be as defined anywhere herein for the device according to the invention.

In the process for producing a device according to either the first aspect of the invention or the second aspect of the invention, any of the components may be as described anywhere hereinbefore. The passivating agent may be as defined anywhere hereinbefore, and/or the metal halide perovskite may be as defined anywhere hereinbefore, and/or the device may be as defined anywhere hereinbefore. For instance, the metal halide perovskite may be a perovskite of formula $[A][B][X]_3$ wherein: [A] is at least one organic cation, for instance $(CH_3NH_3)^+$; [B] is at least one metal cation, wherein [B] comprises at least one of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$, preferably $Sn^{2+}$, $Pb^{2+}$, $Cu^{2+}$, $Ge^{2+}$ and $Ni^{2+}$; and [X] is at least one halide anion. Also, for instance, the passivating agent which is an organic compound may be selected from (a) a halogen bond donor compound, for instance IPFB, and (b) an organic compound comprising at least one thiol or sulfide group, for instance thiophene or tetrahydrothiophene. The passivating agents may be chemically bonded by supramolecular chemical bonds, for instance halogen bonds or metal-chalcogen bonds, such as metal-sulfur bonds. The semiconductor may be a layer as described anywhere above.

In the first aspect, the passivating agent is typically an organic compound which is suitable for chemically bonding to anions or cations in the metal halide perovskite by a supramolecular chemical bond such as a halogen bond or a metal-chalcogen bond. An organic compound is suitable for chemically bonding to anions or cations in the metal halide perovskite if it is energetically favourable for the compound to do so. The skilled person may easily assess whether an organic compound is suitable for chemically bonding to anions or cations in the metal halide perovskite. For instance, it could be observed whether the molecules adsorb to the perovskite surface. The structure of the organic compound is also indicative of its suitability for forming chemical bonds, such as supramolecular chemical bonds, with anions or cations in the perovskite. For instance, to form a halogen bond, the compound may contain a polarizable or polarized halogen atom. For instance, to form a metal-chalcogen bond, the compound may contain an available (i.e. non-sterically hindered) chalcogen atom, for instance a sulfide group. The passivating agent may be as described anywhere hereinbefore.

For instance, the passivating agent of the first aspect may be suitable for chemically bonding to anions or cations in the metal halide perovskite by a supramolecular chemical bond such as a nitrogen-metal bond or a phosphorus-metal bond. Passivating agents which are organic compounds comprising one or more N or P atoms are described above, for instance pyridine.

In the process for producing a device according to either the first aspect of the invention or the second aspect of the invention, the metal halide perovskite may be treated with the passivating agent by any suitable method. For instance, the passivating agent may be disposed on a surface of the metal halide perovskite, or the metal halide perovskite may be exposed to a vapour or composition comprising the passivating agent. For instance, a composition comprising the passivating agent may be spin-coated onto a surface of the metal halide perovskite. Treating the metal halide perovskite with the passivating agent may comprise impregnating the metal halide perovskite with the passivating agent. For instance, the metal halide perovskite may be impregnated with the passivating agent by immersing the metal halide perovskite in the passivating agent or a solution comprising the passivating agent. The metal halide perovskite may be immersed in a composition comprising the passivating agent.

Sometimes it may be preferable to treat a hot sample with the passivating agent. For instance, the metal halide perovskite may be heated at a temperature of from 50° C. to 100° C. before it is treated with the passivating agent.

Treating the metal halide perovskite with a passivating agent typically comprises disposing the passivating agent on a surface of the metal halide perovskite. Treating the metal halide perovskite with a passivating agent may comprise disposing on a surface of the metal halide perovskite at least one composition comprising the passivating agent. In this context, "disposing" includes any method by which the surface of the perovskite is brought into contact with the material which is disposed, for instance by submerging the metal halide perovskite in a composition. Often, the passivating agent is a liquid at ambient temperature (for instance 25° C.). The composition comprising the passivating agent may in some embodiments consist only of, or consist essentially of, the passivating agent, for instance, it may comprise greater than 95 wt % of the passivating agent. A composition comprising the passivating agent may comprise one more solvents and the passivating agent. The solvent may be selected from an organic solvent, for instance a non-polar solvent such as a hydrocarbon solvent, for instance pentane, cyclohexane or benzene.

Treating the metal halide perovskite with a passivating agent may also comprise adding the passivating agent to a solution of the metal halide perovskite before formation of the metal halide perovskite solid.

In the first aspect the passivating agent may be a halogen-bond donor compound. If the passivating agent is a halogen-bond donor compound, treating the metal halide perovskite may comprise immersing the metal halide perovskite in the passivating agent or a composition comprising the passivating agent. The metal halide perovskite may be immersed in a solution of the halogen bond donor compound for from 1 to 30 minutes, or from 1 to 10 minutes. The concentration of the composition comprising the passivating agent may be from 0.05 M to 2.0 M.

The passivating agent of the first aspect may be an organic compound comprising at least one thiol or sulfide group. When the passivating agent is an organic compound comprising at least one thiol or sulfide group, the metal halide perovskite is often treated by spin-coating the passivating agent on a surface of the metal halide perovskite. Spin coating may be carried out at from 1000 to 3000 rpm.

The passivating agent of the first aspect may be an organic compound comprising at least one heteroatom selected from N and P. When the passivating agent is an organic compound comprising one or more N or P atoms, the metal halide perovskite is often treated by spin-coating the passivating agent or a composition comprising the passivating agent and a solvent on a surface of the metal halide perovskite. Preferably, treating the metal halide perovskite with a passivating agent which is an organic compound comprising one or more N or P atoms comprises spin-coating a composition (for instance a solution) comprising the passivating agent and a solvent, wherein the amount of the passivating agent is from 5 to 50 vol % of the composition. The composition comprising the solvent and the passivating agent preferably comprises from 10 to 20 vol % of the passivating agent. The solvent may be any suitable solvent and is typically an organic solvent, for instance chlorobenzene, toluene or isopropanol.

Once the metal halide has been treated, it may be dried. For instance, the treated metal halide perovskite may be dried by heating, by leaving excess passivating agent to evaporate or by drying under a nitrogen flow. If the passivating agent is a halogen bond donor compound, the treated metal halide perovskite may be dried under a flow of nitrogen.

The metal halide perovskite may be treated with the passivating agent in air or in an inert atmosphere, for instance nitrogen.

The process for producing a device typically comprises: (a) providing a substrate having a layer comprising the metal halide perovskite disposed thereon; and (b) treating the layer comprising the metal halide perovskite with the passivating agent. The layer comprising the metal halide perovskite may be a layer of the metal halide perovskite.

The substrate having a layer comprising the metal halide disposed thereon may be prepared by providing a substrate and disposing a layer of perovskite thereon. The layer comprising the metal halide perovskite may be produced by solution deposition or vapour deposition. Producing a layer of metal halide perovskite by vapour deposition typically comprises: (i) exposing the substrate to vapour, which vapour comprises said metal halide perovskite or one or more reactants for producing said perovskite; and (ii) allowing deposition of the vapour onto the substrate, to produce a solid layer of said perovskite thereon. The perovskite in the vapour may be any of the metal halide perovskites discussed hereinbefore for the device of the invention, and is typically a perovskite of formula (I) as defined hereinbefore. If one or more reactants for producing the metal halide perovskite are used, the one or more reactants may comprise: (a) a first compound comprising (i) a metal cation and (ii) a first halide anion; with (b) a second compound comprising (i) an organic cation and (ii) a second halide anion. The first and second halide anions may be different halide anions. For instance, the first compound may be a metal halide, such as a lead dihalide, and the second compound may be a halide of the organic cation, for instance a methylammonium halide. For instance, when the metal halide perovskite being deposited is $CH_3NH_3PbI_2Cl$, the one or more reactants typically comprise (a) $PbI_2$, and (b) $CH_3NH_3Cl$.

The vapour deposition process generally further comprises producing the vapour in the first place by evaporating said perovskite or evaporating said one or more reactants for producing said perovskite. In this step the perovskite or the one or more reactants for producing the perovskite are typically transferred to an evaporation chamber which is subsequently evacuated. The perovskite or the one or more reactants for producing the perovskite are typically then heated. The resulting vapour is then exposed to and thereby deposited the first region, to produce a solid layer of said perovskite thereon. If reactants are used, these react together in situ to produce the perovskite on the first region. Typically, the vapour deposition is allowed to continue until the solid layer of perovskite has a desired thickness, for instance a thickness of from 10 nm to 100 μm, or more typically from 10 nm to 10 μm. Preferably, the vapour deposition is allowed to continue until the solid layer of perovskite has a thickness of from 50 nm to 1000 nm, for instance from 100 nm to 700 nm, or any of the thicknesses defined above for the device of the invention, for instance greater than or equal to 100 nm.

The step of disposing the layer of metal halide perovskite by vapour deposition usually further comprises: (iii) heating the solid layer of the perovskite thus produced. The step of heating the solid layer of the perovskite usually comprises heating the solid layer of the perovskite in an inert atmosphere. Typically, the temperature at which the solid layer of the perovskite is heated does not exceed 150° C. Thus, the solid layer of the perovskite may be heated at a temperature of from 30° C. to 150° C., and is preferably heated at a temperature of from 40° C. to 110° C. The solid layer of the perovskite may be heated at said temperature until it has the desired semiconducting properties. Usually, the solid layer of the perovskite is heated for at least 30 minutes, preferably for at least 1 hour.

The layer of the metal halide perovskite may be disposed by solution deposition. For instance, the layer of the metal halide may be disposed on the substrate by a process comprising: (i) disposing a precursor solution on the substrate, which precursor solution comprises said metal halide perovskite dissolved in a solvent; and (ii) removing the solvent to produce on the first region a solid layer of the perovskite. Usually, the steps of (i) disposing a precursor solution on the substrate, and (ii) removing the solvent, comprise spin coating or slot-dye-coating the precursor solution or solutions onto the substrate, to produce on the substrate layer of the perovskite. Typically, said coating is carried out in an inert atmosphere, for instance under nitrogen. The spin coating is often performed at a speed of from 1000 to 2000 rpm. The spin coating may for example be carried out for 30 seconds to 2 minutes. The precursor solution may comprise a solution of the metal halide perovskite, or it may comprise a solution of a first and a second compound as described above for the vapour deposition method.

The substrate having a layer comprising the metal halide disposed thereon may comprise several other layers. For instance, the substrate having a layer comprising the metal halide disposed thereon may comprise one or more layers selected from: a layer of a substrate material, a layer of an electrode material, an n-type layer, a p-type layer and a layer of a scaffold material. The substrate material may comprise a glass, a metal or a plastic, for instance polyethylene. The electrode material may be any suitable conductive material, for instance a metal or a transparent conducting oxide. Thus, the layer of an electrode material may comprise a metal, for instance, gold, silver, copper, or aluminium, or a transparent conducting oxide, for instance indium tin oxide (ITO) or fluorine-doped tin oxide (FTO).

The substrate having a layer of metal halide perovskite disposed thereon may comprise a first electrode material and at least one first region selected from an n-type region, a p-type region or an intrinsic region. Often, the substrate comprises a first electrode material and an n-type region. The substrate may comprise a first electrode material which is a transparent conducting oxide, for instance FTO or ITO. The substrate may comprise a n-type region which comprises an n-type layer as defined anywhere hereinbefore. For instance, the substrate may comprises a layer of a transparent conducting oxide and an n-type layer, for instance titania. The substrate may comprise a compact layer of $TiO_2$.

If the substrate comprises a layer of a first electrode material, the layer of the first electrode material may have a thickness of from 100 nm to 200 nm. If the substrate comprises an n-type layer, the n-type layer may have a thickness of from 50 nm to 500 nm.

Often, the substrate may comprise a porous layer of a scaffold material. The scaffold material may be as described anywhere herein. The substrate having a layer of a perovskite disposed thereon may comprise a porous layer of a scaffold material, wherein the porous layer of a scaffold material comprises an n-type semiconductor or a dielectric material. The scaffold material may be a dielectric material or an n-type material. For instance, the scaffold material may be selected from alumina ($Al_2O_3$) or titania ($TiO_2$). The porous layer of the scaffold material may have a thickness of from 5 nm to 500 nm, or from 100 nm to 300 nm.

The process for producing a device may alternatively comprises: (a) disposing a precursor solution on a substrate, which precursor solution comprises said metal halide perovskite and the passivating agent dissolved in a solvent; and (ii) removing the solvent to produce a solid layer of the passivated metal halide perovskite. This alternative process may be as described anywhere herein.

Often, after the metal halide perovskite has been treated with the passivating agent, the process for producing a device further comprises disposing on the layer comprising the metal halide perovskite: (c) at least one second region selected from an n-type region, a p-type region or an intrinsic region; and/or (d) a layer of a second electrode material; the process for producing a device may further comprise disposing on the layer comprising the metal halide perovskite: (c) at least one second region selected from an n-type region, a p-type region or an intrinsic region; and (d) a layer of a second electrode material.

The step (c) of disposing a second region selected from an n-type region, a p-type region or an intrinsic region on the layer of metal halide perovskite may be carried out by any suitable method. Often the second region is selected from an n-type region or a p-type region. If the first region comprises an n-type region, the second region is typically a p-type region. The n-type region may comprise an n-type layer as defined anywhere hereinbefore. The p-type region may comprise a p-type layer as defined anywhere hereinbefore. The intrinsic region may comprise any intrinsic semiconductor, for instance crystalline silicon.

The disposal of a p-type region or an n-type region on the layer of the metal halide perovskite may comprise depositing layer by spin coating or by slot-dye-coating the compound comprised in the layer or a precursor thereof, or by spray pyrolysis. For instance, a compact layer of titania may be produced by spin-coating a (mildly) acidic titanium-isopropoxide sol in a suitable solvent, such as ethanol. Such a sol can be prepared by mixing titanium isopropoxide and anhydrous ethanol with a solution of HCl in anhydrous ethanol. After spin-coating, the layer is typically dried at a temperature not exceeding 150° C. Optionally, the compact layer was subsequently heated to 500° C. for 30 minutes on a hotplate in air. Alternatively, such a compact layer may be produced by, spray pyrolysis deposition. This will typically comprise deposition of a solution comprising titanium diisopropoxide bis(acetylacetonate), usually at a temperature of from 200 to 300° C., often at a temperature of about 250° C. Usually the solution comprises titanium diisopropoxide bis (acetylacetonate) and ethanol, typically in a ratio of from 1:5 to 1:20, more typically in a ratio of about 1:10. Such methods can be applied to other p-type or n-type materials, to produce n-type and p-type layers in the devices of the invention.

Deposition of an organic, molecular or polymeric p-type layer may be achieved by spin-coating a solution of the material in a suitable solvent onto the layer of the passivated metal halide perovskite. The p-type hole transporter, for instance, spiro-OMeTAD, is typically dissolved in chlorobenzene. Usually the concentration of spiro-OMeTAD in chlorobenzene is from 150 to 225 mg/ml, more usually the concentration is about 180 mg/ml. An additive may be added to the hole transporter or electron transporter material. The additive may be, for instance, tBP, Li-TFSi, or an ionic liquid.

Usually, the second electrode material comprises a high work function metal, for instance gold, silver, nickel, palladium or platinum, and typically silver. Usually, the thickness of the second electrode is from 50 nm to 250 nm, more usually from 100 nm to 200 nm. For example, the thickness of the second electrode may be 150 nm. The second electrode is typically disposed on the second region by vapour deposition. Often, the step of producing a second electrode comprises placing a film comprising the hole transporting material in a thermal evaporator. Usually, the step of producing a second electrode comprises deposition of the second electrode through a shadow mask under a high vacuum. Typically, the vacuum is about $10^{-6}$ mBar. The second electrode may, for example, bean electrode of a thickness from 100 to 200 nm. Typically, the second electrode is an electrode of a thickness from 150 nm.

As the layer comprising the metal halide perovskite has been passivated by the treatment described in step (b), the steps (c) and (d) may be carried out upon a passivated surface of the metal halide perovskite. There may therefore be an intervening layer, for instance a monolayer, of the passivating agent between the layer of the metal halide perovskite and the second region and/or the layer of the second electrode material.

For instance, step (c) may comprise spin-coating a solution comprising 2,2',7,7'-tetrakis-(N,N-di-pmethoxyphenylamine)9,9'-spirobifluorene (Spiro-OMeTAD) and an organic solvent, for instance chlorobenzene. The concentration of the solution may be from 50 mM to 200 mM. The solution may further comprise tert-butylpyridine (tBP) (optionally at a concentration of from 70 to 90 mol %) and lithium bis(trifluoromethanesulfonyl)imide (Li-TFSI), optionally about 30 mol % of Li-TFSI.

Additionally or alternatively, step (c) may for instance comprise evaporating a silver electrode onto the device through a shadow mask. The silver electrode may have a thickness of from 100 nm to 100 nm.

The device may be an optoelectronic device, for instance a photovoltaic device. Thus, the device may be selected from a photodiode, a solar cell, a photodetector, and a photosensor.

A process for producing a device according to the invention may comprise one or more of the following steps:

I. providing a substrate comprising a first layer of a first electrode material, optionally a layer of semi-transparent fluorine-doped tin oxide (FTO);

II. depositing a layer of an n-type material, for instance a compact layer of $TiO_2$, on the layer of the first electrode material;

III. heating the substrate comprising the layer of the first electrode material and/or the layer of the second electrode material, optionally at from 200° C. to 600° C., optionally for from 30 min to 60 min;

IV. depositing a layer of a mesoporous dielectric material, for instance $Al_2O_3$, by spin coating a colloidal dispersion of nanoparticles of the dielectric material in a solvent, which solvent may be isopropanol;

V. spin-coating a metal halide perovskite precursor, which metal halide perovskite precursor typically comprises from 10 to 50 wt % of a first reactant, for instance methylammonium iodide, and a second reactant, for instance lead (II) chloride, optionally at 3:1 molar ratio in a solvent, for instance dimethylformamide;

IV. pre-heating the perovskite precursor and the substrate to from 60° C. to 80° C. prior to step V;

VII. annealing the deposited layer of perovskite at from 80° C. to 120° C. for from 30 min to 60 min;

VIII. treating the, optionally hot (e.g. from 80° C. to 120° C.), samples with the passivating agent and optionally thereafter drying under a nitrogen flow;

IX. spin-coating a layer of a hole transporting material, for instance Spiro-OMeTAD; and X. evaporating a layer of a second electrode material, for instance silver, onto the devices through a shadow mask.

The invention also provides a device obtainable by a process for producing a device according to the invention.

Passivated Metal Halide Perovskite Semiconductor

The invention also provides a semiconductor which comprises: (a) a metal halide perovskite; and (b) a passivating agent which is an organic compound; wherein molecules of the passivating agent are chemically bonded to anions or cations in the metal halide perovskite.

The passivated metal halide perovskite according to the invention may be as described anywhere hereinbefore for a device, or process for producing a device according to the invention. For instance, the passivating agent may be chemically bonded to anions or cations in the mixed halide perovskite by supramolecular bonds, for instance halogen bonds or chalcogen-metal bonds. The passivating agent may be selected from (a) a halogen bond donor compound, and (b) an organic compound comprising at least one thiol or sulfide group. The passivating agent may be an organic compound comprising at least one N or P atom such as those described herein, for instance pyridine.

EXAMPLES

Example 1—Adsorption of IPFB and Nature of Interaction

To demonstrate the presence of adsorbed IPBF (iodopentafluorobenzene) and the nature of the interaction with the $CH_3NH_3PbX_3$ crystal surface (X=halide), solid state $^{13}C$ and $^{19}F$ nuclear magnetic resonance (NMR) measurements were performed. FIG. 1e shows the chemical shift of $^{13}C$ NMR for pure IPFB, which is liquid at room temperature, and for IPFB adsorbed on the perovskite surface. No significant shift was found for the fluorine-bound carbons ($C_{2-6}$) in the range 135-150 ppm, while the signal of the iodine-bearing carbon ($C_1$) shifted 2 ppm downfield. Thus, $^{13}C$ NMR gives strong evidence that IPFB is adsorbed via halogen bonding to the $CH_3NH_3PbX_3$ crystal surface, as illustrated in FIG. 1d.

FIG. 1f shows $^{19}F$ NMR collected on the same samples, which allows the extraction of more detailed information than $^{13}C$ NMR. The $^{19}F$ IPBF signals recorded on the treated perovskite films are made of two components (inset FIG. 1f), one small component at the same frequency as liquid IPBF and one much more intensely shifted by about 0.5 ppm upfield. This supports the conclusion that the IPFB molecules are adsorbed onto the crystal surface and most of the unadsorbed excess is removed.

Example 2—Passivation Procedure in Meso-Superstructured Solar Cells (MSSCs) with IPFB The devices were prepared on patterned semi-transparent fluorine-doped tin oxide (FTO). A compact layer of 70 nm thick $TiO_2$ was deposited via spray pyrolysis at 275° C. from a precursor solution of titanium diisopropoxide bis(acetylacetonate) diluted with anhydrous ethanol at a volume ratio of 1:10. The substrate was sintered at 500° C. for 45 min and left to cool to room temperature. The samples were then submerged in a 15 mM aqueous $TiCl_4$ bath at 70° C. for 1 h, followed by rinsing with deionized water and re-sintering at 500° C. for 45 min. The next layer of mesoporous $Al_2O_3$ was deposited by spin coating a colloidal dispersion of $Al_2O_3$ nanoparticles in isopropanol (Sigma-Aldrich) diluted with isopropanol at a volume ratio of 1:2, at 2000 rpm (ramp: 2000 rpm/s) for 60 s, followed by drying at 150° C. for 30 min. The perovskite precursor (40 wt % of methylammonium iodide ($CH_3NH_3I$) and lead (II) chloride ($PbCl_2$) 3:1 molar ratio in dimethylformamide) was spin coated at 2500 rpm (ramp: 2500 rpm/s) for 60 s. The procedure utilized "hot substrate spin coating", i.e., the perovskite precursor and the samples are pre-heated to 70° C. The substrate was transferred quickly to the spin coater; the precursor solution was deposited immediately afterwards and the spin coating was started. This procedure has yielded consistently thicker capping layers of perovskites and higher short circuit currents.

The perovskite forms after subsequent annealing at 100° C. for 45 min. Then, the hot samples were directly immersed in an iodopentafluorobenzene (IPFB, Chemical Abstract Services Number 827-15-6) solution for a few minutes and thereafter dried under a nitrogen flow. Subsequently, the hole transporting material was deposited by spin coating (at 2000 rpm, ramp: 2000 rpm/s for 60 s) 80 mM 2,2',7,7'-tetrakis-(N,N-di-pmethoxyphenylamine)9,9'-spirobifluorene (Spiro-OMeTAD) in chlorobenzene with added 80 mol % tert-butylpyridine (tBP) and 30 mol % of lithium bis(trifluoromethanesulfonyl)imide (Li-TFSI). Finally, 150 nm thick silver electrodes were evaporated onto the devices through a shadow mask.

Example 3—Performance and Optical Properties of MSSCs with IPFB

Figures 2A, 2B, 2C, 2D:
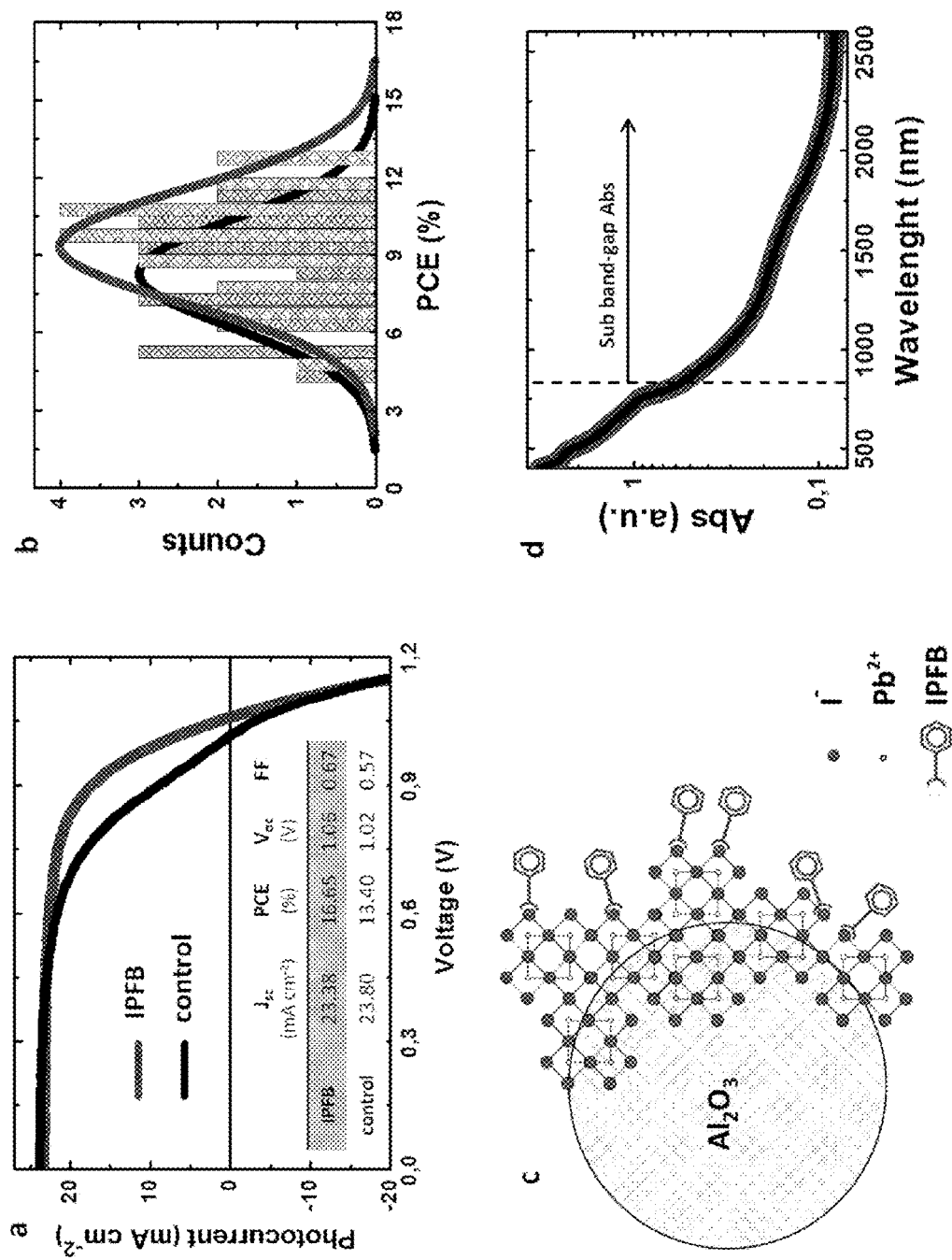
FIGS. 2$a$-2$d$ shows: (a) JV curves and performance parameters (table inset) of the best perovskite MSSCs, with and without the IPFB treatment, using Spiro-OMeTAD as hole transporter; devices were measured under AM1.5 simulated sun light of 100 mW $cm^{-2}$ equivalent solar irradiance using shadow masking to define the active area; (b) Distribution of the power conversion efficiency (PCE) for more than 20 devices prepared simultaneously; this experiment was repeated 4 times; (c) Illustration of the $CH_3NH_3PbX_3$ crystals grown on a scaffold of $Al_2O_3$ nanoparticles with IPFB present. (d) Light absorption of the perovskite films, with and without IPFB treatment (no Spiro-OMeTAD present).

JV characteristics of the best perovskite MSSCs with and without IPFB treatment (produced by the above described method) are shown in FIG. 2a. Upon IPFB treatment, the short-circuit current density (Jsc) as well as the open-circuit voltage (Voc) remain similar, while the fill factor (FF) is dramatically improved. The table inset in FIG. 2b shows that the overall PCE (power conversion efficiency) increases from 13% to over 16%, representing a step improvement. In FIG. 2b the PCE statistical distribution for a set of devices prepared simultaneously is shown, which confirms the improved trend.

In FIG. 2a, the control device exhibits a slight bend in the JV curve near 0.9 V, which is responsible for the relatively poor fill factor. Similarly shaped JV curves have previously been reported in several works for both organic and inorganic solar cells, and it is been generally referred to as an "S-shaped" JV curve (Kumar, A. et al., Journal of Applied Physics 105 (2009); Wagenpfahl, A. et al., Physical Review B 82, 115306 (2010)). The origin of the S-shape has been attributed to an energetic barrier for charge extraction, which may occur at any interface in the device. Often the interface between the p-type component and the electrode has been found to be responsible. Few studies so far have focused on the interface between the n- and p-type component. If the inorganic components are ionic crystals, such as the perovskites used herein, then native dipoles may occur at the organic-inorganic interface, between the hole transporter and the perovskite. Indeed, the presence of under-coordinated halides at the crystal surface give rise to local excess of negative electrostatic charge, which may trap the holes injected into the Spiro-OMeTAD, generating interfacial dipoles. The IPFB treatment could effectively screen the electrostatic charge of the halides exposed to the crystal surface and prevent dipole formation. Though the S-shape is sometimes unclear, devices with the IPFB passivation treatment systematically exhibit improved fill factor.

It was also investigated whether the IPFB adsorption, as represented in FIG. 2c, has changed the optical properties of the perovskite material itself. In FIG. 2d, the light absorption spectra between 500 nm and 2500 nm is shown, which exhibits virtually no differences with and without the IPFB. The sub-band gap absorptions (at longer wavelengths than 800 nm) are may be significant and not simply due to light scattering.

Example 4—Photodynamics of IPFB Passivated MSSCs

Figures 3A, 3B, 3C:
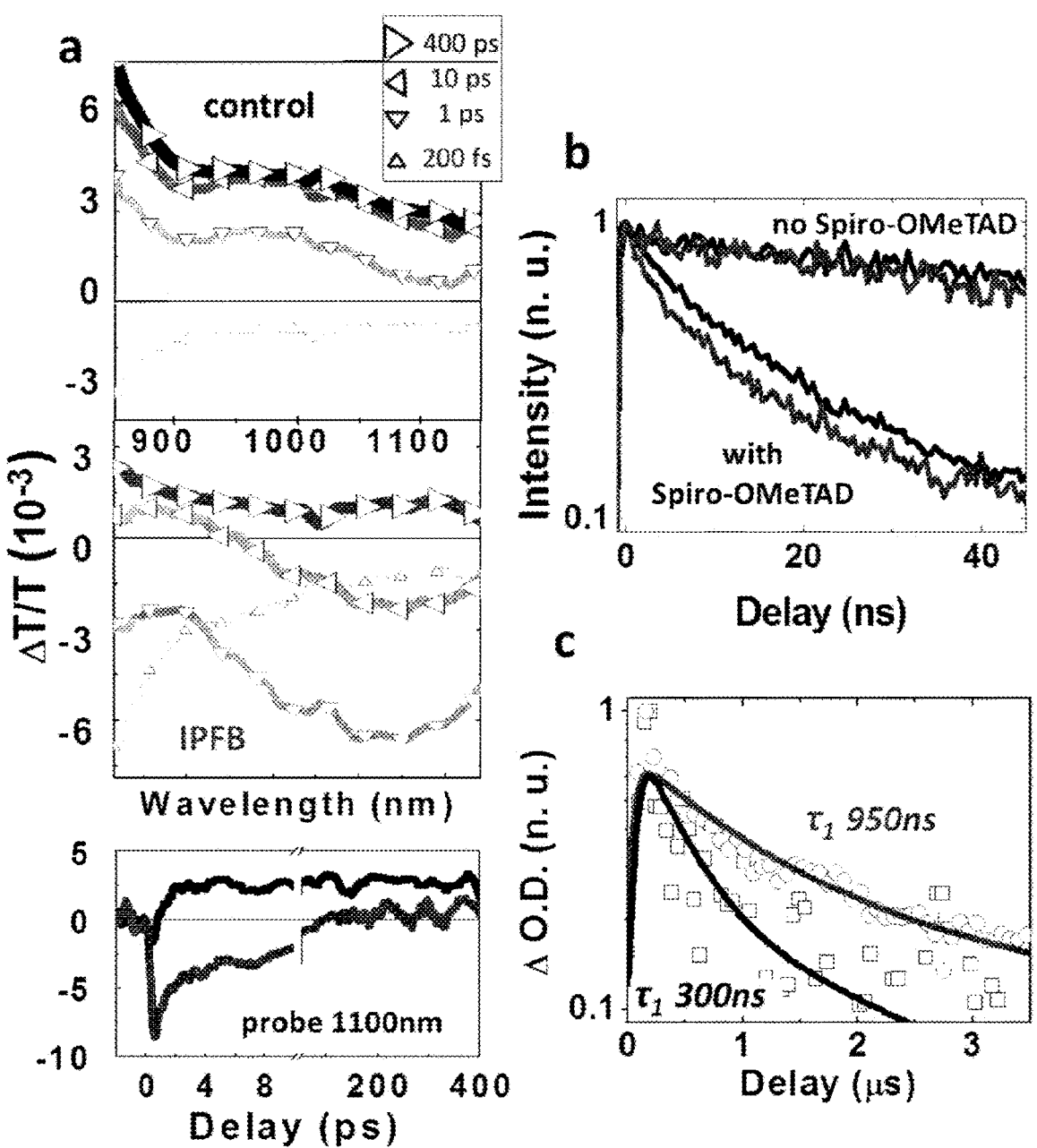
FIGS. 3$a$-3$c$ shows: (a) Ultrafast transient absorption spectra and dynamics at 1100 nm of perovskite grown on a scaffold of $Al_2O_3$ nanoparticles (as described in FIG. 2$c$) and coated with Spiro-OMeTAD, with and without the IPFB treatment; excitation at 500 nm (14 µJ/cm2); (b) Time resolved photoluminescence quenching, probing the emission from samples with and without Spiro-OMeTAD, with excitation at 510 nm; (c) Nanosecond transient absorption dynamics for the IPFB treated (circles) and untreated (squares) samples; excitation at 500 nm (100 µJ/cm2), probe at 640 nm. The continuous lines represent the double-exponential fitting with the shorter lifetimes ($\tau 1$) reported.

In order to better understand the evolution of photoinduced species, and to elucidate the dynamics of charge transfer and recombination occurring at the perovskite/hole transporter interface, transient absorption (TA) measurements in the femto-microsecond time window were performed on complete perovskite MSSCs, with and without the IPFB treatment. FIG. 3a shows the TA femtosecond spectra in the near infrared, covering the 850-1150 nm spectral region. The control sample with no IPFB treatment shows a flat negative band (photoinduced absorption, PA) at 200 fs, which is quickly overtaken by the formation of a broad positive band (photobleaching, PB) on sub-picosecond time scale. This broad PB band on neat perovskite films (no hole-transporter) was also observed in quasi-steady-state photoinduced absorption. Since this is distinct from photoluminescence, and is also present in the neat perovskite films, it may be assigned to bleaching of absorption into mid-gap states, i.e. charges trapping in mid gap states. With the IPFB treatment, the transient absorption evolution is considerably different. The PA at 200 fs is still observed, however, it evolves into a different PA band before we are able to observe PB on the picosecond time scale. This new PA is clearly evident in the 1 ps trace, extends further in the near infrared, and is coincident with the absorption of the positive charge on Spiro-OMeTAD. The PA band still competes with the formation of the broad PB band observed without the IPFB, which overbears the PA only on picosecond time scale. This indicates that the surface treatment makes the hole transfer process to the Spiro-OMeTAD dominating with respect to the occupancy of mid-gap stats on the sub-picosecond time scale upon photoexcitation. This does not necessarily imply that hole-transfer is more efficient with IPFB, but it does signify that there is less or a slower filling of mid-gap states with the IPFB treatment.

To probe a signature of hole-transfer from the perovskite to the Spiro-OMeTAD, a transient photoluminescence quenching experiment was performed. In FIG. 3b it is shown that the Spiro-OMeTAD quenches the photoluminescence of the perovskite at similar, though fractionally faster rates with the IPFB treatment. Disentangling all the absorption features is challenging, however the results above are consistent with a smaller and slower build-up occupied of mid-gap states and faster hole transfer to the Spiro-OMeTAD when the perovskite film is treated with IPFB.

To probe the charge recombination dynamics at the perovskite/hole transporter interface, the decay of the TA signal for the oxidized Spiro-OMeTAD species in the nano-millisecond time scale was measured. In FIG. 3c, the TAS dynamics probed at 640 nm from samples with and without the IPFB passivation is shown. In the untreated sample, the holes recombine with an initial time constant of approximately 300 ns. By contrast, the IPFB treated sample shows a much longer decay with an initial time constant of approximately 900 ns. Thus, the hole-lifetime is more than 3 times longer, indicating that the hole recombination is significantly suppressed with the presence of IPFB.

Example 5—Perovskite/Hole Transporter Interface Investigation

Figures 4A, 4B, 4C, 4D:
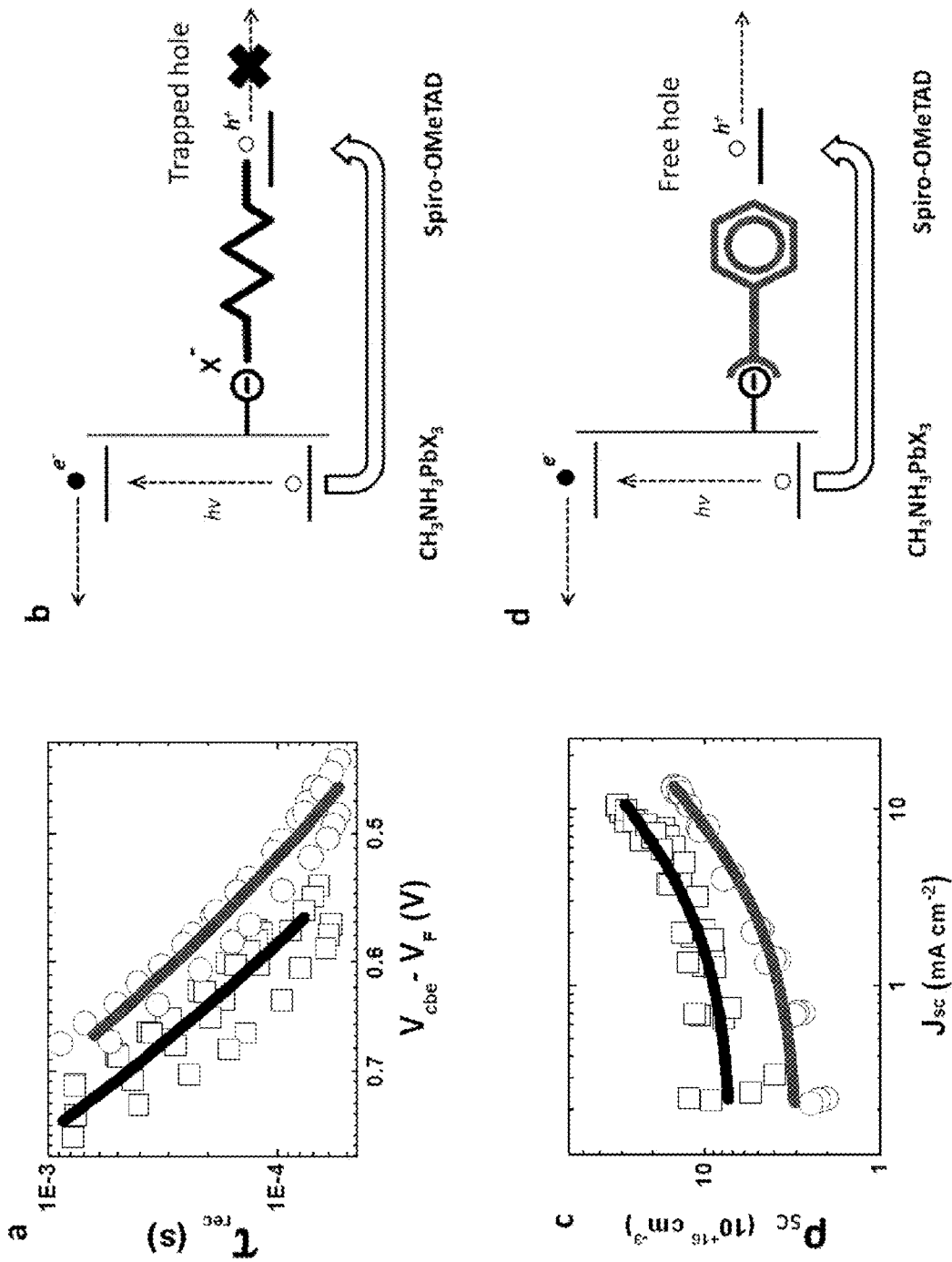
FIGS. 4$a$-4$d$ shows: Photocurrent and photovoltage decay measurements for IPFB treated and untreated perovskite-sensitized solar cells (PSSCs), as extracted from eight separate devices: (a) Recombination lifetimes ($\tau_{rec}$) against the relative position of the electron quasi-Fermi level with respect to the conduction band edge in the $TiO_2$ ($V_{cbe}-V_F$); (b) Illustration of the electrostatic interaction between the under-coordinated halide ($X^-$) on the perovskite surface and the hole injected in the Spiro-OMeTAD; (c) Charge density at short circuit ($\rho_{se}$) against short circuit photocurrent (Jsc); (d) Illustration of the electrostatic screening of the halide via halogen bond complexation of IPFB on the perovskite surface.

In order to fully understand what happens at the perovskite/hole transporter interface under different device working conditions, small perturbation photocurrent and photovoltage decay measurements were used. Since the lifetime for the charge transport in MSSC devices is close to the instrument resolution of the apparatus, perovskite-sensitized solar cells (PSSCs) (which replace the thin (300 nm) $Al_2O_3$ which are found in MSSCs with thick (1.5 μm) mesoporous $TiO_2$) were constructed. The devices were constructed by the method of Example 2, except $Al_2O_3$ was replaced with $TiO_2$. The perovskite is then deposited on the mesoporous TiO$_2$. In the PSSC configuration, the charge transport can be moderated, forcing the electron transport to be exclusively through the TiO$_2$, by making thick mesoporous TiO$_2$ films, with a relatively low coating density of perovskite. Similar enhancements in solar cell performance with the IPFB treatment were observed. The relative change in charge recombination at perovskite/hole transporter interface in working devices can be observed by plotting the recombination lifetimes ($\tau_{rec}$) against the relative position of the electron quasi-Fermi level with respect to the conduction band edge in the TiO$_2$ ($V_{cbe}$-$V_F$). FIG. 4a shows that the IPFB treatment reduces the recombination rate constant (1/$\tau_{rec}$) at the perovskite/hole transporter interface by a factor of three, consistent with the TA results presented in FIG. 3d.

Although the inhibition of recombination could explain the improved fill factor observed with the IPFB treatment, it does not clarify the occurrence of the S-shaped JV curve. As illustrated in FIG. 4b, under-coordinated halides (X$^-$) at the crystal surface could act as trap sites for the holes on Spiro-OMeTAD. If this is the case, then holes should accumulate at this heterojunction until they have screened all of the under-coordinated halides. Therefore, it would be expected to see additional build-up of positive charge in the control device. The relative concentration of this accumulated charge can be directly estimated by comparing the total charge extracted under short circuit condition ($\rho_{sc}$) at the same $J_{sc}$.

FIG. 4c shows that, for any given Jsc, there is a much larger background density of charge within the devices without the IPFB treatment. This is consistent with IPFB effectively passivating the under-coordinated halides and reducing the density of accumulated charge at the heterojunction, as illustrated in FIG. 4d. Remarkably, the additional background charge density in the control devices is significantly larger than the total charge density in the IPFB treated device. It is proposed that the S-shaped JV curve arises from hole accumulation in the Spiro-OMeTAD at the perovskite/hole transporter heterojunction, which results in a local electric field causing hole drift within the Spiro-OMeTAD towards, rather than away from, the heterojunction. The effect of this electric field may be negligible in short circuit conditions, but it becomes significant under external applied bias.

Example 6—Passivation of Tin Halide Perovskites with IPFB

Figure 5:
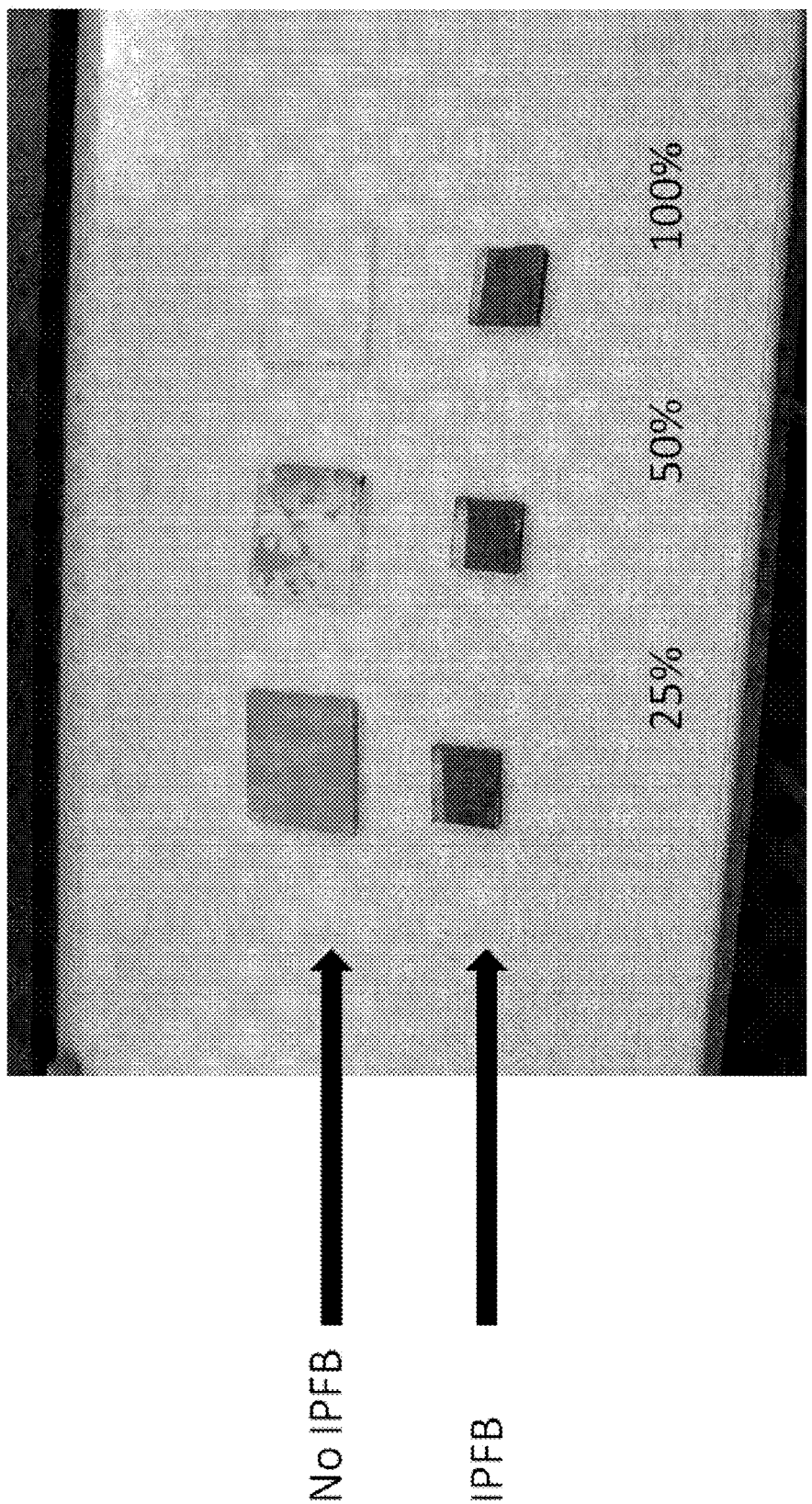
FIG. 5 shows a picture of films fabricated using the Sn based perovskite $CH_3NH_3SnI_3$, coated upon fluorine doped tin oxide (FTO) coated glass, coated with both a compact and mesoporous layer of $TiO_2$ prior to perovskite coating. Here we see that the films which have been passivated using IPFB remain stable after being coated with a hole transporter, whereas the films without IPFB have undergone a significant degree of degradation after a period of 24 hrs. With increasing Sn content (indicated by percentage), the extent of film degradation is more severe. IPFB passivation stabilises the film and slows down the degradation process. (Films are coated with Spiro-OMeTAD.)

Layers of perovskite containing varying amounts of the tin halide perovskite, CH$_3$NH$_3$SnI$_3$ were deposited on a substrate comprising a glass substrate, an FTO layer, a compact TiO$_2$ layer and a mesoporous TiO$_2$ layer in a nitrogen filled glove box on glass and then treated with IPFB as described above. A layer of spiro-OMeTAD was then spin coated on top of the IPFB passivated tin perovskite. As can be seen in FIG. 5, the layers passivated with IPFB did not degrade after 25 hours, whereas substantial degradation can be seen in the un-passivated CH$_3$NH$_3$SnI$_3$ films. For a typical organolead mixed halide perovskite, the precursor materials, CH$_3$NH$_3$I and PbCl$_2$ are dissolved in DMF in a 3:1 molar ratio at a concentration of 40 wt %. The same is done for the mixed metal (tin doped) perovskites, where the total mass of the metal halide remains the same; but a fraction of the lead halide is replaced by a tin halide. For example, for a 25% Sn doped solution, 25% of the total mass of the metal halide added to the perovskite solution, is comprised of the Sn halide. The 100% methylammonium triiodostannate was fabricated in the same way as the mixed halide lead perovskite. These Sn based perovskites can also be mixed halide perovskites, by using SnCl$_2$, SnF$_2$, SnBr$_2$.

Example 7—Passivation Procedure in MSSCs with Thiophene

FTO-coated glass sheets (15 Ωcm$^{-1}$ Pilkington) were etched with zinc powder and HCl (2M) to obtain the required electrode pattern. The sheets were then washed with soap (2% Hellmanex in water), deionized water, acetone, and ethanol, and treated under oxygen plasma for 10 minutes to remove any remaining organic residue. Subsequently, a compact layer of TiO$_2$ was deposited by spin-coating a solution of titanium isopropoxide in ethanol onto the substrate. The substrate was then sintered to 500° C. for 45 mins. An aluminium oxide (Al$_2$O$_3$) dispersion, diluted 2:1 (IPA:A$_2$O$_3$) was then spin coated onto the substrate and subsequently dried for an hour. A 40 wt % solution of mixed halide perovskite (CH$_3$NH$_3$PbI$_{3-x}$Cl$_x$) was then spin coated onto the Al$_2$O$_3$ in the glovebox, and the substrates were left to dry at ambient temperature for 30 mins, then annealed at 100° C. for 90 mins.

After annealing of the perovskite, a passivating layer (thiophene) was spin coated onto the hot substrate. The hole transporting material (HTM), 2,2',7,7'-tetrakis-(N,N-di-p-methoxyphenylamine)9,9'-spirobifluorene (spiro-OMeTAD), was dissolved in chlorobenzene at 13 vol %, and then heated to 100° C. until it was completely dissolved. After complete dissolution, 4-tert-butyl pyridine (tBP) was added in a volume-to-mass ratio of 1:26 µL mg-1 tBP:Spiro-OMeTAD. Lithium bis(trifluoromethylsulfonyl)imide salt (Li-TFSI) was pre-dissolved in acetonitrile at 170 mgmL$^{-1}$, and added to the hole transporter solution at 1:12 µL mg$^{-1}$, Li-TFSI solution:Spiro-OMeTAD. The HTM was then spin-coated on the substrate at 1000 rpm for 45 seconds. The films were then placed in a thermal evaporator, where 200 nm thick silver electrodes were deposited through a shadow mask under high vacuum (10$^{-6}$ mbar). The active area of the devices was defined by a metal optical mask with 0.0635 cm$^2$ aperture.

Example 8—Device Characteristics

Figure 6:
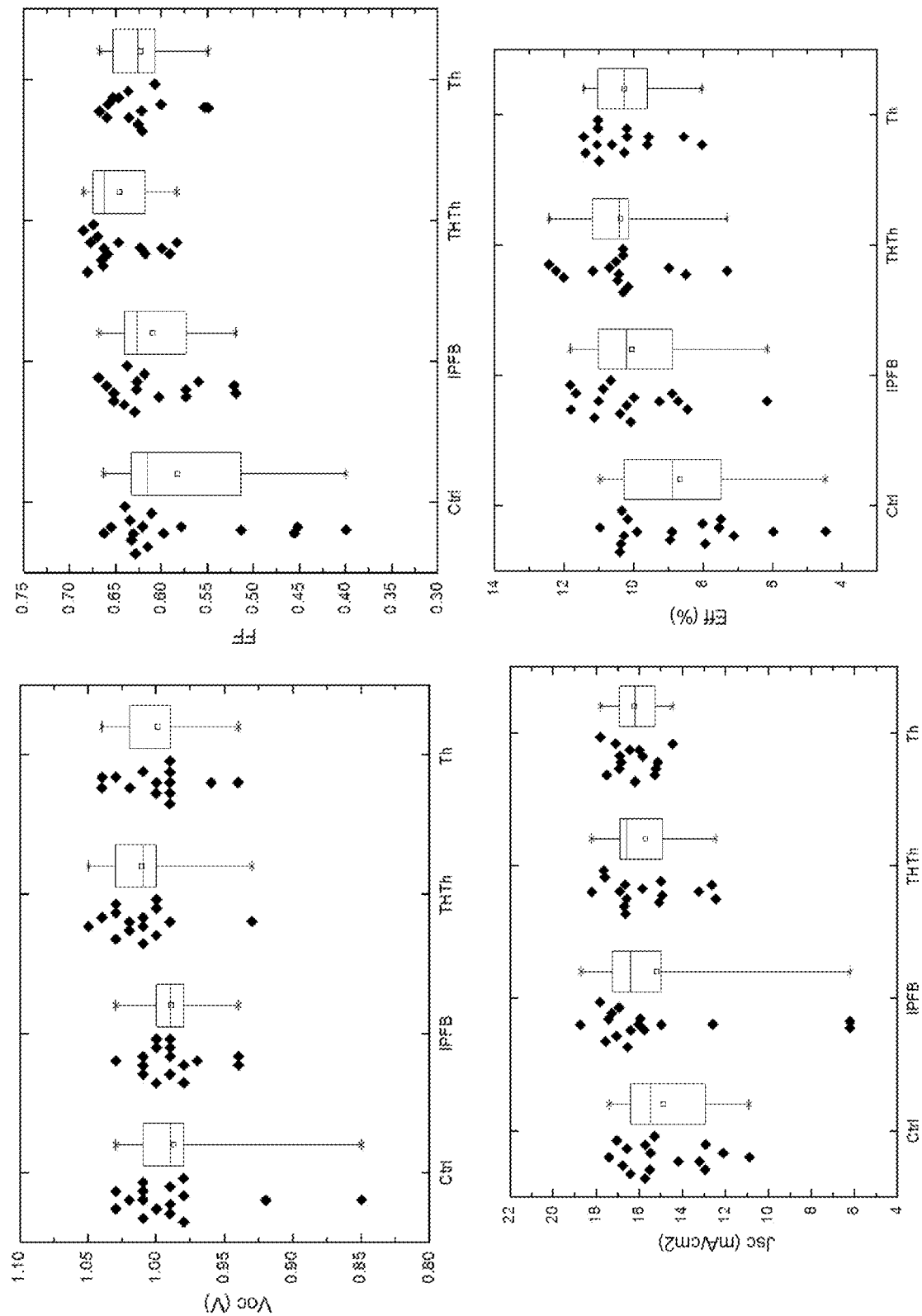
FIG. 6 shows the spread of performances for MSSCs employing $CH_3NH_3PbI_{3-x}Cl_x$ as the absorber obtained for three different surface treatments as compared to a control device without any surface treatments. All devices were completely processed within an $N_2$ filled glovebox, and with a sample size of 16 individual devices for each variable investigated: iodopentafluorobenzene (IPFB), tetrahydrothiophene (THTh), thiophene (Th) and control devices. We see here that for the passivated devices there is an improvement in device parameters when compared to the control.
Figure 7:
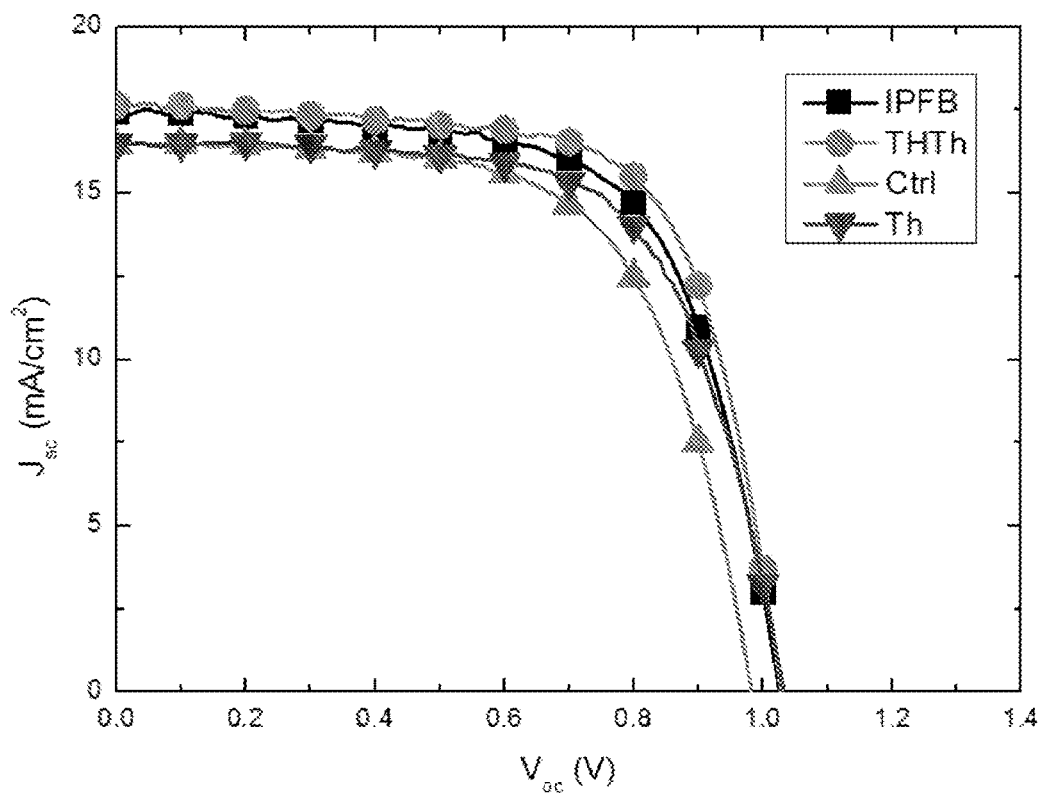
FIG. 7 shows the J-V characteristics of the best performing devices for surface treatment investigated: iodopentafluorobenzene (IPFB), tetrahydrothiophene (THTh), thiophene (Th) and a control device with no surface treatments; as well as a table showing the maximum values of all the device parameters.

Device characteristics of MSSCs passivated with tetrahydrothiophene and thiophene produced by the above described method were measured. The characteristics are shown in FIGS. 6 and 7, where they are also compared with device characteristics of IPFB passivated devices and un-passivated control devices. FIG. 6 shows the spread of performances obtained for three different surface treatments as compared to a control device without any surface treatments. All devices were completely processed within the glovebox, and with a sample size of 16 individual devices for each variable investigated: iodopentafluorobenzene (IPFB), tetrahydrothiophene (THTh), thiophene (Th) and control devices. We see here that for the passivated devices there is an improvement in device parameters when compared to the control. FIG. 7 shows the J-V characteristics of the best performing devices for surface treatment investigated: iodopentafluorobenzene (IPFB), tetrahydrothiophene (THTh), thiophene (Th) and a control device with no surface treatments; as well as a table showing the maximum values of all the device parameters.

Example 9—Time Resolved Photoluminescence of the Mixed Halide Pb Perovskite (CH$_3$NH$_3$PbI$_{3-x}$Cl$_x$) with Various Surface Treatments Spectroscopy samples were prepared in a nitrogen filled glove box by spin coating films of perovskite precursor on to glass slides. The spin coating protocol uses a 40 wt % solution of 3:1 molar ratio of $CH_3NH_3I:PbCl_2$ in DMF. The slides were left to dry for 1 hour in a nitrogen filled glove box, after which they were heated to 90° C. for 120 mins. After heating the liquid thiophene or IPFB (surface treatments) were dispensed onto the substrates and spin coated, followed by a coating with a ~100 nm layer of poly methylmethacrylate (PMMA) dispensed and spin coated from a toluene based solution. All processing was done in a nitrogen filled glove box. The results are given in FIG. 8 which shows that while IPFB has a small effect on the PL (photoluminescence) lifetime of the films, there is an increase in lifetime with the thiophene. When a combination of thiophene and IPFB were spin coated onto the films (Thiophene followed by IPFB) the PL lifetime of the films increased considerably, demonstrating a reduction in the non-radiative decay rate (or channels) after the surface treatments. This data is interpreted as implying that the combination of these materials passivates under-coordinated bonds in the material. The data therefore implies that the undercoordinated ions are responsible for creating non-radiative electron and hole recombination sites.

Figure 8:
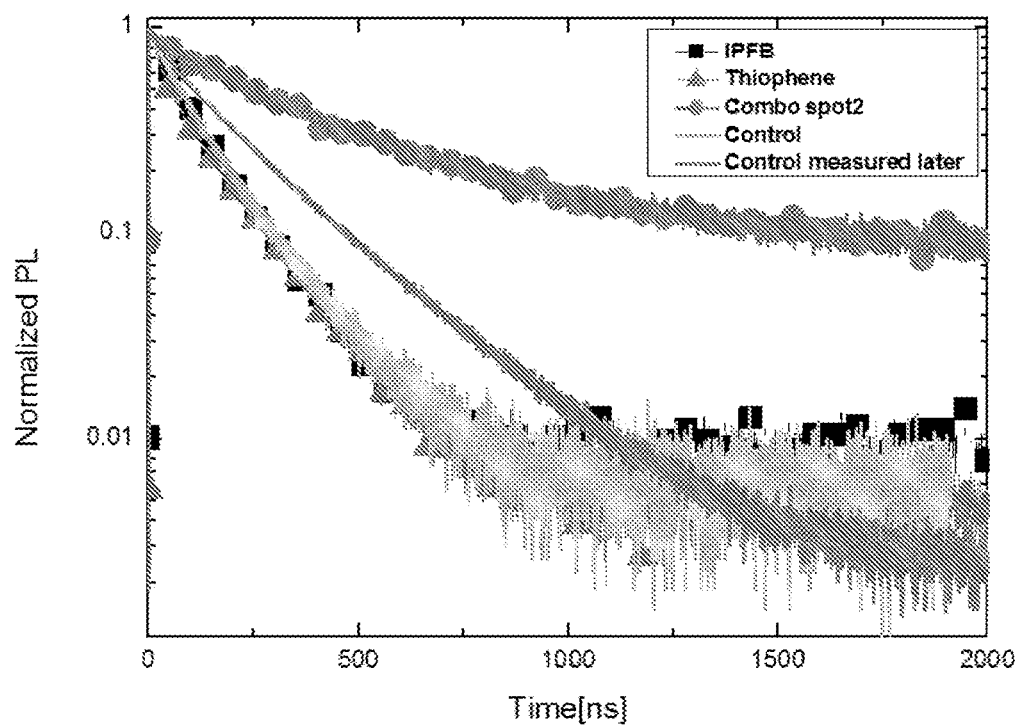
FIG. 8 shows time resolved photoluminescence of the organolead mixed halide perovskite $CH_3NH_3PbI_{3-x}Cl_x$, with various passivation treatments.
Figure 9:
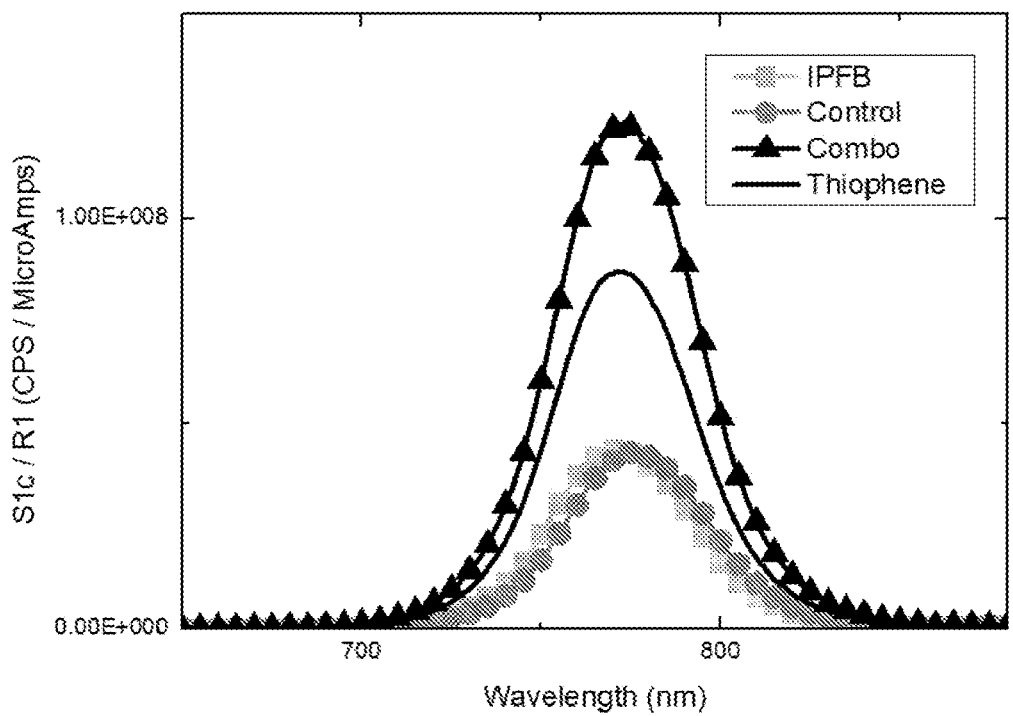
FIG. 9 shows steady state photoluminescence of the organolead mixed halide perovskite $CH_3NH_3PbI_{3-x}Cl_x$, with various passivation treatments.

Example 10—Steady State Photoluminescence of the Mixed Halide Perovskite ($CH_3NH_3PbI_{3-x}Cl_x$) with Various Surface Treatments FIG. 9 shows the steady state photoluminescence (PL) of a film of $CH_3NH_3PbI_{3-x}Cl_x$ coated on glass substrates (same samples as used for the measurement in FIG. 8). As seen in the time resolved PL, the IPFB treatment has little effect on the PL of the material. However, an increase in the photoluminescence is seen with the thiophene treatment, and a further increase by using a combination (combo) of thiophene and IPFB, further evidence that these two treatments act to passivate trap states in the material.

Example 11—Passivation and Stabilisation of Methylammonium Tin Triiodide

Figure 10:
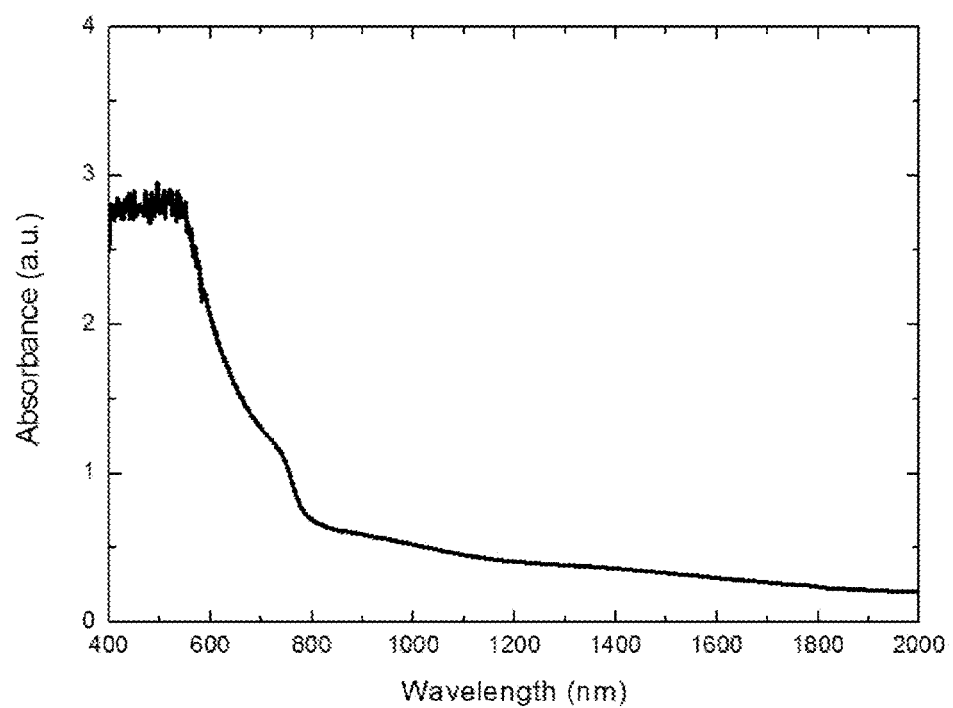
FIG. 10 shows the absorbance of a film of methylammonium triiodostannate ($CH_3NH_3SnI_3$) passivated with thiophene, after being stored in ambient indoor conditions (on the desk top in an office) for 3 weeks.

A passivating layer of thiophene was spin coated onto a thick layer of methylammonium tin triiodide ($CH_3NH_3SnI_3$, formed under an inert atmosphere). The sample was then left in air at ambient indoor conditions for three weeks. The absorption spectrum of this three week old sample is shown in FIG. 10. While $CH_3NH_3SnI_3$ has in the past been considered notoriously unstable, FIG. 10 demonstrates that the absorbance of the sample passivated with thiophene has remained stable for three weeks.

Example 12—Device Performance with and without IPFB Treatment

Figure 11:
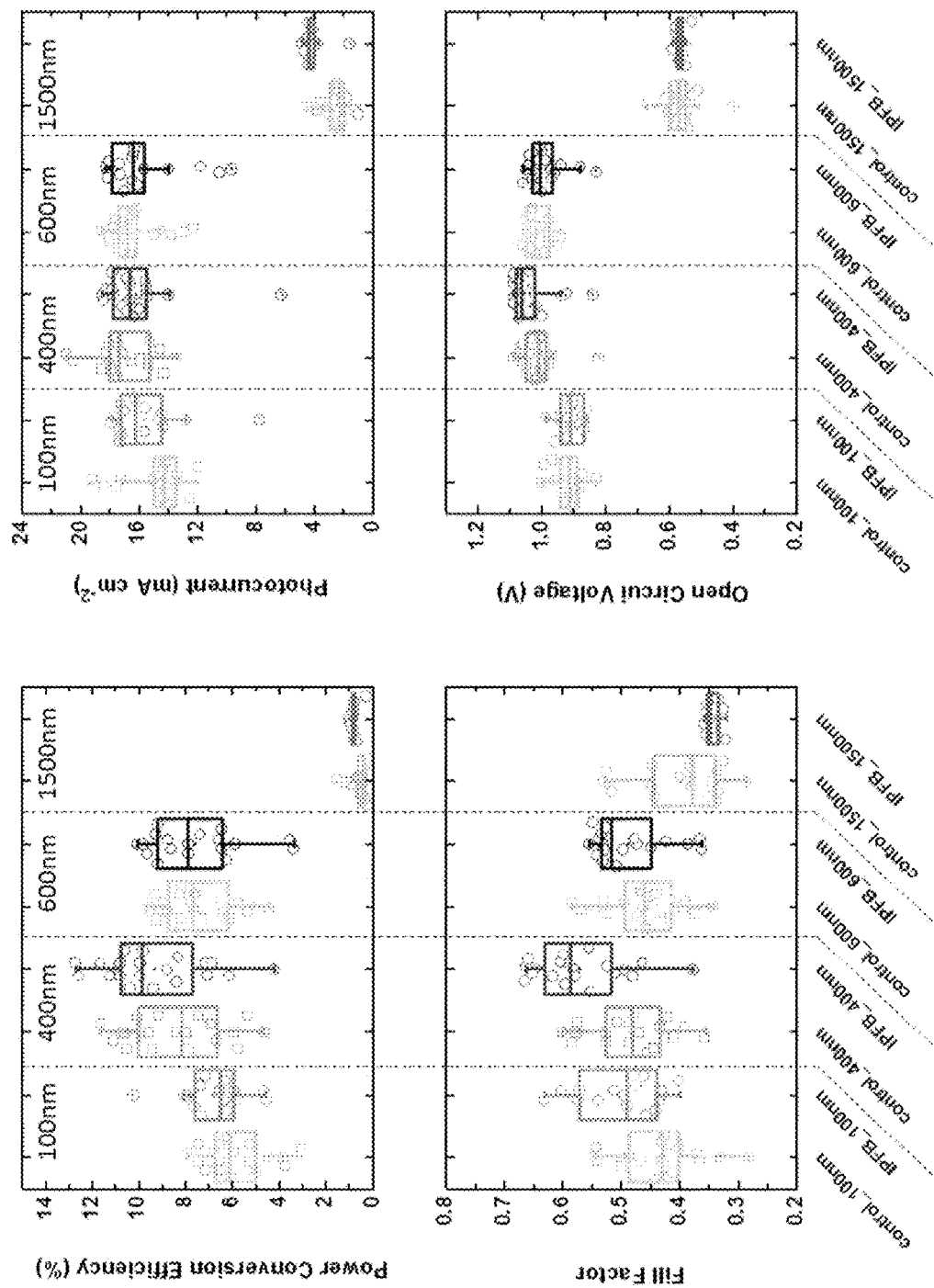
FIG. 11 shows device performance variations for devices prepared with and without IPFB treatment, where the thickness of a mesoporous dielectric scaffold is varied.

Devices were prepared by the process described in Example 2 with different mesoporous $Al_2O_3$ thicknesses (100 nm, 400 nm, 600 nm, and 1500 nm). All devices were prepared simultaneously with and without the IPFB treatment. The device performance characteristics were then measured, and a box chart of device parameters extracted from the current-voltage characteristics are shown in FIG. 11 (where each point represents a single device). The IPFB treatment results in a substantial improvement of power conversion efficiency and fill factor when compared with untreated devices.

Figure 12:
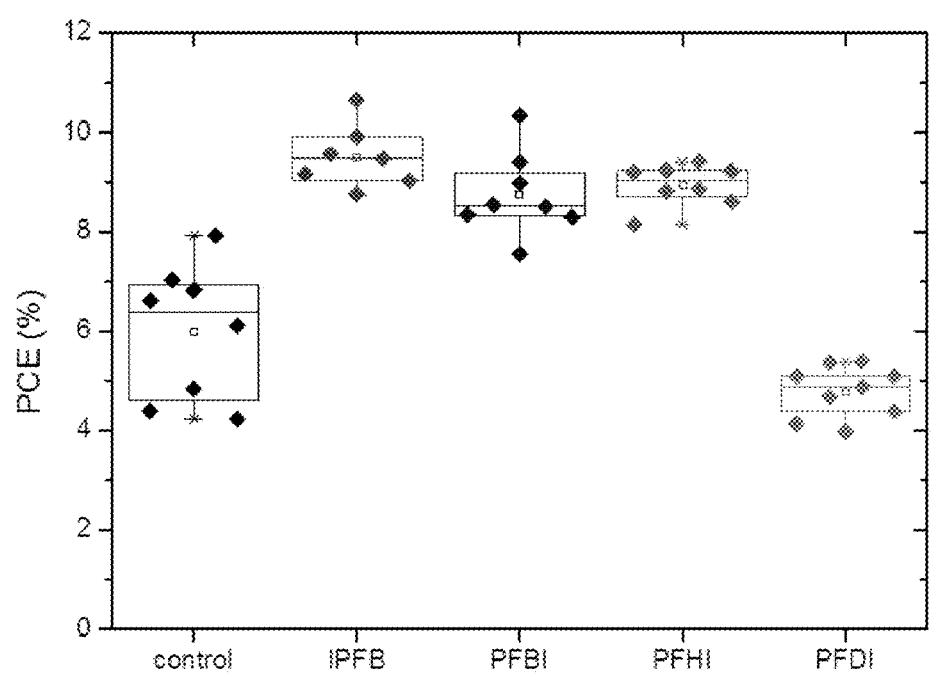
FIG. 12 shows device performance variations of devices prepared with different iodo-perfluorocarbons.

Example 13—Device Performance with Treatment Using Different Iodoperfluorcarbons MSSCs were constructed by the method of Example 2, except that different iodoperfluorocarbons were used in addition to IPFB. The different iodoperfluorocarbons used were: iodopentafluorobenzene (IPFB), perfluoro-n-butyl iodide (PFBI), perfluoro-n-hexyl iodide (PFHI) and perfluorodecyl-n-iodide (PFDI). FIG. 12 shows a box chart of device parameters extracted from the current-voltage characteristics of the devices.

Figure 13:
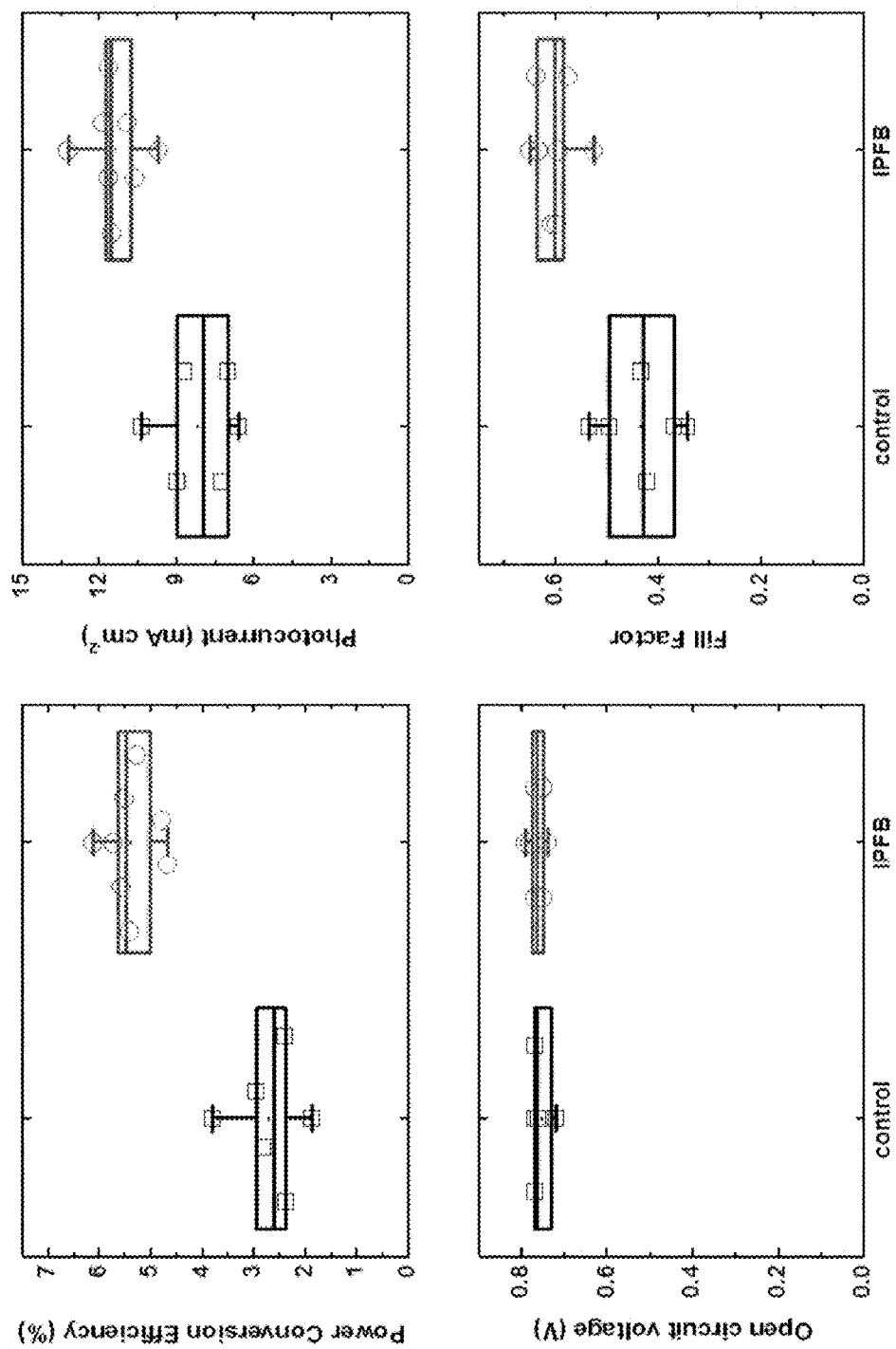
FIG. 13 shows device performance parameters for perovskite sensitized solar cells (PSSCs) comprising a 1.5 μm thick layer of mesoporous $TiO_2$, with and without IPFB treatment.

Example 14—Device Performance Parameters for Perovskite Sensitized Solar Cells (PSSCs) with 1.5 μm Thick Mesoporous $TiO_2$, with and without IPFB Treatment PSSCs with 1.5 μm thick mesoporous $TiO_2$ were prepared by the method of Example 5 with and without IPFB treatment. The device performance characteristics were then measured, and a box chart of device parameters extracted from the current-voltage characteristics are shown in FIG. 13 (where each point represents a single device). All devices were prepared simultaneously with and without the IPFB treatment as described in Methods.

Figure 14:
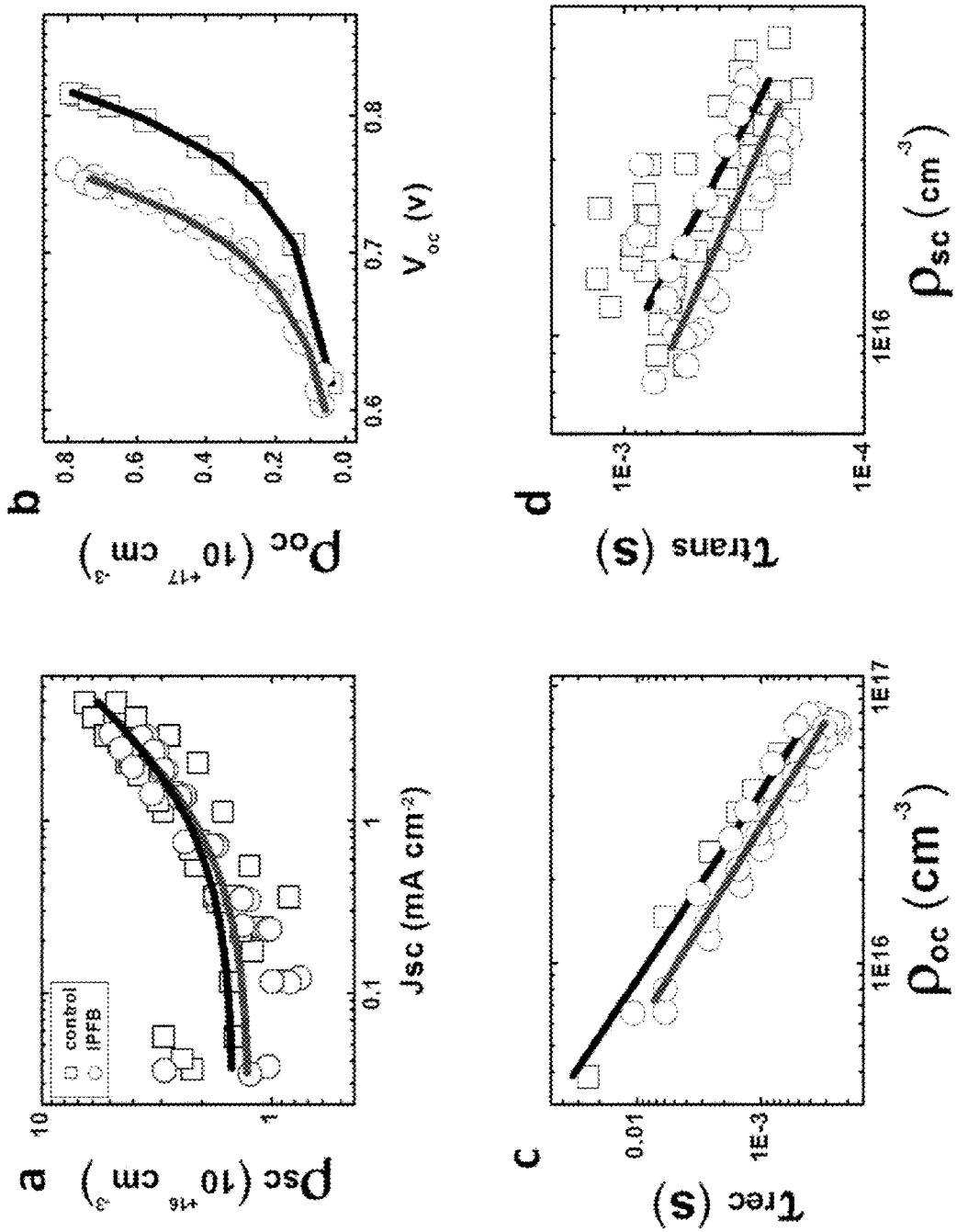
FIG. 14 shows photovoltage and photocurrent decay measurements for dye sensitized solar cells (DSSCs), prepared with and without IPFB treatment.

Example 15—Photovoltage and Photocurrent Decay Measurement for DSSCs, with and without IPFB Dye sensitized solar cells (DSSCs) were prepared by disposing an organic dye on a mesoporous $TiO_2$ layer prepared by the method of Example 5 (where perovskite was replaced with dye D102), with and without IPFB treatment. Photovoltage-current decay measurements for devices prepared with organic dye (D102), were extracted from four separate devices. The results are shown in FIG. 14: a) Charge density at short circuit ($\rho_{sc}$) against short circuit photocurrent ($J_{sc}$); b) charge density at open circuit ($\rho_{oc}$) against the open circuit voltage ($V_{oc}$); c) recombination lifetimes at open circuit conditions ($\tau_{rec}$) against charge density at open circuit ($\rho_{oc}$); d) transport lifetimes at short circuit conditions ($\tau_{trans}$) against charge density at short circuit ($\rho_{sc}$).

Example 16—Photoluminescence Data for Pyridine Passivated Films

Figure 15:
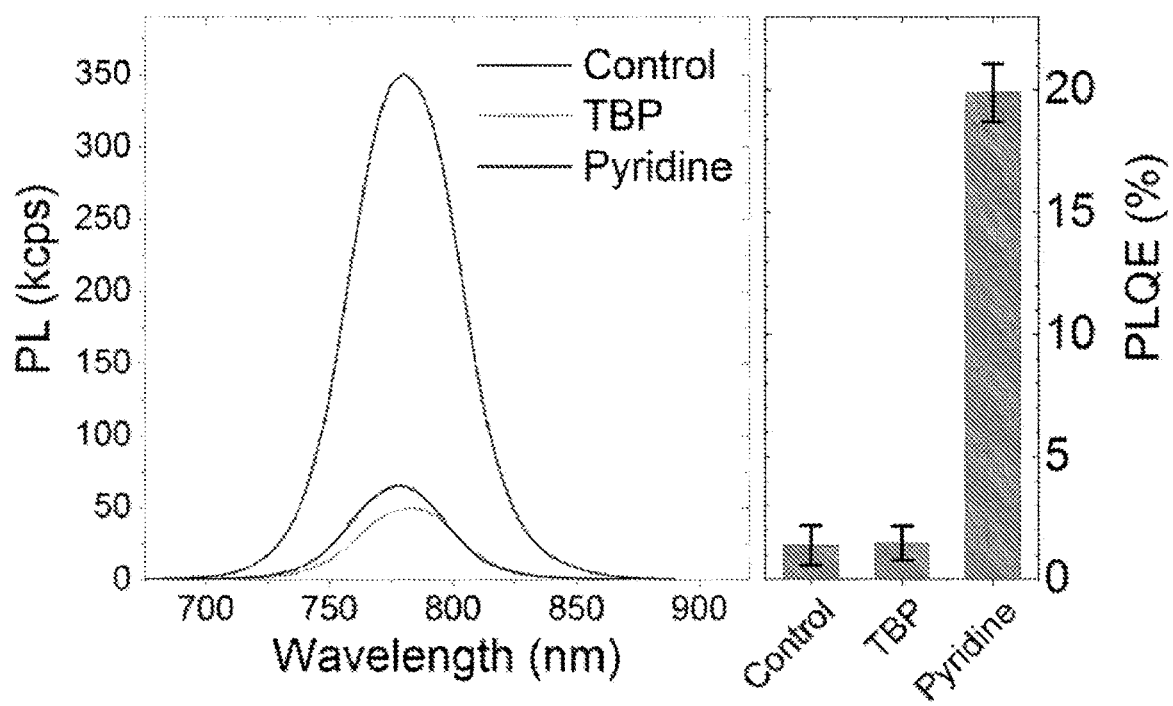
FIG. 15 shows steady-state photoluminescence (PL) and photoluminescence quantum efficiency (PLQE) of passivated and unpassivated perovskite films.
Figure 16:
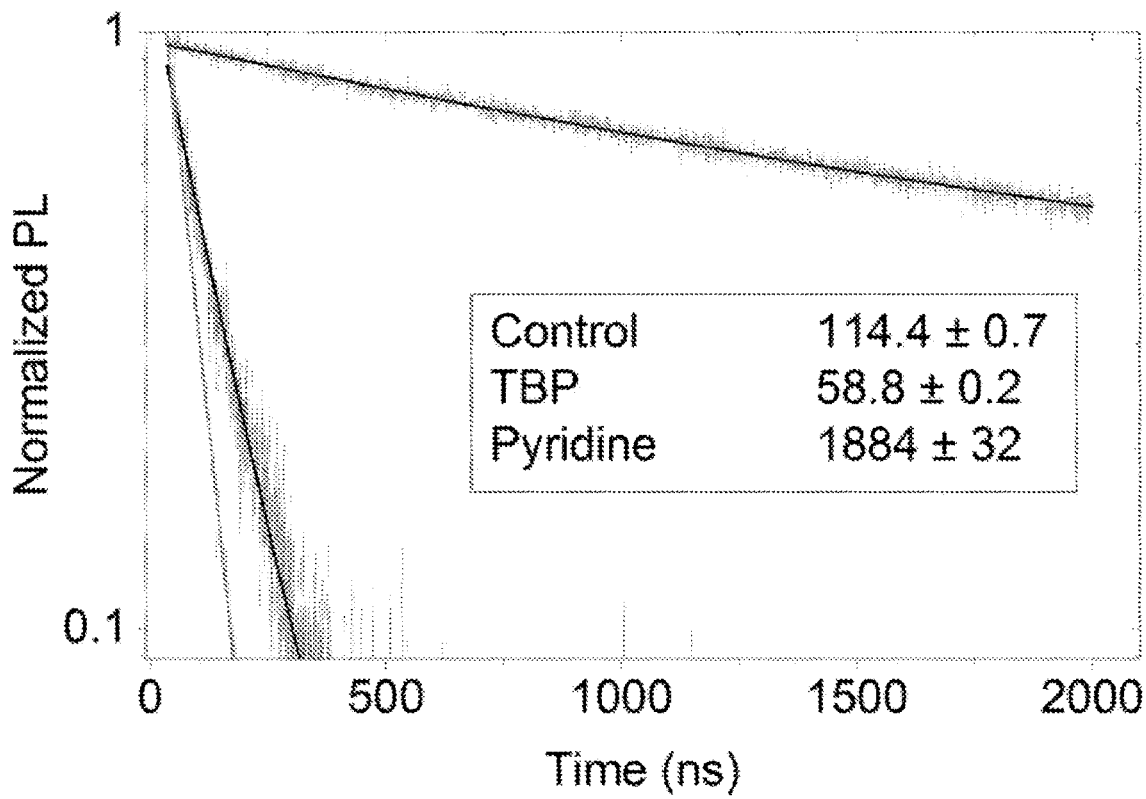
FIG. 16 shows time-resolved PL of passivated and unpassivated perovskite films.

Spectroscopy samples were prepared by spin coating films of perovskite on to glass slides. The spin coating protocol uses a 40 wt % solution of 3:1 molar ratio of $CH_3NH_3I:PbCl_2$ in DMF. The slides were left to dry for 1 hour, after which they were heated to 90° C. for 120 mins. After heating the surface treatments (pyridine or tert-butylpyridine (tBP) diluted to 10 to 20 vol % in chlorobenzene) were spin coated onto the substrates, followed by a 100 nm layer of PMMA (using a 1% solution of poly methyl methacrylate). All processing was done in inert atmosphere. The steady state photoluminescence (PL) and photoluminescence quantum efficiency (PLQE) of the passivated and unpassivated (control) films are shown in FIG. 15. The time resolved PL of passivated and unpassivated (control) films is shown in FIG. 16. These results show that while tBP quenches the PL of the perovskite, there is an increase in lifetime with the pyridine. With the use of the pyridine the PL lifetime of the films increased considerably up to over a microsecond, suggesting that, like the thiophene, pyridine passivates under-coordinated bonds in the material. The increase in the steady-state PL and the PLQE also corroborate this hypothesis.

Example 17—Fabrication of Planar Heterojunction Solar Cells with Thiophene or Pyridine FTO-coated glass sheets (15 Ωcm$^{-1}$ Pilkington) were etched with zinc powder and HCl (3M) to obtain the required electrode pattern. The sheets were then washed with soap (2% Hellmanex in water), deionized water, acetone, and methanol, and finally treated under oxygen plasma for 10 min to remove the last traces of organic residues. A 100 nm thick compact layer of $TiO_2$ was then deposited on the glass using titanium isopropoxide diluted in anyhydrous ethanol and sintered for 45 mins at 500° C. The 40 wt % perovskite precursor solution (3:1 molar ratio of $CH_3NH_3I:PbCl_2$ in DMF) was then spin coated directly onto the substrate under inert atmosphere. The substrate was then left to dry under $N_2$ for 30 min before being placed on a hotplate at 90° C. where it was annealed for 180 min. After annealing, the substrate was allowed to cool to room temperature and a layer of thiophene or pyridine (each 20 vol % in chlorobenzene) was spin coated on top of the perovskite layer, followed by the HTM material as above (Example 7). 150 nm thick silver electrodes were then deposited through a shadow mask.

Figure 17:
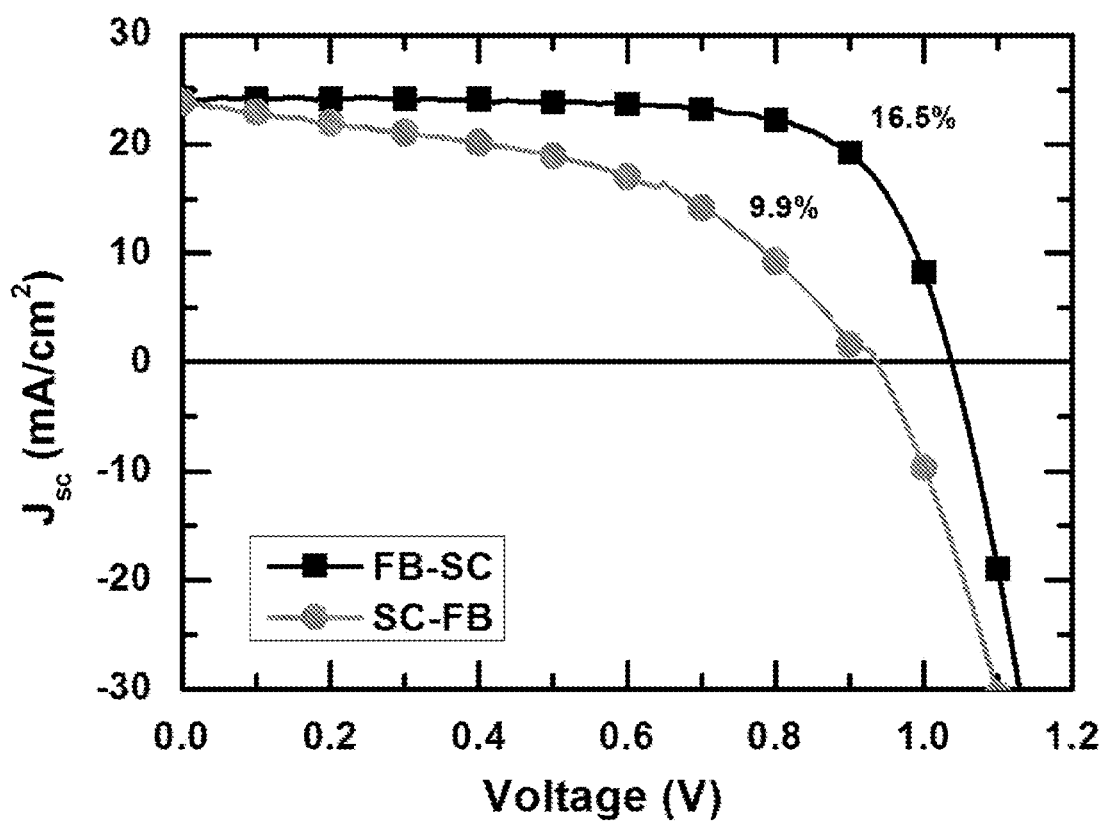
FIG. 17 shows current-voltage characteristics of pyridine-passivated device exhibiting hysteresis in current-voltage curves.
Figure 18:
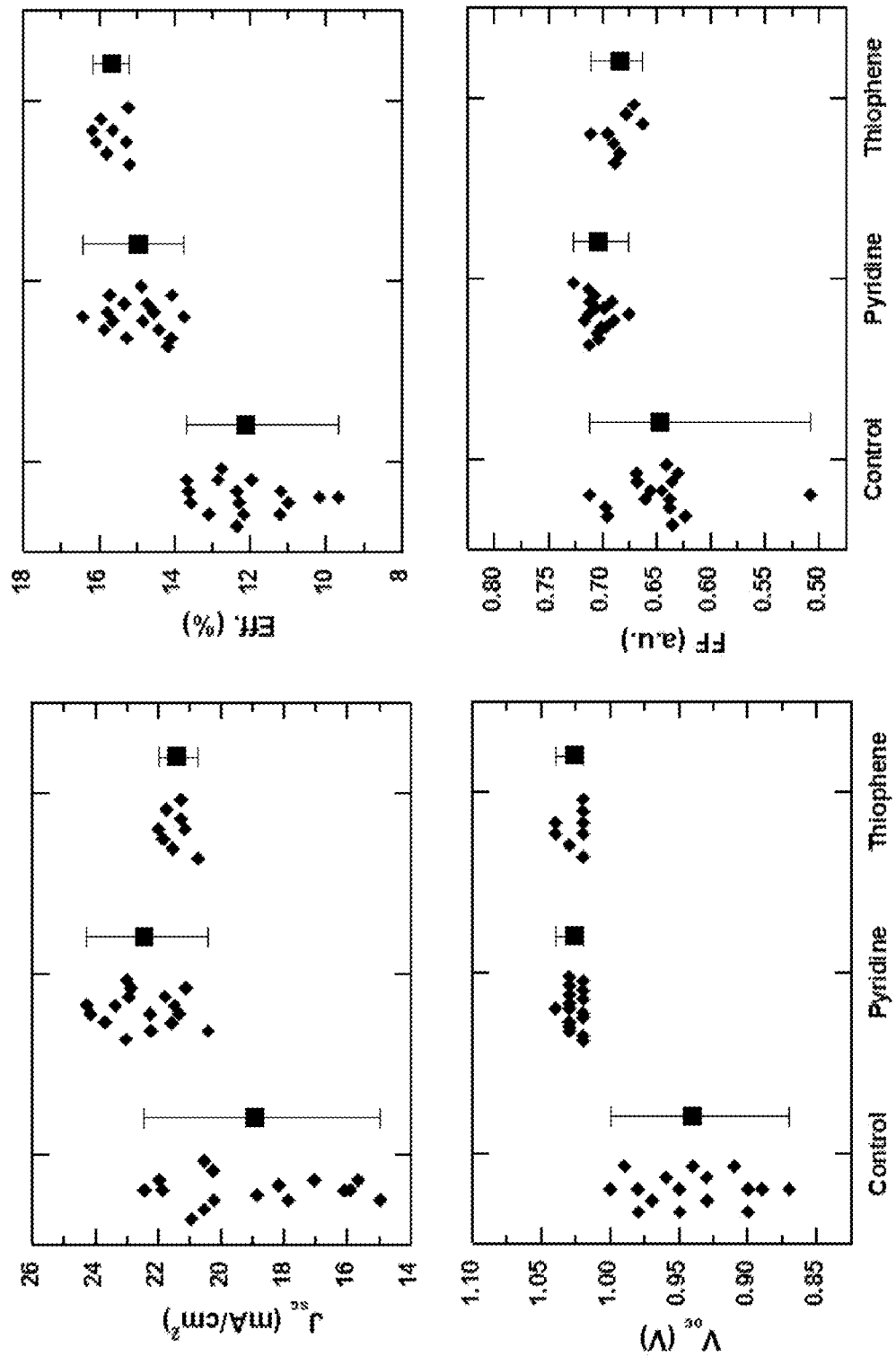
FIG. 18 shows performance parameters of a batch of passivated and unpassivated solar cells under simulated full sunlight.

The current-voltage characteristics of the devices were measured with hysterisis. The results for a device passivated with pyridine is shown in FIG. 17 (FB is forward bias and SC is short circuit). When starting the current-voltage scan at FB and scanning towards SC, the shape of the current-voltage curve is different to that scanning from SC to FB. This difference is termed hysteresis in the current-voltage curve. Hysteresis is a non-desirable property of a solar cell and improvements in the solar cell materials to minimise or reduce hysteresis are highly desirable. The device in FIG. 17 is a champion pyridine-passivated planar-heterojunction device with a PCE of 16.5% which represents a very high efficiency for a single solution deposited perovskite solar cell. The performance characteristics of a batch of passivated and unpassivated solar cells under simulated full sunlight are shown in FIG. 18. This demonstrates that the passivated devices consistently outperform the unpassivated devices in every parameter. Notably, the passivated devices have consistently higher currents and voltages than are observed in the untreated devices. The device statistics in FIG. 18 clearly show that utilising pyridine and thiophene as surface passivating agents dramatically improves the reproducibility of devices, markedly reducing the standard deviation. The average performance of both thiophene and pyridine treated devices consistently outperform the untreated control devices. Of the treated devices, pyridine passivated devices consistently achieve even higher photocurrents and fill factors than those treated with thiophene.

Figure 19:
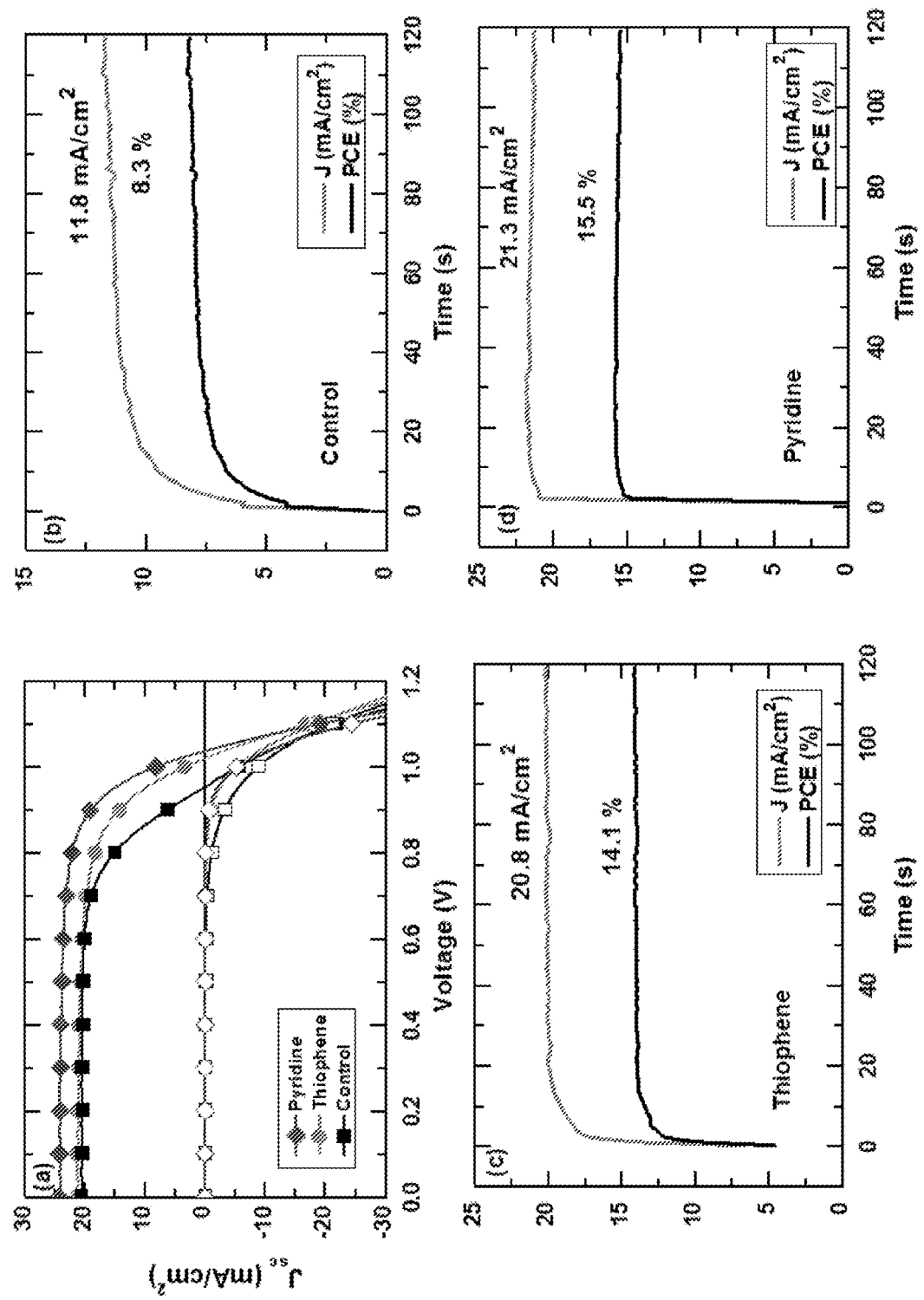
FIG. 19 shows device results and stabilised maximum power for sensitised and control devices.

FIG. 19 shows device results and stabilised maximum power. FIG. 19(*a*) shows the current-voltage characteristics of a control device, as compared to thiophene and pyridine passivated devices. It can be seen that the pyridine passivated device outperforms both the control and the thiophene passivated device (performance parameters are summarised in Table 1 below). FIGS. 19 (b,c,d) show stabilised maximum power output of passivated and control devices. It can be seen here that the passivated devices stabilise at much higher efficiencies and currents than the control device, almost achieving the efficiency of the FB-SC scan.

TABLE 1

Performance parameters extracted from the FB-SC scan of best control and passivated devices measured under AM1.5 simulatred sun light of 100 mWcm$^{-2}$ equivalent irradiance. Device performance parameters for the champion devices of each variable, along with the stabilised efficiency and stabilised current density values.

|  | $J_{SC}$ (mA/cm$^2$) | $V_{OC}$ (V) | η (%) | FF (a.u.) | Stab. η (%) | Stab. J (mA/cm$^2$) |
| --- | --- | --- | --- | --- | --- | --- |
| Pyridine | 24.1 | 1.05 | 16.5 | 0.72 | 15.5 | 21.3 |
| Thiophene | 21.3 | 1.02 | 15.3 | 0.68 | 14.1 | 20.8 |
| Centrol | 20.7 | 0.95 | 13.1 | 0.68 | 8.3 | 11.8 |

Utilising the surface treatments on planar heterojunction solar cells, an increase in the maximum power conversion efficiency from 13.1% to 15.3% with thiophene passivation and to 16.5% with pyridine passivation has been observed. These results represent the highest efficiencies we have achieved for planar heterojunction perovskite solar cells fabricated using a single step solution deposition method.

In conclusion, a controlled method of surface passivation via coordinate bonding has been demonstrated, which appears to have the effect of reducing the density of electronic trap sites, which is postulated to be caused by under-coordinated metal ions in the perovskite crystal. By using thiophene and pyridine passivation a quantitative and systematic decrease of defect states is obtained, as opposed to the random irreproducible nature of atmospheric passivation. A mechanism for this type of electrical passivation has been proposed and a decrease in the rate of non-radiative recombination in perovskite films has been shown. In so doing, the efficiency of planar heterojunction solar cells has been increased from 13% to 15.3% and 16.5% using thiophene and pyridine treatments respectively, and even more significantly achieved high stabilised power output for these solar cells. Beyond use in solar cells, this passivation technique is likely to prove useful for many other perovskite based optoelectronic applications such as lasers and LEDs Solar Cell Characterization Solar cell performance was measured using a class AAB ABET solar simulator which was calibrated to give simulated AM 1.5 sunlight at an irradiance of 100 mW/cm$^2$. The irradiance was calibrated using an NREL-calibrated KG5 filtered silicon reference cell. Current-Voltage curves were recorded using a sourcemeter (Keithley 2400, USA). All solar cells were masked with a metal aperture which was used to define the active area of the devices, which in this case was 0.0625 cm$^2$. All devices were stored in a desiccator in the dark for 12 hours prior to testing.

Example 18—Photoluminescence Characteristics of Pyridine and Thiophene Passivated Films To study thiophene and pyridine's impact upon the optoelectronic properties in more detail the photoluminescence of perovskite films treated and untreated with thiophene or pyridine, was investigated.

Spectroscopy samples were prepared by spin coating films of perovskite on to glass slides. The spin coating protocol uses a 40 wt % solution of 3:1 molar ratio of $CH_3NH_3I:PbCl_2$ in DMF. The slides were left to dry for 1 hour, after which they were heated to 90° C. for 120 mins. After heating the surface treatments (pyridine or thiophene diluted to 20 vol % in chlorobenzene) were spin coated onto the substrates, followed by a 100 nm layer of PMMA (using a 1% solution of poly methyl methacrylate). All processing was done in inert atmosphere.

Figures 20A, 20B:
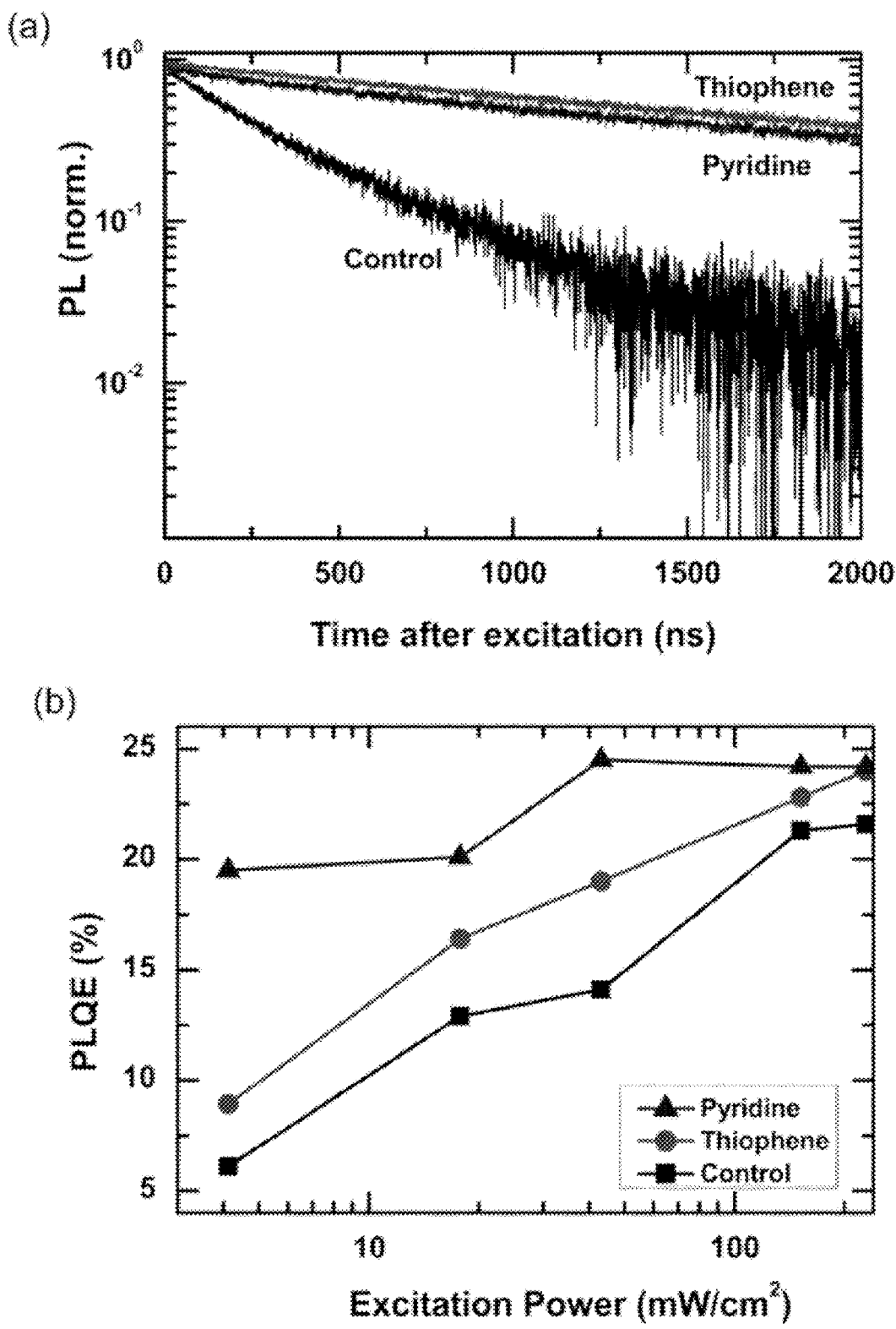
FIGS. 20a-20b shows photoluminescence characteristics of neat, thiophene and pyridine passivated $CH_3NH_3PbI_{3-x}Cl_x$ films: (a) time-resolved photoluminescence of thiophene and pyridine passivated perovskite films as compared to unpassivated films following a 507-nm pulsed excitation (200 kHz, 30 nJ/cm$^2$/pulse) (PL decays were acquired at the peak emission wavelength (780 nm)); and (b) photoluminescence quantum efficiency (PLQE) of unpassivated films and films treated with thiophene and pyridine as a function of 532 CW laser excitation intensity.

FIG. 20(b) shows the photoluminescence quantum efficiency (PLQE) which increases with excitation power. The PLQE rise with fluence is attributed to a filling of trap states, where the PLQE only reaches a peak value when the trap states, responsible for non-radiative Shockley-Reed-Hall recombination, are predominantly filled. An order-of-magnitude increase in the PL lifetime (FIG. 20(a)) of the perovskite films from 300 ns to 1800 ns is also observed when the surface is treated with pyridine, and to 2200 ns when treated with thiophene. For a given excitation power, an increased PLQE for the passivated films with respect to the control is seen. The increased PLQE and PL lifetimes both indicate an overall reduction in the rate of non-radiative recombination within the material, and are evidence that some of the pathways to non-radiative recombination i.e., trap mediated recombination, have been substantially reduced. The PLQE for perovskite samples treated with pyridine is also significantly higher at low excitation densities than for the samples treated with thiophene. If this rise in PLQE with excitation power is attributed to the filling of traps, this is then indicative of the fact that while both pyridine and thiophene act to passivate trap states on the surface of the perovskite material, pyridine seems to be more effective, reaching a "plateau" in PLQE at much lower excitation powers. One speculation as to the reason for this is that the pyridine may bind more strongly to the perovskite surface than the thiophene, thus more successfully reducing the degree of non-radiative recombination.

Figure 21:
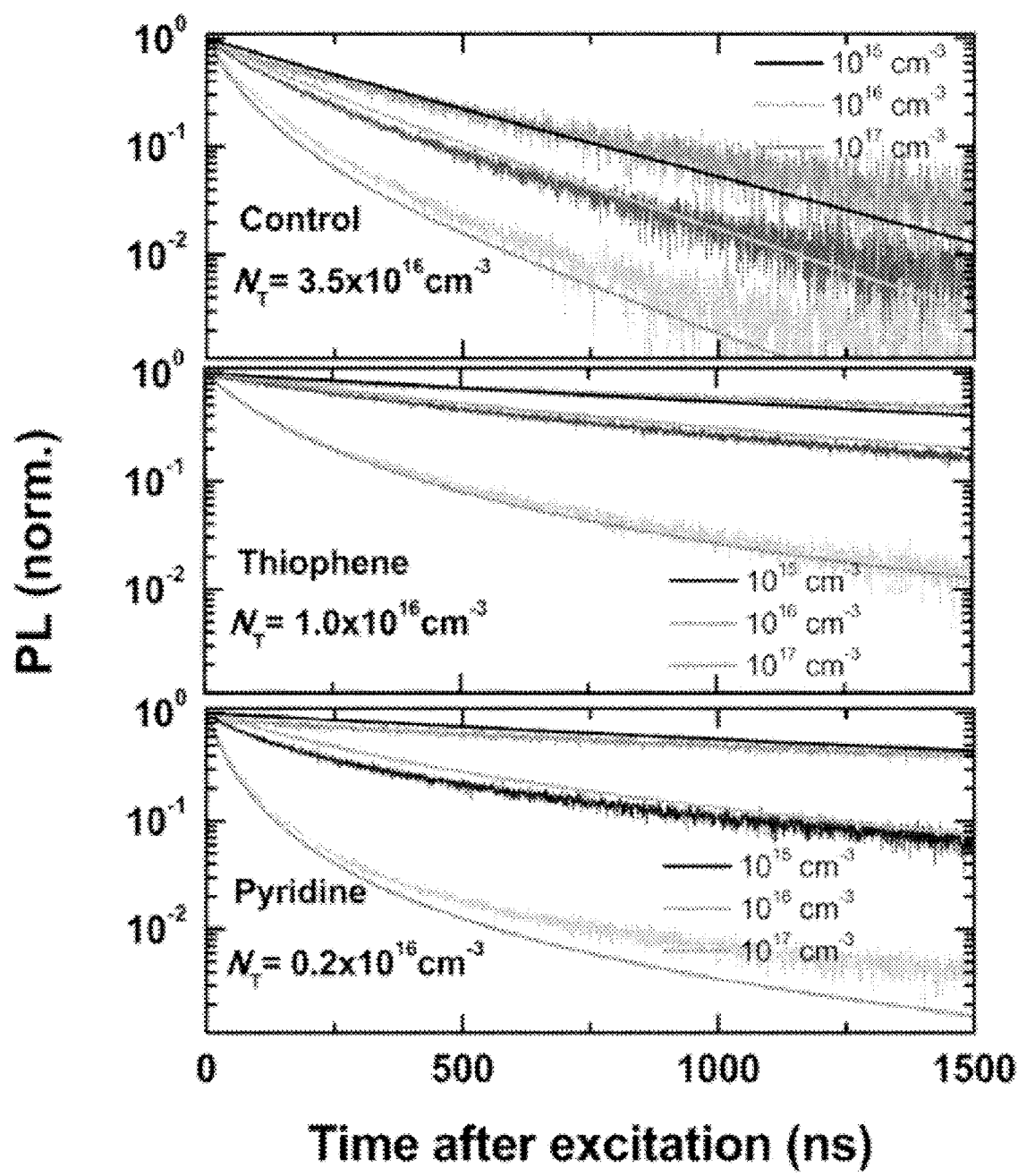
FIG. 21 shows photoluminescence characteristics of bare and thiophene or pyridine passivated films. Time-resolved PL measurements of control, thiophene and pyridine samples with 507-nm pulsed (200 kHz) excitation at a range of pulse fluences corresponding to the quoted photoexcitation densities. Solid lines are fits to the data using a model allowing extraction of the quoted trap densities NT.

A model to describe the evolution of photoexcited species (free charges and excitons) and the subsequent photoluminescence kinetics in these materials in the presence of $N_T$ sub-gap trap states is proposed. Under photoexcitation, $n_T$ traps are filled with electrons, which will result in a population of $n_T$ photodoped holes in the valence band to ensure charge neutrality. The untrapped electrons (and their hole pairs) can exist as free charges or as bound excitons (binding energy of 50 meV) with a thermal equilibrium established and rapid interchange between the species. The intensity-dependent PL decays for both untreated and treated samples are shown in FIG. 21. At low fluences, e.g., initial photoexcitation densities of ~$10^{15}$ cm$^3$, recombination is dominated by near-monomolecular recombination between the dominant number of photo-doped holes and the minority photo-excited electrons. At high fluences ($10^{17}$ cm$^3$), traps are predominantly filled and the number of photo-excited electrons and photo-doped holes are comparable, leading to a bimolecular decay until low enough density is reached (at longer time) that the decay once more becomes monomolecular.

The results have been globally fitted with the model such that the total number of photogenerated holes, $n_h$ at any point in time will be such that $n_h=n_e+n_T$, where $n_e$ is the number of free electrons. The total concentration of photogenerated carriers can then be defined $N=n_e+n_x$ where $n_x$ is the concentration excitons. This however excludes trapped electrons and the corresponding holes. The key assumption is that the trapped electron is comparatively long lived. If we assume the trap concentration is constant over a PL decay measurement, and that during the decay the excitons and free charges are in thermal equilibrium, the model can be fitted to the experimental data to determine the trap density $N_T$. From the fitting the trap density of the untreated film is determined to be $3.5 \times 10^{16}$ cm$^{-3}$. For the thiophene passivated film however, this trap density is decreased threefold yielding a trap density of $1.0 \times 10^{16}$ cm$^{-3}$, while for the pyridine passivated film, the extracted trap density is decreased by an order of magnitude, resulting in a trap density of $0.2 \times 10^{16}$ cm$^{-3}$. This is hence consistent with both the thiophene and pyridine treatments effectively passivating electronic trap sites in the organic-inorganic lead halide perovskites.

Example 19—Passivation of Lead Halide Perovskites with Varying Alkyl Chain Length Passivating Agent The fabrication of $CH_3NH_3PbX_3$ perovskite film with longer PL lifetime (approx. 1000 ns) as well as with increased inherent hydrophobic character was investigated. This involved studying the variation in the alkyl chain length as a means to introduce a new set of electronic and crystal properties. In this regard, substituting the methyl group of the $CH_3NH_3PbX_3$ (where X=I, Br or $C_1$) perovskite with long alkyl chain length (e.g. octyl-amine group) can induce the reduction of crystallite size of the perovskite but when excess of such a long chain is introduced in the crystal lattice it may completely transform 3D perovskite to 2D perovskite structure leading to complete change in the structural and electronic properties of the material.

This study demonstrates that a specific amount of methylamine substitution with octylamine group in the $CH_3NH_3PbX_3$ perovskite shifts the steady state PL peak position towards shorter wavelengths, whilst excessive addition can significantly push the PL from the red towards the green region of the emission zone indicating a transformation from a 3D to 2D perovskite. This study also demonstrates that the addition of a very small amount of octylamine results in an extraordinary slowing down of the PL decay time. Furthermore, the introduction of the octylamine to the $CH_3NH_3PbX_3$ perovskite makes it more hydrophobic in nature and such moisture resistance would then directly influence the long term outdoor stability of the perovskite based device.

Synthesis of Alkyl-Ammonium-Halide

To synthesise methyl-ammonium iodide, 24 ml of Methylamine of 33 wt % in absolute ethanol was reacted with 10 ml of hydriodic acid (57% in $H_2O$) in 100 ml of $C_2H_5OH$. The reaction was carried out while rigorously stirring under ambient condition for 30-60 min. The reaction mixture was than subjected to a rotary evaporator at 60° C. to remove the solvent, leading to the precipitation of a white/yellowish coloured methyl-ammonium-iodide powder. The resulting product was then washed with dimethyl ether to remove un-reacted reactants. Re-crystallization was then carried out in either $C_2H_5OH$ or $C_2H_5OH/CH_3OCH_3$ mixture for further purification of $CH_3NH_3I$ (MAI) powder. The resulting recrystallized MAI was then dried under vacuum furnace at 60° C. until it become dry. Owing to its hygroscopic nature the purified MAI was stored in dry condition.

Similar procedures were adapted to synthesize octyl-ammonium-iodide (OAI), octyl-ammonium bromide (OABr) and octyl-ammonium-chloride (OACl). The chain length of the alkyl chain was varied by using the appropriate alkylamine (e.g. octyl-amine). The halide ions were varied by using different halogen sources (e.g. HBr and HCl etc.). The rest of the procedures were the same as those used for the methyl-ammonium-iodide synthesis.

Perovskite Precursor Solution

The perovskite can be synthesized by reacting two compounds, i.e. the alkyl-ammonium halide and lead halide, by the following general reaction:

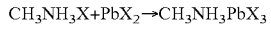

$CH_3NH_3X+PbX_2 \rightarrow CH_3NH_3PbX_3$

Other lead sources that can provide $Pb^{2+}$, such as $Pb(CH_3COO)_2$, $Pb(NO_3)_2$ can also be used.

In this example the perovskite was synthesised using a 3 molar excess of organic halide salt to metal halide salt was used with the resulting reaction following:

$3CH_3NH_3X + PbX_2 \rightarrow CH_3NH_3PbX_3 + \text{by-products}$

Perovskite Film Fabrication

The precursor solutions was spin coated on to a substrate and thermally annealed at approx. 100° C. for approx. 45 min. The concentration of the precursor solution and the annealing protocol can be manipulated as per requirements. For example, a small increase in the annealing time is required when using a 3 molar excess of organic halide salt to metal halide salt in order to drive off the by-products.

Octylamine Doped (OA) Perovskite Film

In this example, 0, 5, 10, 20 and 70 μl of octylamine (OA) was added into 1000, 995, 990, 980 and 930 μl respectively of $CH_3NH_3PbI_3$ precursor solution. $CH_3NH_3PbI_3$ perovskite films were fabricated on glass slides and then annealed at 100° C. for 45 min. PMMA solution in (10 mg/ml in Toluene) was then spin coated to protect from moisture while conducting measurements.

Figures 22A, 22B:
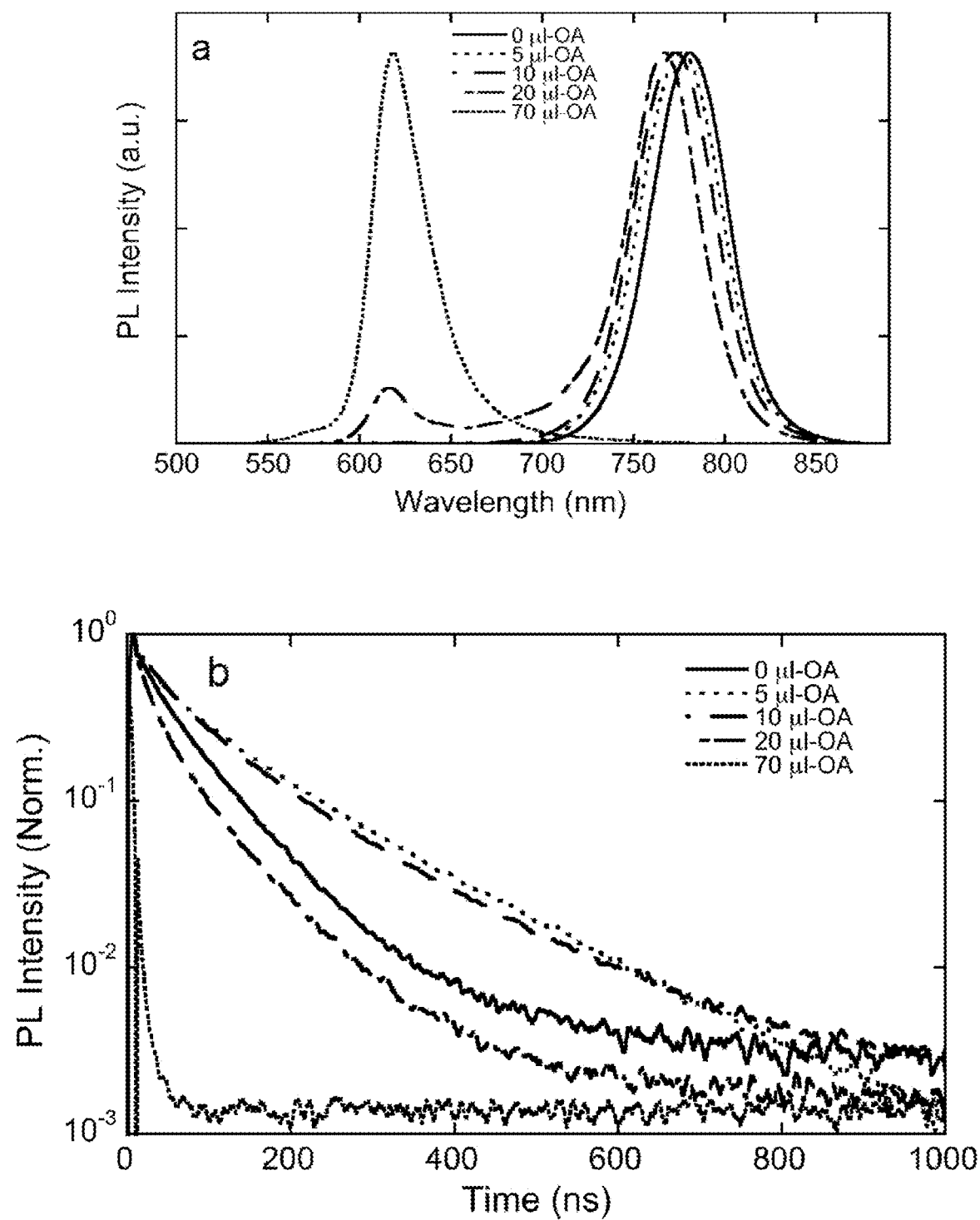
FIGS. 22a-22b: shows photoluminescence characteristics of octylamine (OA) doped $CH_3NH_3PbI_3$ perovskite films: (a) normalised steady-state photoluminescence of OA doped perovskite films; (b) normalised steady-state photoluminescence of OA doped perovskite films.

FIG. 22(a) shows the steady state PL decay for these OA doped perovskite film. A gradual shift towards lower wavelength (blue shift) in PL peak position with the increasing OA doping concentration can be seen. However, excess addition (e.g. 70 ul/1 ml perovksite precursor) leads to the formation of a complete different phase, with a predominant peak appearing at 620 nm. The additional peak at about 620 nm is consistent with the formation of 2D perovskite phase.

FIG. 22(b) then shows the time resolved PL decay for these OA doped perovskite. The PL life time increases (as compared to the undoped perovskite film) when a small concentration of OA is added into the precursor (i.e. 5 μl). Further addition of OA leads to a drastic reduction in the PL life time which may be due to the emergence of secondary phase in the form of 2D perovskite.

Octyl-Ammonium Iodide Doped (OAI) Perovskite Film

In this example, the precursor solution was prepared by using pre synthesised OAI, as discussed above, by the following reaction:

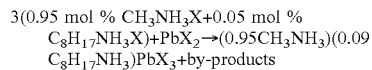
$3(0.95 \text{ mol }\% \text{ } CH_3NH_3X + 0.05 \text{ mol }\% \text{ } C_8H_{17}NH_3X) + PbX_2 \rightarrow (0.95 CH_3NH_3)(0.09 C_8H_{17}NH_3)PbX_3 + \text{by-products}$ The precursor solution was spin coated on to a glass substrate and annealed at 100° C. for 45 min.

Figure 23:
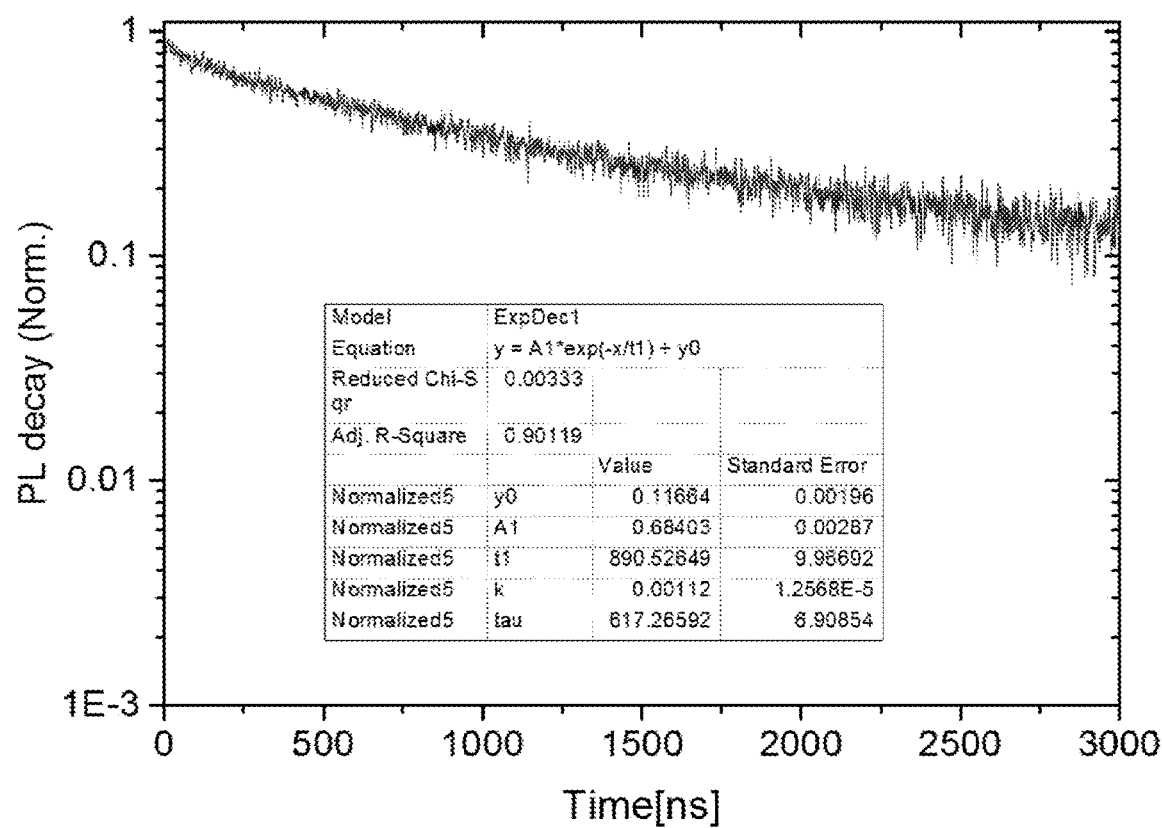
FIG. 23: shows photoluminescence characteristics of octyl-ammonium iodide (OAI) doped $CH_3NH_3PbI_3$ perovskite film. Time resolved PL decay of 5 mol % OAI doped MAPbI3 perovskite film, where the actual composition of the film is approximately [(0.95MA)(0.05OA)PbI3].

FIG. 23 shows the time resolved PL decay measurement on the OAI doped perovskite film. The controlled substitution of longer alkyl chain for the methyl group improves the PL lifetime dramatically from just over 100 ns to 900 ns as compared to the undoped film, presented in the FIG. 22(b).

Mixed Chain Length Perovskite Film Fabrication

By doping the perovskite precursor solution we expect the longer alkyl chain amine to be expelled to the surfaces and grain boundaries within the bulk of the perovskite film. However, this may also introduce the longer alkyl group throughout the crystal, which may induce some undesirable electronic properties.

In order to selectively substitute the methyl group from the outer periphery of the perovskite film, the perovskite thin film can be prepared using the standard perovskite precursor solution described above, with the resulting film being immersed into 0.1 M solution of OAI (octyl ammonium iodide) in isopropyl alcohol (IPA). The dipping time and OAI concentration can then be varied depending upon the desired amount of methyl group substitution.

Using this method, it can be expected that the methyl group from outer surface of the perovskite will be substituted and there should be negligible structural change in the perovskite bulk. In this method a highly hydrophobic perovskite is fabricated.

What is claimed:

1. A semiconductor, wherein the semiconductor comprises:
   (a) a metal halide perovskite; and
   (b) a passivating agent which is an organic compound; wherein molecules of the passivating agent are chemically bonded to anions or cations in the metal halide perovskite.

2. The semiconductor according to claim 1, wherein chemical bonds between the molecules of the passivating agent and the anions or cations in the metal halide perovskite are selected from the group consisting of: halogen bonds; chalcogen-metal bonds; nitrogen-metal bonds; and phosphorus-metal bonds.

3. The semiconductor according to claim 1, wherein the cations or anions in the metal halide perovskite to which the molecules of the passivating agent are bonded are under-coordinated.

4. The semiconductor according to claim 1, wherein at least some of the anions or cations in the metal halide perovskite to which the molecules of the passivating agent are bonded are at the surface of the metal halide perovskite.

5. The semiconductor according to claim 1, wherein the molecules of the passivating agent form a self-assembled layer on a surface of the metal halide perovskite.

6. The semiconductor according to claim 1, wherein at least some of the anions or cations in the metal halide perovskite to which the molecules of the passivating agent are bonded are at defect sites in bulk of the crystal structure of the metal halide perovskite.

7. The semiconductor according to claim 1, wherein the molecules of the passivating agent are bonded to the under-coordinated cations or under-coordinated anions in the bulk of the crystal structure of the metal halide perovskite.

8. The semiconductor according to claim 7, wherein at least some of the anions or cations in the metal halide perovskite to which the molecules of the passivating agent are bonded are at grain boundaries in bulk of the crystal structure of the metal halide perovskite.

9. The semiconductor according to claim 1, wherein the passivating agent is a compound selected from:
   (a) a halogen bond donor compound;
   (b) an organic compound comprising at least one thiol or sulfide group; and
   (c) an organic compound comprising at least one heteroatom selected from N and P.

10. The semiconductor according to claim 9, wherein the passivating agent is the halogen bond donor compound of formula X-EWG, wherein
    X is a halogen selected from I, Br, Cl and F; and
    EWG is an electron withdrawing group.

11. The semiconductor according to claim 9, wherein the passivating agent is iodopentafluorobenzene.

12. The semiconductor according to claim 9, wherein the passivating agent is thiophene, 3-hexylthiophene or tetrahydrothiophene.

13. The semiconductor according to claim 1, wherein the passivating agent is:
    a halogen bond donor compound, and molecules of the halogen bond donor compound are bonded to halide anions in the metal halide perovskite by halogen bonding; or the passivating agent is an organic compound comprising at least one thiol or sulfide group, and molecules of the organic compound are bonded to metal cations in the metal halide perovskite by sulfur-metal bonds.

14. The semiconductor according to claim 9, wherein the passivating agent is the organic compound comprising the at least one heteroatom selected from N and P, wherein the organic compound comprising the at least one heteroatom selected from N and P is selected from a substituted or unsubstituted amine, a substituted or unsubstituted imine, substituted or unsubstituted pyridine, substituted or unsubstituted pyrrolidine, substituted or unsubstituted pyrrole and a substituted or unsubstituted phosphine.

15. The semiconductor according to claim 14, wherein the passivating agent is a compound selected from pyrrolidine, piperidine, morpholine, 2H-pyrrole, 2-pyrroline, 3-pyrroline, pyrrole and pyridine.

16. The semiconductor according to claim 15, wherein the passivating agent is pyridine.

17. The semiconductor according to claim 1, which the semiconductor further comprises:
a further passivating agent which is a further organic compound;
wherein molecules of the further passivating agent are disposed at grain boundaries within the metal halide perovskite and are not chemically bonded to anions or cations in the metal halide perovskite.

18. The semiconductor according to claim 17, wherein the further passivating agent comprises non-polar organic molecules.

19. The semiconductor according to claim 18, wherein the further passivating agent comprises a polycyclic aromatic hydrocarbon.

20. The semiconductor according to claim 18, wherein the further passivating agent comprises any of naphthalene, anthracene, phenanthrene, pyrene, and fluoranthene.

21. The semiconductor according to claim 1, wherein the metal halide perovskite is a perovskite of the formula (I):

$$[A][B][X]_3 \quad (I)$$

wherein:
[A] is at least one organic cation;
[B] is at least one metal cation, wherein [B] comprises at least one of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$; and
[X] is at least one halide anion.

22. The semiconductor according to claim 1, wherein the semiconductor comprises a continuous layer comprising crystalline domains.

23. The semiconductor according to claim 22, wherein the crystalline domains have domain sizes of from 100 nm to 1000 nm.

24. A semiconductor device comprising the semiconductor as defined in claim 1.

25. The semiconductor device according to claim 24, wherein the semiconductor device is an optoelectronic device.

26. The semiconductor device according to claim 25, wherein the optoelectronic device is a light emitting device.

27. A process for producing a semiconductor, wherein the semiconductor comprises:
(a) a metal halide perovskite; and
(b) a passivating agent which is an organic compound;
wherein molecules of the passivating agent are chemically bonded to anions or cations in the metal halide perovskite, and
wherein the process comprises treating the metal halide perovskite with the passivating agent, wherein the passivating agent is an organic compound suitable for chemically bonding to the anions or cations in the metal halide perovskite.

28. The process according to claim 27, wherein the treating the metal halide perovskite with the passivating agent comprises:
disposing on a surface of the metal halide perovskite at least one composition comprising the passivating agent; or
adding the passivating agent to a solution of the metal halide perovskite before formation of a metal halide perovskite solid.

* * * * *